US010333048B2

(12) United States Patent
Barkeshli et al.

(10) Patent No.: US 10,333,048 B2
(45) Date of Patent: Jun. 25, 2019

(54) UNIVERSAL TOPOLOGICAL QUANTUM COMPUTERS BASED ON MAJORANA NANOWIRE NETWORKS

(71) Applicant: Microsoft Technology Licensing, LLC, Redmond, WA (US)

(72) Inventors: Maissam Barkeshli, Santa Barbara, CA (US); Jay Deep Sau, Rockville, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/224,163

(22) Filed: Jul. 29, 2016

(65) Prior Publication Data
US 2017/0141287 A1    May 18, 2017

Related U.S. Application Data

(60) Provisional application No. 62/221,065, filed on Sep. 20, 2015.

(51) Int. Cl.
| | |
|---|---|
| *H01F 6/06* | (2006.01) |
| *G06N 99/00* | (2010.01) |
| *G06F 17/18* | (2006.01) |
| *G06F 17/16* | (2006.01) |
| *H01L 39/22* | (2006.01) |
| *H01L 39/12* | (2006.01) |
| *H01L 39/02* | (2006.01) |
| *G06N 10/00* | (2019.01) |

(52) U.S. Cl.
CPC ........... *H01L 39/223* (2013.01); *G06N 10/00* (2019.01); *H01L 39/025* (2013.01)

(58) Field of Classification Search
CPC .... G06N 99/002; H01L 39/025; H01L 39/223
See application file for complete search history.

(56) References Cited

U.S. PATENT DOCUMENTS

| | | | | |
|---|---|---|---|---|
| 2012/0112168 | A1* | 5/2012 | Bonderson | B82Y 10/00 257/31 |
| 2013/0299783 | A1* | 11/2013 | Lutchyn | H01L 39/221 257/31 |
| 2014/0221059 | A1* | 8/2014 | Freedman | G06N 99/002 455/899 |
| 2014/0279822 | A1* | 9/2014 | Bonderson | G06N 99/002 706/62 |

(Continued)

OTHER PUBLICATIONS

Martinis et al. ("Superconducting Qubits and the Physics of Josephson Junctions", Les Houches Session LXXIX (2003): Quantum Entanglement and Information Processing, 487-520 (2004)).*

(Continued)

*Primary Examiner* — Brian Turner
(74) *Attorney, Agent, or Firm* — Klarquist Sparkman, LLP

(57) ABSTRACT

In this disclosure, example networks of coupled superconducting nanowires hosting MZMs are disclosed that can be used to realize a more powerful type of non-Abelian defect: a genon in an Ising×Ising topological state. The braiding of such genons provides the missing topological single-qubit $\pi/8$ phase gate. Combined with joint fermion parity measurements of MZMs, these operations provide a way to realize universal TQC.

15 Claims, 23 Drawing Sheets

(56) References Cited

U.S. PATENT DOCUMENTS

2016/0055421 A1* 2/2016 Adachi .................. G06N 5/003
706/46

OTHER PUBLICATIONS

Alicea, "New directions in the pursuit of Majorana fermions in solid state systems," *Reports on Progress in Physics 75*, 36 pp. (Feb. 2012).

Barkeshli et al., "Bilayer quantum Hall phase transitions and the orbifold non-Abelian fractional quantum Hall states," *Phys Rev B 84*, 25 pp. (Sep. 2011).

Barkeshli et al., "Genons, twist defects, and projective non-Abelian braiding statistics," *Phys Rev B 87*, 26 pp. (Dec. 2012).

Barkeshli et al., "Modular transformations through sequences of topological charge projections," *Phys. Rev. B 94*, 21 pp. (Jan. 2017).

Barkeshli et al., "Symmetry, Defects, and Gauging of Topological Phases," 88 pp. (Nov. 2014).

Barkeshli et al., "Synthetic Topological Qubits in Conventional Bilayer Quantum Hall Systems," *Phys. Rev. X 4*, 16 pp. (Nov. 2014).

Barkeshli et al., "Topological Nematic States and Non-Abelian Lattice Dislocations," *Phys. Rev. X 2*, 10 pp. (Apr. 2012).

Barkeshli et al., "$U(1) \times U(1) \times Z_2$ Chern-Simons Theory and $Z_4$ Parafermion Fractional Quantum Hall States," *Phys Rev B 81*, 19 pp. (2010).

Beenakker, "Search for Majorana Fermions in Superconductors," *Annual Review of Condensed Matter Physics*, vol. 4, pp. 113-136 (Apr. 2013).

Bonderson, "Measurement-Only Topological Quantum Computation via Tunable Interactions," *Phys. Rev. B 87*, 10 pp. (Jan. 2013).

Chang et al., "Hard gap in epitaxial semiconductor-superconductor nanowires," *Nat. Nano. 10*, pp. 232-236 (Jan. 2015).

Churchill et al., "Superconductor-Nanowire Devices from Tunneling to the Multichannel Regime: Zero-Bias Oscillations and Magnetoconductance Crossover," *Phys Rev B 87*, 5 pp. (Mar. 2013).

Deng et al., "Observation of Majorana Fermions in a Nb—InSb nanowire-Nb Hybrid Quantum Device," *Nano Letter 12*, 10 pp. (Apr. 2012).

Doh et al., "Tunable supercurrent through semiconductor nanowires," *Science*, vol. 309, pp. 272-275 (Jul. 2005).

Günel et al., "Supercurrent in Nb/InAs-nanowire/Nb Josephson junctions," *Journal of Applied Physics 112*, 7 pp. (May 2012).

Krogstrup et al., "Epitaxy of Semiconductor-Superconductor nanowires," *Nature Materials 14*, 40 pp. (2015).

Lutchyn et al., "Majorana Fermions and a Topological Phase Transition in Semiconductor-Superconductor Heterostructures," *Phys. Rev. Lett. 105*, 5 pp. (Aug. 2010).

Mourik et al., "Signatures of Majorana fermions in hybrid superconductor-semiconductor nanowire devices," *Science 336*, 28 pp. (Apr. 2012).

Nadj-Perge et al., "Observation of Majorana Fermions in Ferromagnetic Atomic Chains on a Superconductor," *Science 346*, 45 pp. (Oct. 2014).

Rokhinson et al., "Observation of the fractional ac Josephson effect: the signature of Majorana particles," *Nat. Phys. 8*, 17 pp. (Aug. 2012).

Sau et al., "A Generic New Platform for Topological Quantum Computation Using Semiconductor Heterostructures," *Phys. Rev. Lett. 104*, 4 pp. (Jan. 2010).

Shabani et al., "Two-dimensional epitaxial superconductor-semiconductor heterostructures: A platform for topological superconducting networks," *Phys Rev B 93*, 13 pp. (Nov. 2015).

* cited by examiner

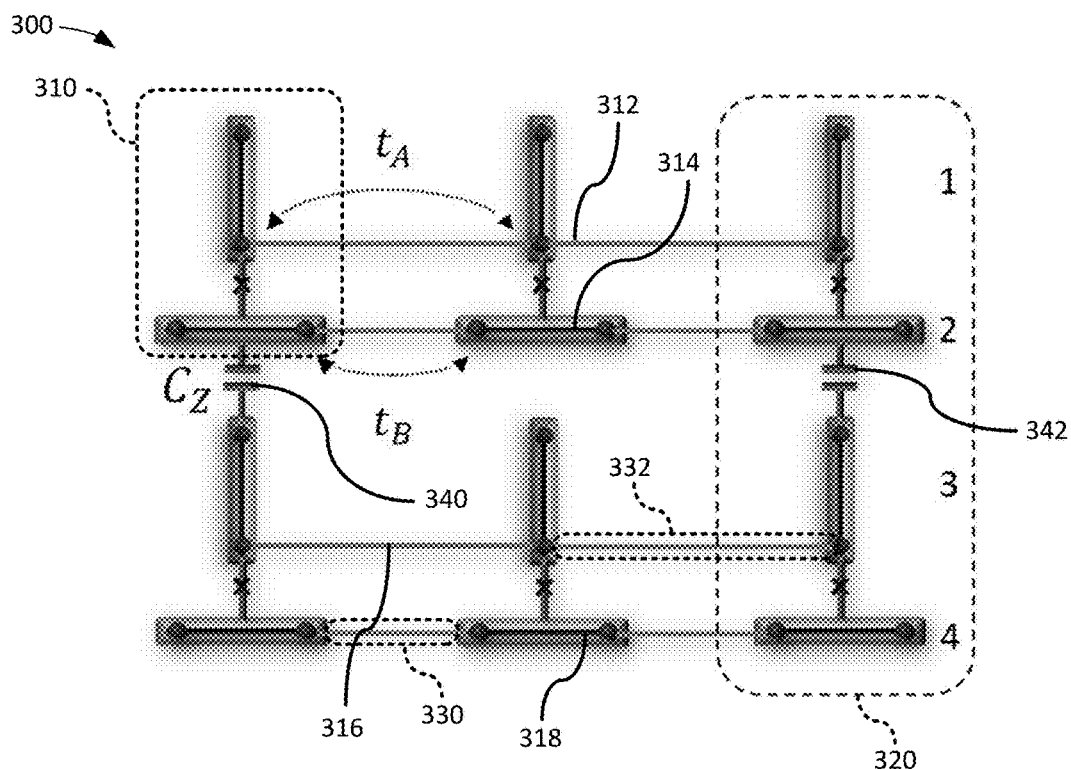
FIG. 3
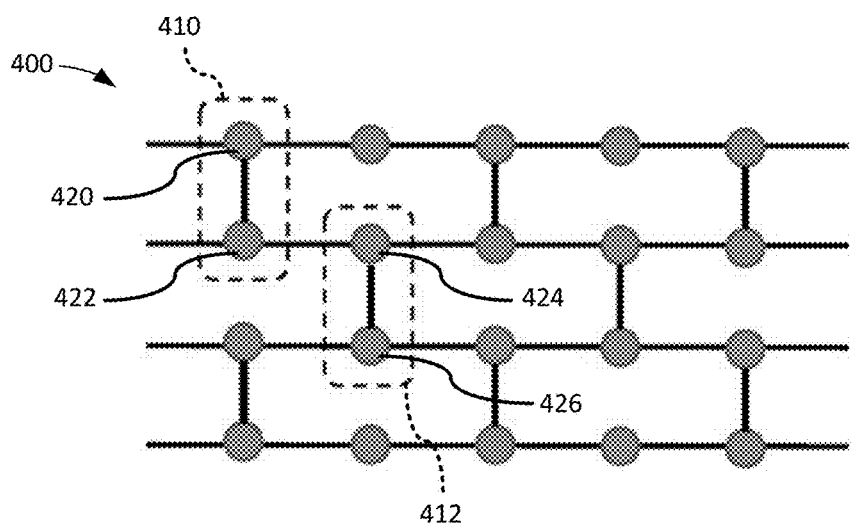
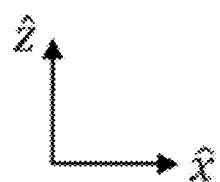
FIG. 4

UNIVERSAL TOPOLOGICAL QUANTUM COMPUTERS BASED ON MAJORANA NANOWIRE NETWORKS

CROSS-REFERENCE TO RELATED APPLICATIONS

This application claims the benefit of U.S. Provisional Application No. 62/221,065, filed on Sep. 20, 2015, and entitled "Universal Topological Quantum Computers Based on Majorana Nanowire Networks", which is hereby incorporated herein by reference in its entirety.

BACKGROUND

Topological quantum computation (TQC) can be used to store and manipulate quantum information in an intrinsically fault-tolerant manner by utilizing the physics of topologically ordered phases of matter. Currently, one of the most promising platforms for a topological qubit is in terms of Majorana fermion zero modes (MZMs) in spin-orbit coupled superconducting nanowires. However, the topologically robust operations that are possible with MZMs can be efficiently simulated on a classical computer and are therefore not sufficient for realizing a universal gate set for TQC.

SUMMARY

In embodiments of the disclosed technology, an array of coupled semiconductor-superconductor nanowires with MZM edge states can be used to realize a more sophisticated type of non-Abelian defect: a genon in an Ising×Ising topological state. This leads to an implementation of the missing topologically protected π/8 phase gate and thus universal TQC based on semiconductor-superconductor nanowire technology. Detailed numerical estimates of the relevant energy scales, which lie within accessible ranges, are also disclosed.

Among the various embodiments disclosed herein is a universal topological quantum computer comprising one or more superconductor-semiconductor heterostructures configured to have a twist defect in an Ising×Ising topological state. Another disclosed embodiment is a universal topological quantum computer comprising one or more superconductor-semiconductor heterostructures configured to have holes with gapped boundaries in an Ising×$\overline{\text{Ising}}$ topological state, where $\overline{\text{Ising}}$ refers to the time-reversed conjugate of the Ising state.

The individual components for such quantum computers are also disclosed herein and comprise two-state quantum systems. For example, the disclosed embodiments further comprise a physical two-state quantum system having an effective spin-½ degree of freedom, the system being formed from two semiconductor nanowire structures having a total of four Majorana zero modes and a charging energy constraint. Another embodiment comprises a physical two-state quantum system having an effective spin-½ degree of freedom, the system being formed from two semiconductor nanowire structures using double-island quantum phase slips and having a total of four Majorana zero modes.

A variety of desirable configurations can be realized using the disclosed technology. For instance, particular embodiments comprise a universal topological quantum computer comprising one or more semiconductor-superconductor heterostructures having coupled Majorana fermion zero modes, the heterostructures being arranged and configured to realize a Kitaev honeycomb spin model and/or the Ising topological phase. The heterostructures can be formed from two semiconductor nanowire structures as described earlier.

In any of the disclosed embodiments, the Ising×Ising state, or the Ising×$\overline{\text{Ising}}$ state, can be realized by using overpasses. Further, in certain embodiments, genons are effectively braided in an Ising×Ising state without physically moving the genons.

Also disclosed herein is a method to induce topologically protected state transformations, and thus universal topological quantum computation, in an Ising×$\overline{\text{Ising}}$ state by using gapped boundaries. In particular, this method can realize a topologically protected π/8 phase gate. This is performed, for example, by measuring topological charges along various non-contractible cycles.

The foregoing and other objects, features, and advantages of the invention will become more apparent from the following detailed description, which proceeds with reference to the accompanying figures.

BRIEF DESCRIPTION OF THE DRAWINGS

FIG. 3. is a schematic block diagram showing a plaquette of a brick lattice comprising six effective sites.

FIG. 4 is a schematic block diagram showing another depiction of the effective brick lattice.

FIG. 31 is a block diagram showing that two essentially decoupled copies of the capacitance-based model can be created by using short overpasses to couple next nearest neighbor chains.

FIGS. 32 and 33 are schematic block diagrams of architectures for creating genons in the effective spin model.

DETAILED DESCRIPTION

General Considerations

Figure 1:
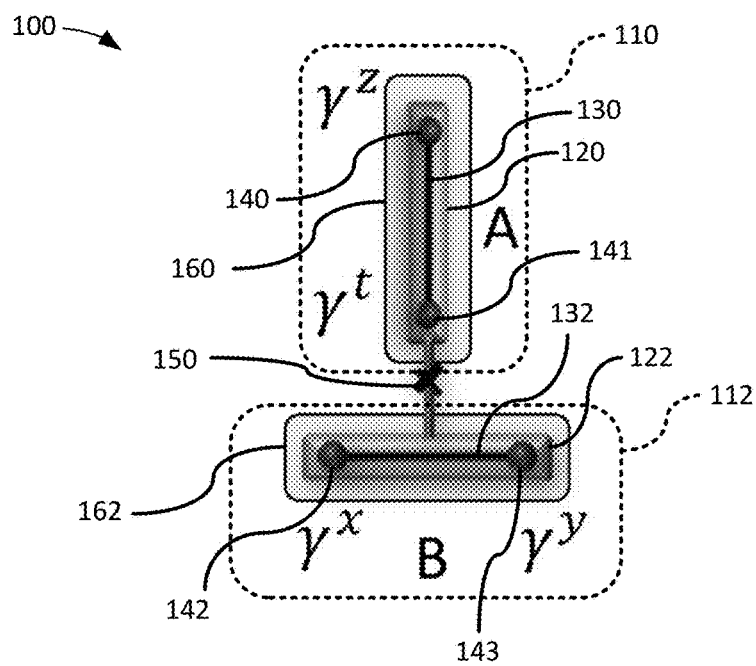
FIG. 1 is a schematic block diagram showing an example pair of semiconductor-superconductor nanowire structures, sometimes also referred to herein as "heterostructures".

Disclosed below are representative embodiments of methods, apparatus, and systems for realizing a quantum computer, and in particular a universal topological quantum computer. The disclosed methods, apparatus, and systems should not be construed as limiting in any way. Instead, the present disclosure is directed toward all novel and nonobvious features and aspects of the various disclosed embodiments, alone or in various combinations and subcombinations with one another. Furthermore, any one or more features or aspects of the disclosed embodiments can be used in various combinations and subcombinations with one another. For example, one or more method acts from one embodiment can be used with one or more method acts from another embodiment and vice versa. The disclosed methods, apparatus, and systems are not limited to any specific aspect or feature or combination thereof, nor do the disclosed embodiments require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Various alternatives to the examples described herein are possible. For example, some of the methods described herein can be altered by changing the ordering of the method acts described, by splitting, repeating, or omitting certain method acts, etc. The various aspects of the disclosed technology can be used in combination or separately. Different embodiments use one or more of the described innovations. Some of the innovations described herein address one or more of the problems noted in the background or elsewhere in this disclosure.

As used in this application and in the claims, the singular forms "a," "an," and "the" include the plural forms unless the context clearly dictates otherwise. Additionally, the term "includes" means "comprises." Further, as used herein, the term "and/or" means any one item or combination of any items in the phrase. Still further, as used herein, the term "optimiz*" (including variations such as optimization and optimizing) refers to a choice among options under a given scope of decision, and does not imply that an optimized choice is the "best" or "optimum" choice for an expanded scope of decisions.

Introduction to the Disclosed Technology

The promise of topological quantum computation (TQC) is to encode and manipulate quantum information using topological qubits. The quantum states of a topological qubit do not couple to any local operators, forming a non-local Hilbert space, and are therefore intrinsically robust to decoherence due to coupling to an external environment. Topological qubits also support topologically protected gate operations, which allow the topological qubits to be manipulated in an intrinsically fault-tolerant fashion. One of the most promising avenues towards developing a topological qubit is in terms of Majorana fermion zero modes (MZMs) in spin-orbit coupled superconducting nanowires.

In this disclosure, example networks of coupled superconducting nanowires hosting MZMs are disclosed that can be used to realize a more powerful type of non-Abelian defect: a genon in an Ising×Ising topological state. The braiding of such genons provides the missing topological single-qubit $\pi/8$ phase gate. Combined with joint fermion parity measurements of MZMs, these operations provide a way to realize universal TQC. Further details concerning how to carry out the topological gate operations once the genons of the Ising×Ising state are created and can be braided around each other are discussed in M. Barkeshli and X.-L. Qi, Phys. Rev. X 2, 031013 (2012).

This disclosure includes the following. First, it is shown that an array of suitably coupled MZMs in nanowire systems can realize a two-dimensional phase of matter with Ising topological order (The Ising topologically ordered phase is topologically distinct from a topological (e.g., p+ip) superconductor, as the latter does not have intrinsic topological order.) This is done by showing how to engineer an effective Kitaev honeycomb spin model in a physical system of coupled Majorana nanowires, where each effective spin degree of freedom corresponds to a pair of Majorana nanowires. Several example approaches to doing this are presented, including one based on charging energies, and the other based on quantum phase slips. An analysis of the energy scales of a physical system indicates that the Ising topological order could have energy gaps on the order of a few percent of the charging energy of the Josephson junctions of the system; given present-day materials and technology, and the constraints on the required parameter regimes, the possibility of energy gaps of up to several Kelvin is estimated.

Second, it is shown how overpasses (e.g., short overpasses) between neighboring chains, which are feasible with current nanofabrication technology, can be used to create two effectively independent Ising phases, referred to as an Ising×Ising state. Changing the connectivity of the network by creating a lattice dislocation allows the creation of a genon; this effectively realizes a twist defect that couples the two layers together. Finally, the genons can be effectively braided with minimal to no physical movement of them, by tuning the effective interactions between them.

Realizing the Kitaev Model

This section begins with a disclosure of a physical realization of a Kitaev model, which can be described by the following Hamiltonian with spin-½ degrees of freedom on each site $\vec{r}$ of a brick lattice (A $\pi$ rotation about $S^z$ on every other site takes Eq. (1) to the more conventional Kitaev form):

$$H_K = \sum_{\vec{r}} J_{yx} S_{\vec{r}}^y S_{\vec{r}+\hat{x}}^x + \sum_{\vec{R}} J_z S_{\vec{R}}^z S_{\vec{R}-\hat{z}}^z, \quad (1)$$

where $S_{\vec{r}}^\alpha$ for $\alpha=x, y, z$ are taken to be the Pauli matrices. The unit cell of the brick lattice is taken to be two vertically separated neighboring spins; $\Sigma_{\vec{R}}$ is a sum over each two-spin unit cell and $\vec{R}$ refers to the top-most spin within the unit cell.

$H_K$ is most naturally solved by expressing the spins in terms of Majorana operators $\tilde{\gamma}^j$ as $S^\alpha = i\tilde{\gamma}^\alpha \tilde{\gamma}^t$, together with a gauge constraint $\Pi_{\alpha=x,y,z,t}\tilde{\gamma}^j = 1$. $H_K$ can thus be rewritten as $$H_K = \sum_{\vec{r}} J_{yx} \tilde{\gamma}_{\vec{r}}^y \tilde{\gamma}_{\vec{r}+\hat{x}}^x \tilde{\gamma}_{\vec{r}}^t \tilde{\gamma}_{\vec{r}+\hat{x}}^t + \sum_{\vec{R}} J_z \tilde{\gamma}_{\vec{R}}^t \tilde{\gamma}_{\vec{R}}^z \tilde{\gamma}_{\vec{R}-\hat{z}}^t \tilde{\gamma}_{\vec{R}+\hat{z}}^x, \quad (2)$$

where the gauge constraint has been used in writing the $J_z$ term. The gauge constraint allows one to separate the Majoranas into a set of $Z_2$ gauge fields $u_{xy}(\vec{R}+\hat{x}/2)=i\tilde{\gamma}_{\vec{R}}^{x,y}\tilde{\gamma}_{\vec{R}+\hat{x}}^y$ and $u_{zz}(\vec{R}+\hat{z}/2)=i\tilde{\gamma}_{\vec{R}}^z\tilde{\gamma}_{\vec{R}+\hat{z}}^z$, which commute with $H_K$, together with Majorana modes $\tilde{\gamma}^t$ that couple to these $Z_2$ gauge fields. The non-Abelian Ising phase corresponds to the regime where $\tilde{\gamma}^t$ forms a topological superconductor, such that the $Z_2$ vortices of u localize MZMs. Since the $Z_2$ vortices are deconfined finite-energy excitations in the Ising phase, their topological twist $e^{\pi i/8}$ is well-defined and can be exploited for a topologically protected $\pi/8$ phase gate.

The Majorana solution of $H_K$ indicates that it is physically realizable in a system where each spin is represented using a pair of proximity-induced superconducting nanowires with four MZMs $\gamma^{t,x,y,z}$, as shown in FIG. 1.

In particular, FIG. 1 is a schematic block diagram 100 showing an example pair of semiconductor-superconductor nanowire structures, labelled as A (nanowire structure 110) and B (nanowire structure 112). The semiconductor-superconductor nanowire structures are sometimes referred to herein as "heterostructures". The rectangular regions around the nanowire represent the superconductor "islands" and are shown as superconductors 120, 122. The black lines represent respective semiconducting nanowires in the topological superconducting phase and are shown as nanowires 130, 132. The dots (red dots) represent the MZM edge states (MZM edge states 140, 141, 142, 143, respectively).

Figure 2:
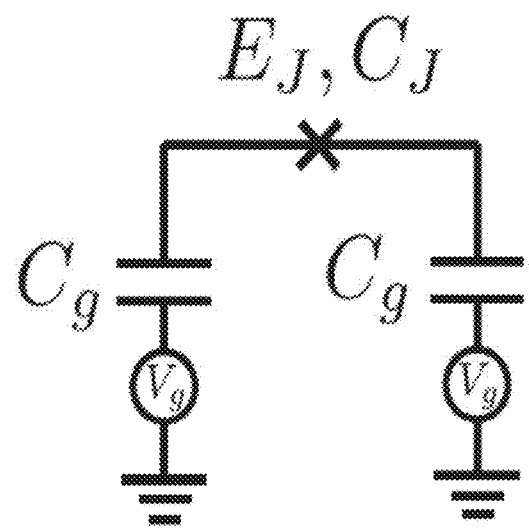
FIG. 2 is a schematic diagram showing the circuit model for FIG. 1.

FIG. 2 is a schematic diagram 200 showing the circuit model for FIG. 1.

FIG. 3 is a schematic block diagram 300 showing a plaquette of a brick lattice comprising six effective sites (a representative one of which is shown as structure 310). The six sites correspond to six instances of the semiconductor-superconductor nanowire structure shown in FIG. 1. The semiconductor nanowires 312, 314, 316, 318 in this example embodiment fully extend in the horizontal direction; the gray regions (e.g., between the superconducting regions, representative ones of which are shown as regions 330, 332) indicate normal (non-topological) regions of the semiconductor nanowires. The applied magnetic field can be taken to be normal to or in the plane. $t_A$ and $t_B$ parameterize the electron tunneling as shown. Dashed rectangle 320 indicates a unit cell of the brick lattice, each containing four superconducting islands, or two pairs of A and B-type structures, labelled 1, ..., 4 as shown.

FIG. 4 is a schematic block diagram 400 showing another depiction of the effective brick lattice. Dashed rectangles 410, 412 outline a unit cell of the lattice and each circle (such as representative circles 420, 422, 424, 426) corresponds to a semiconductor-superconductor (heterostructure) nanowire structure shown as shown in FIG. 1.

The semiconducting wires (such as InAs or InSb wires) can be either grown or lithographically defined on 2D systems, and the superconductor thin films (such as Al, and perhaps other superconductors such as Nb and NbTiN) can now be epitaxially grown with exceptional interface qualities. Example techniques for growing semiconductor wires as can be used in embodiments of the disclosed technology are described in P. Krogstrup, N. L. B. Ziino, W. Chang, S M. Albrecht, M. H. Madsen, E. Johnson, J. Nygrd, C. M. marcus, and T. S. Jespersen, Nature Materials 14 (2015). Example techniques for lithographically defining such wires as can be used in embodiments of the disclosed technology are described in J. Shabani, M. Kjaergaard, H. J. Suominen, Y. Kim. F. Nichele, K. Pakrouski, T. Stankevic, R. M. Lutchyn, P. Krogstrup, R. Feidenhans, et al., Phys. Rev. B 93, 155402 (2016).

As is shown below, such example physical realizations of $H_K$ are possible. Example embodiments for such realizations that physically implement the effective spins using the physics of charging energies are disclosed first; and subsequently, embodiments for such realizations utilizing quantum phase slips are disclosed.

In certain example embodiments, such as in the configurations shown in FIGS. 1-4, an overall charging energy for the pair of islands, each of which is controlled by a capacitance $C_g$ to a gate placed at a voltage $V_g$, is used to effectively generate the gauge constraint by constraining the total charge of the pair of islands. Example gates 160, 162 are illustrated in FIG. 1 The gates 160, 162 can be, for example, nearby metallic probes that may be set to a given electric potential.

For the four MZMs from each A, B nanowire pair to be coherent with each other (in a sense which will be made more precise below), it is desirable to retain some phase coherence between the neighboring islands that comprise a single effective spin. This is obtained by connecting the islands A and B with a Josephson junction, with Josephson coupling $E_J$ and capacitance $C_J$.

Returning to FIG. 1, Josephson junction 150 is illustrated as connecting the two islands (structures) 110, 112. Example implementations for Josephson junctions that can be used in embodiments of the disclosed technology are discussed, for instance, in Y.-J. Doh, J. A. vanDam, A. L. Roest, E. P. A. M. Bakkers, L. P. Kouwenhoven, and S. DeFranceschi, Science 309, 272 (2005).

The effective Hamiltonian describing the Majorana and phase degrees of freedom for the system in FIG. 1 can be written as $$H_{ss} = \sum_{j=A,B} H_{BdG}[\Delta_j e^{i\varphi_j}, \psi_j^\dagger, \psi_j] - E_J \cos(\varphi_A - \phi_B) + \frac{1}{2}\sum_{i,j=A,B} Q_i C_{ij}^{-1} Q_j. \quad (3)$$

Here $H_{BdG}[\Delta_j e^{i\varphi_j}, \psi_j^\dagger, \psi_j]$ is the BdG Hamiltonian for the nanowire on the jth island, where $|\Delta_j|$ is the proximity-induced superconducting gap on the jth nanowire. $Q_j=e(-2i\partial_{\varphi_j}+N_j-n_{off,j})$ is the excess charge on the jth superconducting island-nanowire combination. $-i\partial_{\varphi_j}$ represents the number of Cooper pairs on the jth superconducting island, $N_j=\int \psi_j^\dagger \psi_j$ is the total number of electrons on the jth nanowire, and $n_{off,j}$ is the remaining offset charge on the jth island, which can be tuned continuously with the gate voltage $V_{gj}$. The capacitance matrix is given by $C_{ij}=(C_g+2C_J)\delta_{ij}-C_J$, for j=A, B.

In order to decouple the fermions $\psi_j$ in $H_{BdG}$ from the phase fluctuations $\varphi_j$, a unitary transformation $U=e^{-i\Sigma_{j=A,B}(N_j/2 - n_{Mj}/2)\varphi_j}$: $H_{ss} \to UH_{ss}U^\dagger = \Sigma_j H_{BdG}[\Delta_j, \psi_j^\dagger, \psi_j] + H_+ + H_-$, is performed with $$H_- = E_{C-}\left(-i\partial_{\varphi_-} + \frac{n_{M-} - n_{off,-}}{4}\right)^2 - E_J \cos(\varphi_-), \quad (4)$$

$$H_+ = E_{C+}\left(N'_+ + \frac{n_{M+} - n_{off,+}}{4}\right)^2,$$

where $\varphi_- = \varphi_A - \varphi_B$, $\Sigma_{C-}=4e^2/(C_g+2C_J)$, $E_{C+}=4e^2/C_g$, $n_{off,\pm}=n_{off,A}\pm n_{off,B}$, $n_{M\pm}=n_{MA}\pm n_{MB}$, and $N'_+=-i\partial_{\varphi_+}/2$. For wires A, B in the topological superconducting phase, at energies below $\Delta_j$, $H_{BdG}$ creates essentially decoupled Majorana zero modes $\gamma^j$ which affect the phase dynamics only through the occupation numbers $n_{MA}=(1+i\gamma^x\gamma^t)/2$, $n_{MB}=(1+i\gamma^z\gamma^y)/2$. In order to allow the MZMs to remain free except for a constraint on the total fermion parity, one can tune the gate voltages so that $n_{off,+}=2m+1$, where m is an integer, and $n_{off,-}=0$. The ground state of the system is then two-fold degenerate, with $N'_+=m/2$, $n_{M+}=1$, and $n_{M-}=\pm 1$. There is an energy gap on the order of $E_{C+}$ to violating the gauge constraint by changing the total charge of the system, and, for $E_J < E_{C-}$, a gap of order $E_{C-}$ to excited states of $H_-$ that are related to fluctuations of the relative phase $\varphi_-$.

For energy scales below $E_{C\pm}$, the system can therefore be described as an effective spin-½ system, with $S^z=n_{M-}=\pm 1$. Tuning $n_{off,-}$ slightly away from zero acts like a Zeeman field for this effective spin degree of freedom, giving an effective Hamiltonian $H_{eff,ss}=h_z S^z$, with $h_z \propto n_{off,-}$. This is equivalent to tunneling terms between the Majorana modes $\gamma^t$ and $\gamma^z$. Effective Zeeman fields $h_x S^x$, $h_y S^y$ can also be induced by allowing electrons to tunnel between the MZMs $\gamma^x$, $\gamma^t$ and $\gamma^y$, $\gamma^t$ (see, e.g., the extended discussion in the Supplemental Description section below). It should be noted that the MZMs $\gamma^a$ are not exactly equivalent to the $\tilde{\gamma}^a$ used in Eq. 2, because the two effective spin states in this setup differ not only in the Majorana occupation numbers $n_{M-}$, but also in the wave function of $\varphi_-$ (see Supplemental Material). $\tilde{\gamma}$ can be thought of as corresponding to $\gamma$, dressed with the $\varphi_-$ degrees of freedom.

The next step is to generate the quartic Majorana couplings in Eq. 2 by coupling the different A-B island pairs together. For example, the $J_z$ term in Eq. 2 essentially represents a coupling between the occupation numbers $n_{M,A,\vec{r}}$ and $n_{M,B,\vec{r}+\hat{z}}$ of neighboring SC islands in the lattice and can be realized using a capacitor $C_Z$. This is shown in FIG. 3, where capacitors 340, 342 are shown and the labelling 1, ..., 4 has also been introduced for the two vertically coupled islands shown in rectangle 320. For numerical optimization of energy scales, it is useful to also consider a capacitance $C'_Z$ between islands 1 and 4, which is not shown explicitly in FIG. 3.

To estimate the resulting $J_z$ coupling, a detailed model for two vertically coupled effective spins is considered. In one example embodiment, the model comprises four vertically separated islands (see FIG. 3), which is described by a Hamiltonian $$H_{2s} = H_{12} + H_{34} + H_{1234}. \quad (5)$$

$H_{12}$ and $H_{34}$ are the Hamiltonians for the isolated units of the form of Eq. 14, while $H_{1234}=\Sigma_{\sigma_1,\sigma_2=\pm} Q_{12,\sigma_1} Q_{34,\sigma_2} A_{\sigma_1 \sigma_2}$ capacitively couples the two effective spins. As expected $H_{1234}$ couples the differences $Q_{ij,\pm}=Q_i \pm Q_j$ of the charges $Q_j$ on the islands. $A_{\sigma_1 \sigma_2} = \frac{1}{4}(C_{13}^{-1} + \sigma_2 C_{14}^{-1} + \sigma_1 C_{23}^{-1} + C_{24}^{-1})$ are related to the four-island capacitance matrix (see, e.g., the extended discussion in the Supplemental Description section below).

The term $H_{1234}$ in Eq. 5 generates a coupling $J_z$ between the effective spins 1-2 and 3-4 by coupling the charges $Q_j$ on the various islands. For small coupling capacitances $C_Z$, $C'_Z$, this can be estimated perturbatively. The limits of validity of the perturbative estimate can be checked by a direct numerical calculation of the spectrum of $H_{2s}$, which have been performed and are presented in the Supplemental Description section below. An example of a suitable parameter regime is for $C_Z=C'_Z=0.5 C_g$, $C_J=1.5 C_g$, and $E_J=0.45 e^2/C_J$. In this case, $J_z \approx 0.02 e^2/C_J$, while the gap to all other states in the system is $E_{gauge} \approx 10 J_z$. Thus the gauge constraint is implemented effectively through a large energy penalty $E_{gauge}$, and the system is well-described at low energies by the effective spin model (or, equivalently, the constrained Majorana model).

The $J_{xy}$ terms in Eq. 2 involve coupling MZMs in the horizontal direction. This quartic Majorana coupling can be obtained from single electron tunneling processes between the MZMs through (normal) semiconductor wires 312, 314, 316, 318 that run horizontally, as shown in FIG. 3. The electron tunneling amplitudes $t_A$ and $t_B$ can also be controlled with a gate voltage. The resulting Hamiltonian for the full 2D system shown in FIGS. 3 and 4 is then $$H_{2D} = \sum_{\vec{R}} H_{2s,\vec{R}} + H_{tun}, \quad (6)$$

$$H_{tun} = \sum_{\vec{r}} \left[t_A \psi_{t,\vec{r}}^\dagger \psi_{t,\vec{r}+\hat{x}} + t_B \psi_{y,\vec{r}}^\dagger \psi_{x,\vec{r}+\hat{x}} + H.c.\right],$$

where $H_{2s,\vec{R}}$ is the Hamiltonian for the two-spin unit cell at $\vec{R}$, given by (5) above. The single electron tunnelings $t_A$, $t_B$ violate the gauge constraint, which is related to fermion parity of the single effective spin, and thus induce an energy penalty on the order of $E_{gauge}$. The limit where $t_A, t_B \ll E_{gauge}$ is considered, so that $H_{tun}$ can be treated perturbatively around the decoupled unit cell limit. Assuming further that $t_A \ll \Delta_A$, $t_B \ll \Delta_B$, one can replace $\psi_{\alpha,\vec{r}}$, after the unitary transformation U, by the MZMs:

$$U^\dagger \psi_{\alpha,\vec{r}} U = e^{i\varphi_j \vec{r}}(1-F_{pj,\vec{r}}) u_{\vec{r}}^\alpha \gamma_{\vec{r}}^\alpha, \quad (7)$$

where $\psi_{\alpha,\vec{r}}=u_{\vec{r}}^\alpha \gamma_{\vec{r}}^\alpha$ is set after the unitary transformation U, the c-number $u_{\vec{r}}^\alpha$ is the wave function of the MZM, and $F_{pA,\vec{r}}=i\gamma_{\vec{r}}^x \gamma_{\vec{r}}^t$, $F_{pB,\vec{r}}=i\gamma_{\vec{r}}^x \gamma_{\vec{r}}^y$ are the fermion parities of the A and B islands of site $\vec{r}$. It is useful to define $\tilde{t}_A = t_A u^*_{t,\vec{r}} u_{t,\vec{r}+\hat{x}}$, $\tilde{t}_B = t_B u^*_{y,\vec{r}} u_{x,\vec{r}+\hat{x}}$, so that after the unitary transformation by U, $H_{tun}=\Sigma_{\vec{r}}[\tilde{t}_A e^{-i(1+F_{pA,\vec{r}})\varphi_A\vec{r}/2 + i(1-F_{pA,\vec{r}+\hat{x}})\varphi_A\vec{r}+\hat{x}/2} \gamma_{t,\vec{r}} \gamma_{t,\vec{r}+\hat{x}} + \tilde{t}_B e^{-i(1+F_{pB,\vec{r}})\varphi_B\vec{r}/2 + i(1-F_{pB,\vec{r}+\hat{x}})\varphi_B\vec{r}+\hat{x}/2} \gamma_{y,\vec{r}} \gamma_{x,\vec{r}+\hat{x}} + H.c.]$. Treating $H_{tun}$ perturbatively around the decoupled unit cell limit, one can obtain an effective Hamiltonian $$H_{eff} = \left|\frac{\tilde{t}_A \tilde{t}_B}{E_{gauge}}\right| \sum_{\vec{r}} \sum_{a,b=x,y} c_{ab} S^a_{\vec{r}} S^b_{\vec{r}+\hat{x}} + \sum_{\vec{R}} J_z S^z_{\vec{R}} S^z_{\vec{R}-\hat{z}}. \quad (8)$$

$c_{ab}$ are constants that depend on parameters of the model, in particular the angle $\theta \equiv \mathrm{Arg}(\tilde{t}_A \tilde{t}^*_B)$. For $\theta \approx 0$, $\pi$ and $E_J \approx E_{C_J} = e^2/C_J$, it is found that $c_{yx} \gg c_{xx}$, $c_{xy}$, $c_{yy}$. Therefore, up to negligible corrections, one can arrive at the effective Hamiltonian (1) above, with $$J_{yx} = \left|\frac{\tilde{t}_A \tilde{t}_B}{E_{gauge}}\right| c_{yx}.$$

Physically, the angle $\theta$ can be tuned by the applied magnetic flux piercing the loop defined by the tunneling paths $t_A$, $t_B$ and also the angle between the Zeeman field and the Rashba splitting of the wire.

In the Supplemental Description section below, detailed numerical estimates are provided for the parameters of the effective spin model. For the parameter choice $C_Z = C_{Z'} = 0.5C_g$, $C_J = 1.5C_g$, $E_J = 0.45e^2/C_J$ described above, and $|t_A|$, $|t_B| \approx 0.2 E_{gauge} \theta \approx 0$, $\pi$, it is found that $|c_{yx}| \approx 1.75$, $|c_{xy}| = 0.3$, $c_{xx}$, $c_{yy} \approx 0$, and thus $J_{yx} \approx 0.016 e^2/C_J$. Combined with the above estimate $J_z \approx 0.02 e^2/C_J$, it can be seen that the energy scales $J_{yx}$, $J_z$ are on the order of a few percent of the charging energy of the Josephson junctions. For Al—InAs—Al Josephson junctions, one can achieve $E_J \approx 3\text{-}4 \text{ K} \approx E_{C_J}/2$, implying that $J_{yx}$, $J_z$ would have energy scales on the order of several hundred milli-Kelvin. Nb—InAs—Nb Josephson junctions would in principle be able to support energy scales on the order of 7-8 times larger, with $J_{z,x,y}$ on the order of several Kelvin, due the correspondingly larger superconducting gap $\Delta$ of Nb.

The phase diagram of Eqs. (1)-(2) contains two phases: a phase where the fermions $\gamma_t$ form a trivial insulating phase when $J_z \gg J_{yx}$, and a phase where the fermions $\tilde{\gamma}^t$ are gapless with a Dirac-like node when $J_z \approx J_{yx}$. Both phases have an Abelian topological sector associated with the $Z_2$ gauge fields $u_{xyz}$. It is possible to open a topological gap for the Dirac node, and thus realize the non-Abelian Ising phase, by breaking the effective time-reversal symmetry of (1) with a Zeeman field $\Sigma_{\vec{r}} \Sigma_{\mu=x,y,z} h_a S^a_{\vec{r}}$, the implementation of which was described above.

Figure 5:
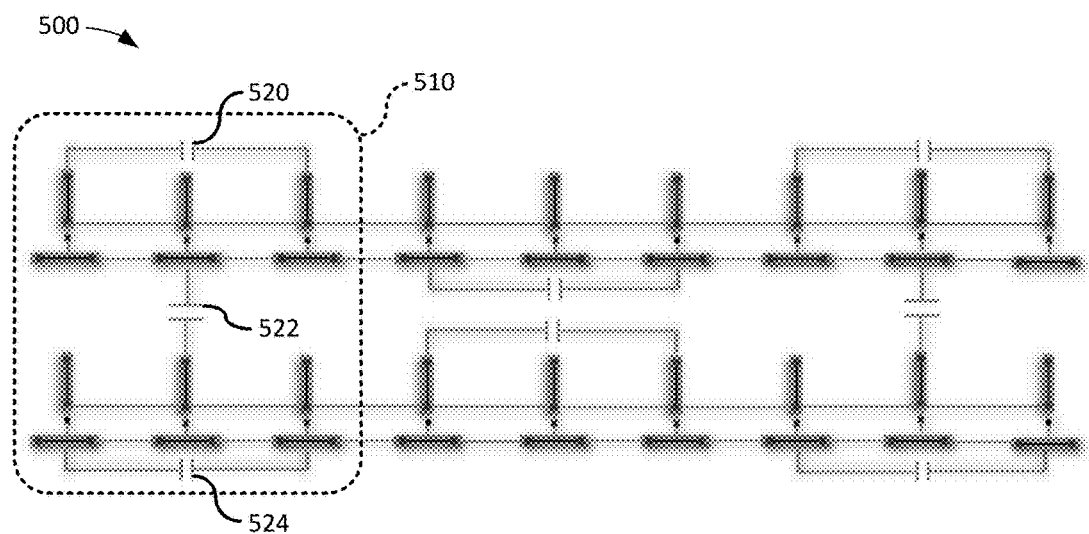
FIG. 5 is a schematic block diagram showing an example decorated brick lattice to realize a variant of the Kitaev model using the semiconductor-superconductor structures of FIG. 1.

Another possible approach to inducing the non-Abelian Ising phase is to use a modified structure where each point of the brick lattice of FIG. 1 is expanded into three points, with the couplings as shown in FIG. 5. The ground state on this lattice spontaneously breaks the effective time-reversal symmetry of (1) and gaps out the Dirac nodes in the regime where $J_z \sim J_{xy}$ to open a topological gap on the order of $J_z \sim J_{xy}$.

Figure 6:
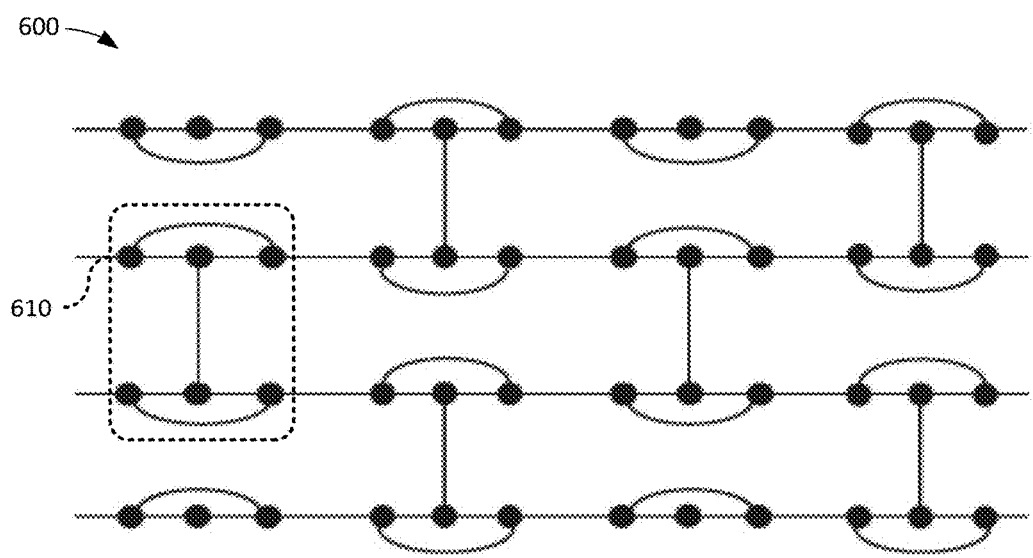
FIG. 6 is a schematic block diagram showing a nodal representation of the effective lattice model of FIG. 5.

In particular, FIG. 5 is a schematic block diagram showing a decorated brick lattice 500 to realize variant of the Kitaev model. The lattice 500 illustrating an example of a single plaquette shown made of the superconductor-semiconductor system introduced above. FIG. 6 is a schematic block diagram showing a nodal representation of the effective lattice model of FIG. 5.

In FIGS. 5 and 6, each unit cell now consists of 6 effective sites of the lattice. Representative unit cells 510 and 610 are shown in FIGS. 5 and 6. Further, and with reference to unit cell 510, capacitive couplings 520, 522, 524 are shown.

In embodiments of the disclosed system, the small perturbations $h_z$, $c_{xy}$, $c_{xx}$, $c_{yy}$ can be used to controllably tune the sign of the spontaneous time-reversal symmetry breaking and thus control whether the system enters the Ising phase or its time-reversed conjugate, denoted "$\overline{\text{Ising}}$".

Ising×Ising Phase and Genons

One example feature of embodiments of the disclosed physical system is that the vertical couplings between neighboring spins only involve capacitances (or Josephson junctions as described in the quantum phase slip based implementation below). This means that once a single copy of the model is realized, it is straightforward to realize two effectively independent copies of the model by creating overpasses (e.g., short overpasses that pass over one intermediate chain). Specifically, this can be done as shown in schematic block diagram 700 of FIG. 7 by fabricating the superconducting wires that run in the vertical direction to pass over one pair of nanowires and to couple capacitively to the next chain over in the vertical direction. Representative examples of such superconducting wires are shown as superconducting wires 710, 720.

Figure 7:
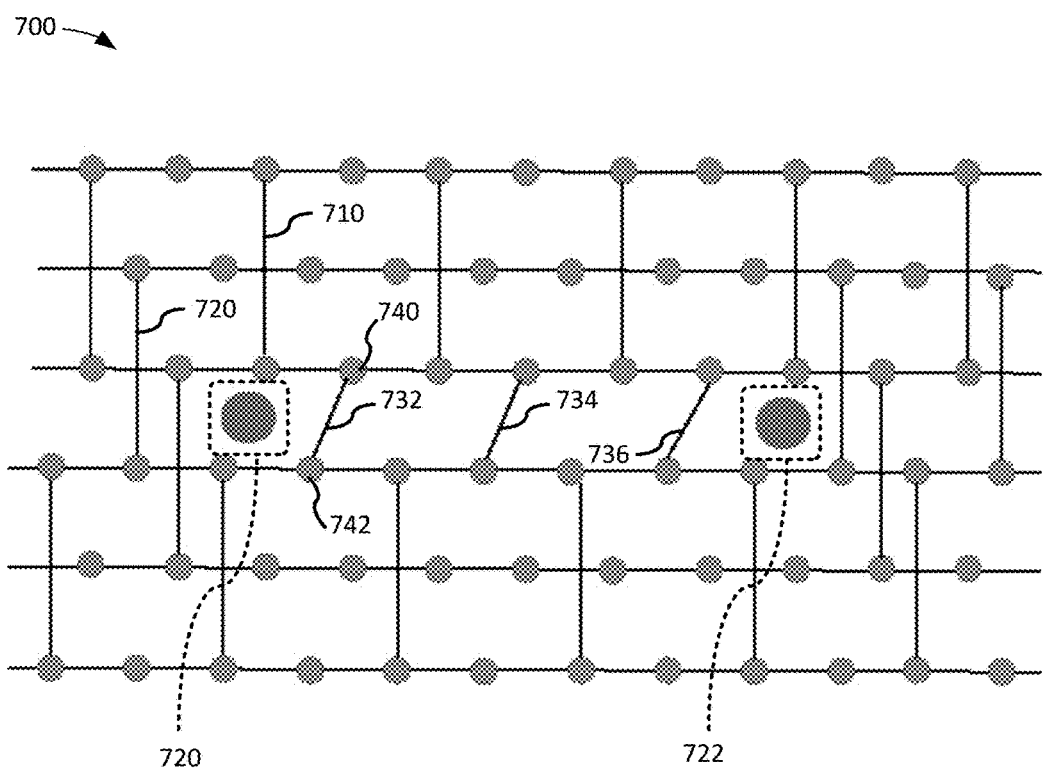
FIG. 7 is a schematic block diagram illustrating two effectively decoupled copies of the Kitaev model created with short overpasses where the vertical superconducting wires skip over one chain and couple to the next chain.

More specifically, FIG. 7 illustrates two effectively decoupled copies of the Kitaev model created with short overpasses where the vertical superconducting wires skip over one chain and couple to the next chain. Further, in the embodiment illustrated in FIG. 7, genons 720, 722 (shown by green circles) can be created at the endpoints of a branch cut along which vertical couplings 732, 734, 736 connect the two copies of the model together. In FIG. 7, and for ease of illustration, each copy of the model (corresponding to a pair of heterostructures as in FIG. 1) is represented as a blue circle, representative ones of which are shown as 740, 742 in FIG. 7.

The Ising phase contains three topologically distinct classes of quasiparticle excitations, labelled as $\mathbb{I}$, $\psi$, and $\sigma$. The Ising×Ising phase contains nine topologically distinct classes of quasiparticles, which are labeled as (a, b), for a, b=$\mathbb{I}$, $\psi$, $\sigma$.

A genon, which is labeled $X_1$ in the Ising×Ising phase is a defect in the capacitive couplings between vertically separated chains, associated with the endpoint of a branch cut that effectively glues the two copies to each other (see, e.g., FIG. 7) (Note that only half of a branch cut is sufficient. A full branch cut would also contain vertical couplings that skip over two chains.) This defect in the lattice configuration of the superconducting islands is not a quasiparticle excitation of the system, but rather an extrinsically imposed defect with projective non-Abelian statistics. $X_1$ has quantum dimension 2, and possesses the following fusion rules (Technically, there are three topologically distinct types of genons, as $X_1$ can be bound to the quasiparticles, although this $X_1$ additional complication will be ignored in the present discussion.):

$$X_1 \times X_1 = (\mathbb{I}, \mathbb{I}) + (\psi, \psi) + (\sigma, \sigma). \quad (9)$$

The braiding of genons maps to Dehn twists of the Ising state on a high genus surface, which provides a topologically protected $\pi/8$ phase gate.

In the present system, the braiding of genons involves the fact that it is difficult to continuously modify the physical location of the genons to execute a braid loop in real space. Fortunately, this is not necessary, as the braiding of the genons can be implemented through a different projection-based approach, without moving the genons. To do this, and according to certain embodiments of the disclosed technology, it is possible to project the joint fusion channel of any pair of genons into either the ($\mathbb{I}$, $\mathbb{I}$) channel or the ($\psi$, $\psi$)

channel, which can potentially be done in a variety of ways, one of which is outlined below. This is effectively a generalization of the protocol developed for 1D braiding of MZMs.

Figure 8:
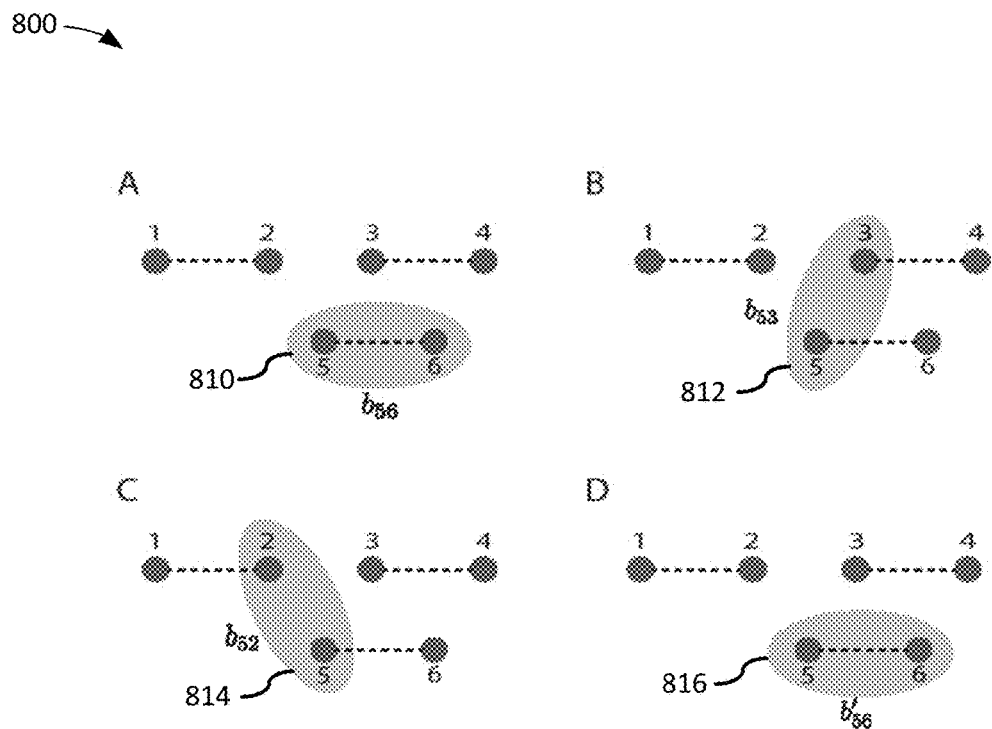
FIG. 8 is a schematic block diagram illustrating a braiding approach to realizing a π/8 phase gate.

FIG. 8 is a schematic block diagram 800 illustrating an approach to realizing such a π/8 phase gate. In order to implement the π/8 phase gate, one can start with two pairs of genons, labelled 1, . . . , 4, and have the ability to braid genons 2 and 3. To do this, an ancillary pair of genons is used, labelled 5 and 6. The braiding process is then established by projecting the genons 5 and 6 onto the fusion channel $b_{56}$, then the genons 5 and 3 onto the fusion channel $b_{35}$, the genons 5 and 2 onto the fusion channel $b_{25}$, and finally again the genons 5 and 6 onto the fusion channel $b_{56}'$ (see FIG. 8) Genons can be braided without moving them by sequentially projecting different pairs of genons onto specific fusion channels, as depicted, for example, by the gray ellipses 810, 812, 814, 816 in subdiagrams (A)-(D) shown in FIG. 8. This can be implemented by tuning the interactions between the genons by decreasing the quasiparticle gap along various paths.

It is assumed here for simplicity that $b_{56}=b_{56}'$. If the genons 5 and 6 are created out of the vacuum, then it will in fact be natural to have $b_{56}=b_{56}'=(\mathbb{I}, \mathbb{I})$. As long as $b_{56}$, $b_{35}$, $b_{25}$ are Abelian, e.g., equal to either $(\mathbb{I}, \mathbb{I})$ or $(\psi, \psi)$, then the results imply that the matrix obtained for a double braid (e.g., a full $2\pi$ exchange), is given by $$(R_{23})^2 = e^{i\phi} \begin{pmatrix} 1 & 0 & 0 \\ 0 & 1 & 0 \\ 0 & 0 & e^{i\pi/4} \end{pmatrix}, \quad (10)$$

where $e^{i\varphi}$ is an undetermined, non-topological phase. In other words, the state obtains a relative phase of $e^{2i\pi/8}$ if the fusion channel is $(\sigma, \sigma)$ as compared with $(\mathbb{I}, \mathbb{I})$, or $(\psi, \psi)$, yielding a pi/8 phase gate.

When two genons are separated by a finite distance L, the effective Hamiltonian in the degenerate subspace spanned by the genons obtains non-local Wilson loop operators:

$$H_{genon} = t_\psi W_{(\psi,\psi)} + t_\sigma W_{(\sigma,\sigma)} + H.c. \quad (11)$$

$W_{(a,a)}$ describes the exchange of a (a, a) particle between the two genons, which equivalently corresponds to a $(\mathbb{I}, a)$ or $(a, \mathbb{I})$ particle encircling the pair of genons. $t_a \propto e^{-L\Delta_a/v_a}$, for $a=\psi$, $\sigma$, are the tunneling amplitudes, with $\Delta_a$ being the energy gap for the a quasiparticles, and $v_a$ their velocity. When a (1, a) quasiparticle encircles a topological charge (b, b), it acquires a phase $S_{ab}/S_{1b}$, where $S$ is the modular $S$ matrix of the Ising phase. As shown in the Supplemental Discussion section below, this implies that for purposes of this disclosure, one only needs to ensure that $t_\sigma \neq 0$ and, in the case where $|t_\sigma| < |t_\psi|$, one must have $t_\psi < 0$.

The tunneling amplitudes $t_\psi$, $t_\sigma$ can be tuned physically by tuning the parameters of the model, such as the electron tunneling amplitudes $t_A$, $t_B$, the capacitances $C_Z$, and the gate voltages $V_{gj}$. Therefore, to tune the interactions between two desired genons, one can tune the parameters of the model in order to decrease the energy gap to the quasiparticle excitations along the path that connects them.

It is also possible to implement effectively the same physics by using instead the Ising×$\overline{\text{Ising}}$ state. In this case, the genons are replaced by holes with gapped boundaries, and the topological charge projections are implemented along various open lines that connect the different gapped boundaries. A detailed discussion of this variation is presented in the Supplemental Discussion Section below.

Quantum Phase Slip Limit

Yet another exemplary alternative architecture is also possible, if the purely capacitive coupling $C_Z$ is replaced by a Josephson junction, with Josephson coupling $E_{J_Z}$ and capacitance $C_Z$. In this case the limit where the Josephson energies $E_J$, $E_{J_Z}$ are much larger than the charging energies $e^2 C_{ij}^{-1}$ is considered, leading to a state with long range phase coherence. In the limit where the charging energies are ignored, the system has a large degeneracy due to the MZMs. A small charging energy induces quantum phase slips of the superconducting phase of the islands; the amplitude of the quantum phase slips depends on the occupation of the MZMs on the superconducting islands, thus inducing an effective Hamiltonian in the space of states spanned by the MZMs. The effective Hamiltonian takes the form: $H_{2D}=H_1+H_2+H_{tun}$, where $H_1$ consists of single-island phase slips:

$$H_1 = \sum_{\vec{r}} \left( \zeta_{\vec{r}}^A i\gamma_{\vec{r}}^z \gamma_{\vec{r}}^t + \zeta_{\vec{r}}^B i\gamma_{\vec{r}}^x \gamma_{\vec{r}}^y \right), \quad (12)$$

and $H_2$ consists of double island phase slips:

$$H_2 = -\sum_{\vec{r}} \zeta_{\vec{r}}^{AB} \gamma_{\vec{r}}^z \gamma_{\vec{r}}^t \gamma_{\vec{r}}^x \gamma_{\vec{r}}^y - \sum_{\vec{R}} \zeta_Z^{AB} \gamma_{\vec{R}}^x \gamma_{\vec{R}}^y \gamma_{\vec{R}-\hat{z}}^z \gamma_{\vec{R}-\hat{z}}^t. \quad (13)$$

$H_{tun}$ is the same as in Eqn. (6) and describes electron tunneling in the horizontal direction. The single island phase slips are modulated by the offset charge: $\zeta_{\vec{r}}^j \propto \cos(\pi n_{off,\vec{r},j})$ and can therefore be tuned to zero using the gate voltages. Double island phase slips that are not included in $H_2$ can be ignored in this limit, as can phase slips that involve more than two islands, as they are exponentially suppressed. Parameters are desirably selected to operate in the limit $\tilde{t}_A, \tilde{t}_B, \zeta_Z^{AB} \ll \zeta_{\vec{r}}^{AB}$. In this case, $\zeta_{\vec{r}}^{AB}$ effectively imposes the gauge constraint $\gamma_{\vec{r}}^z \gamma_{\vec{r}}^t \gamma_{\vec{r}}^x \gamma_{\vec{r}}^y = 1$ for states with energies much less than $\zeta_{\vec{r}}^{AB}$. Each site can therefore be described by a spin-½ degree of freedom. The term involving $\zeta_Z^{AB}$ acts like a coupling $\zeta_Z^{AB} S_{\vec{R}}^z S_{\vec{R}-\hat{z}}^z$. As before, in this limit $H_{tun}$ can be treated perturbatively, and gives rise to the desired coupling $$\frac{|\tilde{t}_A \tilde{t}_B|}{\zeta^{AB}} S_{\vec{r}}^y S_{\vec{r}+\hat{x}}^x.$$

Generalized Embodiments

This section describes various example general embodiments of the disclosed technology. These embodiments should not be construed as limiting, as they can be modified in arrangement and detail without departing from the principles of the disclosed technology.

One example embodiment disclosed herein is a universal topological quantum computing device comprising a plurality of semiconductor-superconductor heterostructures configured to have a twist defect in an Ising×Ising topological state.

In particular implementations, at least two of the semiconductor-superconductor heterostructures form a two-state quantum system having an effective spin-½ degree of freedom. For instance, the two-state quantum system can comprise: a first superconducting island on which a first semiconducting nanowire is located; and a second superconducting island on which a second semiconducting nanowire is located, the first superconducting island being substantially perpendicular to the second superconducting island and being coupled to one another via a Josephson junction. In some example implementations, at least one of the semiconductor-superconductor heterostructures comprises two semiconductor nanowire structures having four Majorana zero modes and a charging energy constraint. In certain examples, at least one of the semiconductor-superconductor heterostructures comprises two semiconductor nanowire structures using double-island quantum phase slips and having four Majorana zero modes.

In certain implementations, the semiconductor-superconductor heterostructures are arranged to form a two-dimensional Kitaev honeycomb spin model. In further implementations, the semiconductor-superconductor heterostructures are arranged into pairs, each pair comprising a first and a second semiconductor-superconductor heterostructure. The pairs of semiconductor-superconductor heterostructures can be arranged into a two-dimensional lattice comprising: a set of the pairs connected via a first nanowire to nearest neighboring pairs along a first dimension; a first subset of the set connected via one or more second nanowires to distant pairs along a second dimension, the one or more second nanowires forming overpasses that bypass one or more nearest neighboring pairs along the second dimension; and a second subset of the set connected via one or more third nanowires to nearest neighboring pairs along the second dimension. The one or more third nanowires can create the twist defect.

Any of these embodiments can be used to form, at least in part, a $\pi/8$ phase gate (e.g., as may be used for universal topological quantum computing)

Another embodiment disclosed herein is a universal topological quantum computer comprising: one or more semiconductor-superconductor heterostructures configured to have holes with gapped boundaries in an Ising×$\overline{\text{Ising}}$ topological state, where $\overline{\text{Ising}}$ is the time-reversed conjugate of the Ising state.

Further embodiments comprise a first superconducting island on which a first semiconducting nanowire is located; and a second superconducting island on which a second semiconducting nanowire is located, the first superconducting island being substantially perpendicular to the second superconducting island and being coupled to one another via a Josephson junction and thereby forming a pair of superconducting-semiconducting heterostructures.

These superconducting-semiconducting heterostructures can be used to form multiple two-spin or four-spin or higher-spin unit cells. Such unit cells can comprise the superconducting-semiconducting heterostructures as described herein.

In particular example implementations, the two-spin unit cells are arranged into a two-dimensional lattice comprising: a set of the pairs connected via a first nanowire to nearest neighboring pairs along a first dimension; a first subset of the set connected via one or more second nanowires to distant pairs along a second dimension, the one or more second nanowires forming overpasses that bypass one or more nearest neighboring pairs along the second dimension; and a second subset of the set connected via one or more third nanowires to nearest neighboring pairs along the second dimension. The one or more third nanowires can be used to create the twist defect.

Any of these embodiments can be used to form, at least in part, a $\pi/8$ phase gate (e.g., as may be used in a universal topological quantum computing)

Figure 35:
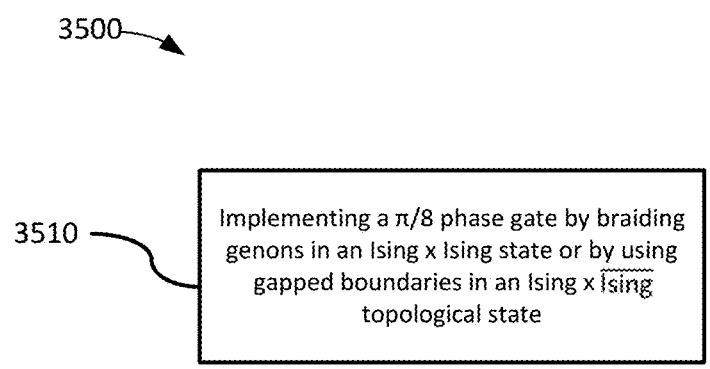
FIG. 35 illustrates an example method in accordance with the disclosed technology.

FIG. 35 illustrates an example method 3500 in accordance with the disclosed technology.

At 3510, $\pi/8$ phase gate for a quantum computing device is implemented by braiding genons in an Ising×Ising state or by using gapped boundaries in an Ising×$\overline{\text{Ising}}$ topological state, where $\overline{\text{Ising}}$ is the time-reversed conjugate of the Ising state. The braiding of genons in the Ising×Ising state can be achieved without physically moving the genons in space.

In some example implementations, the braiding comprises projecting fusion channels of pairs of the genons onto an Abelian charge sector. In some examples, the $\pi/8$ phase gate comprises six genons. In further examples, the method further comprises implementing topologically robust operations in the Ising×$\overline{\text{Ising}}$ state by using gapped boundaries. In such examples, the topologically robust operations can be implemented (performed) in the Ising×$\overline{\text{Ising}}$ topological state by a sequence of topological charge projections utilizing the gapped boundaries.

Supplemental Discussion

This section includes a more detailed description of many of the embodiments introduced above. At times, the disclosures herein are repetitive of the materials presented above but are nevertheless included in the interest of completeness.

Introduction

As noted above, it is desirable to realize and manipulate Majorana fermion zero modes in spin-orbit coupled superconducting nanowires. The ground state subspace of a set of Majorana fermion zero modes realizes a non-local Hilbert space, giving rise to topologically protected ground state degeneracies and non-Abelian exchange transformations. Aside from its profound scientific significance, the pursuit of Majorana fermion zero modes is motivated in part by the possibility of utilizing them for topological quantum computation.

The non-Abelian braiding statistics and possible measurement schemes of Majorana fermion zero modes are not sufficient for realizing a fully universal, topologically protected gate set for quantum computation. In fact, the topologically protected unitary operations that are possible with Majorana zero modes correspond to the Clifford group, which can be efficiently simulated on a classical computer. Consequently, proposals for utilizing Majorana zero modes in quantum computation require interfacing them with conventional, non-topological qubits. The topological protection of the Majorana qubits allows for higher error threshold rates for the non-topological qubits through the use of magic state distillation, but the full advantage of universal topological quantum computation is unattained in such proposals.

In this disclosure, it is shown that a network of superconducting nanowires hosting Majorana zero modes, together with an array of Josephson-coupled superconducting islands, can be used to realize a more powerful type of non-Abelian defect: a genon in an Ising×Ising topological state. The braiding of such genons, in conjunction with the usual braiding of Majorana zero modes, can be utilized for fully universal TQC by providing the missing topological single-qubit π/8 phase gate. Further details about such genons and the π/8 phase gate are found in, for example, M. Barkeshli and X.-G. Wen, Phys. Rev. B 81, 045323 (2010), arXiv:0909.4882; M. Barkeshli and X.-G. Wen, Phys. Rev. B 84, 115121 (2011); M. Barkeshli and X.-L. Qi, Phys. Rev. X 2, 031013 (2012), arXiv:1112.3311; and M. Barkeshli, C.-M. Jian, and X.-L. Qi, Phys. Rev. B 87, 045130 (2013), arXiv:1208.4834.

This disclosure includes the following basic building blocks. First, it is shown that an array of suitably coupled Majorana zero modes in nanowire systems can realize a two-dimensional phase of matter with Ising topological order. (The Ising topologically ordered phase is topologically distinct from a p+ip superconductor, as the latter does not have intrinsic topological order.) This is done by showing how to engineer an effective Kitaev honeycomb spin model in a realistic physical system of coupled Majorana nanowires. Each effective spin degree of freedom corresponds to a pair of Majorana nanowires. In this disclosure, several example approaches are presented to doing this, including one based on charging energies and another based on quantum phase slips. An analysis of the energy scales of a physically realistic system indicates that the Ising topological order could have energy gaps on the order of a few percent of the charging energy of the Josephson junctions of the system; given present-day materials and technology, energy gaps of up to several Kelvin are estimated.

Second, it is shown how, using current nanofabrication technology, short overpasses between neighboring chains can be used to create two effectively independent Ising phases, referred to as an Ising×Ising state. Changing the connectivity of the network by creating a lattice dislocation allows the creation of a genon; this effectively realizes a twist defect that couples the two layers together. Finally, the genons can be effectively braided with minimal to no physical movement of them, by tuning the effective interactions between them.

Together, these ingredients allow the possibility of a topologically protected π/8 phase gate. The braiding and fermion-parity measurements of the non-Abelian quasiparticles in the Ising state allow the CNOT and Hadamard gate. Together, these three topologically protected operations allow for the possibility of a universal topological quantum computer (TQC).

Charging Energy Based Implementation

Figure 9:
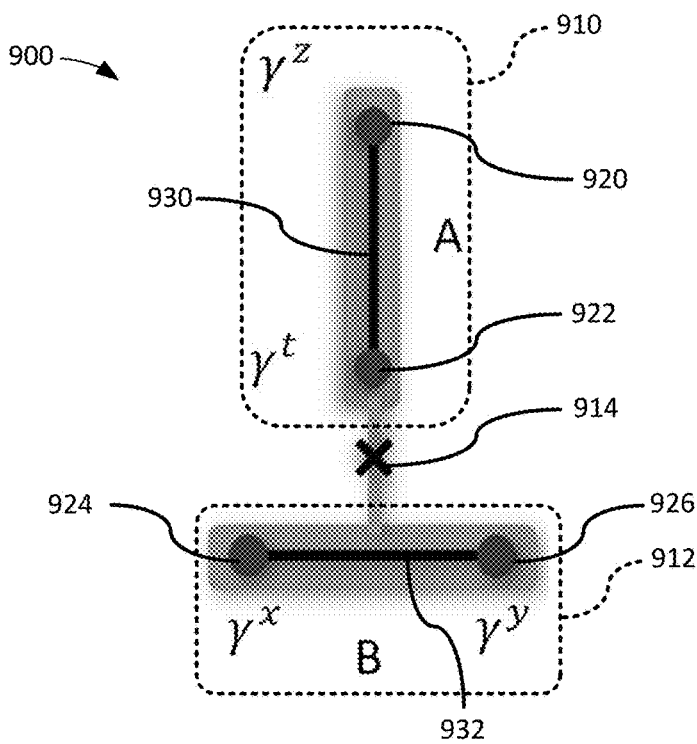
FIG. 9 is another schematic block diagram showing a pair of A, B superconducting islands coupled together with a Josephson junction.
Figure 10:
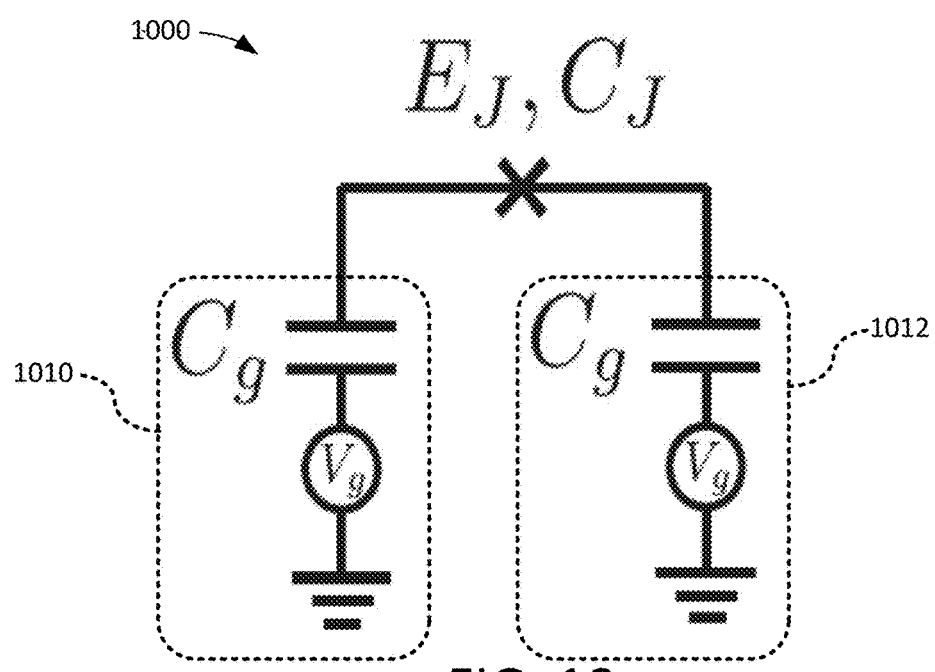
FIG. 10 is a schematic showing an effective circuit diagram for the pair of A, B islands in FIG. 9, indicating the capacitances and Josephson junctions.

FIG. 9 is a schematic block diagram 900 showing an example pair of A, B superconducting islands (shown as islands 910 ("A") and 912 ("B")), coupled together with a Josephson junction 914, denoted by the x. The dots (red dots 920, 922, 924, 926) represent Majorana zero modes, labelled $\gamma^x, \gamma^y, \gamma^z, \gamma^t$. The Majorana zero modes are localized at the end of the semiconducting nanowires (930, 932), which are shown in black. As illustrated at 1010, 1012 in FIG. 10, each A (910) and B (912) island has a capacitance $C_g$ to a gate voltage $V_g$, which is then grounded. In particular, FIG. 10 is a schematic showing an effective circuit diagram 1000 for the pair of A, B islands, indicating the capacitances and Josephson junctions.

Figure 11:
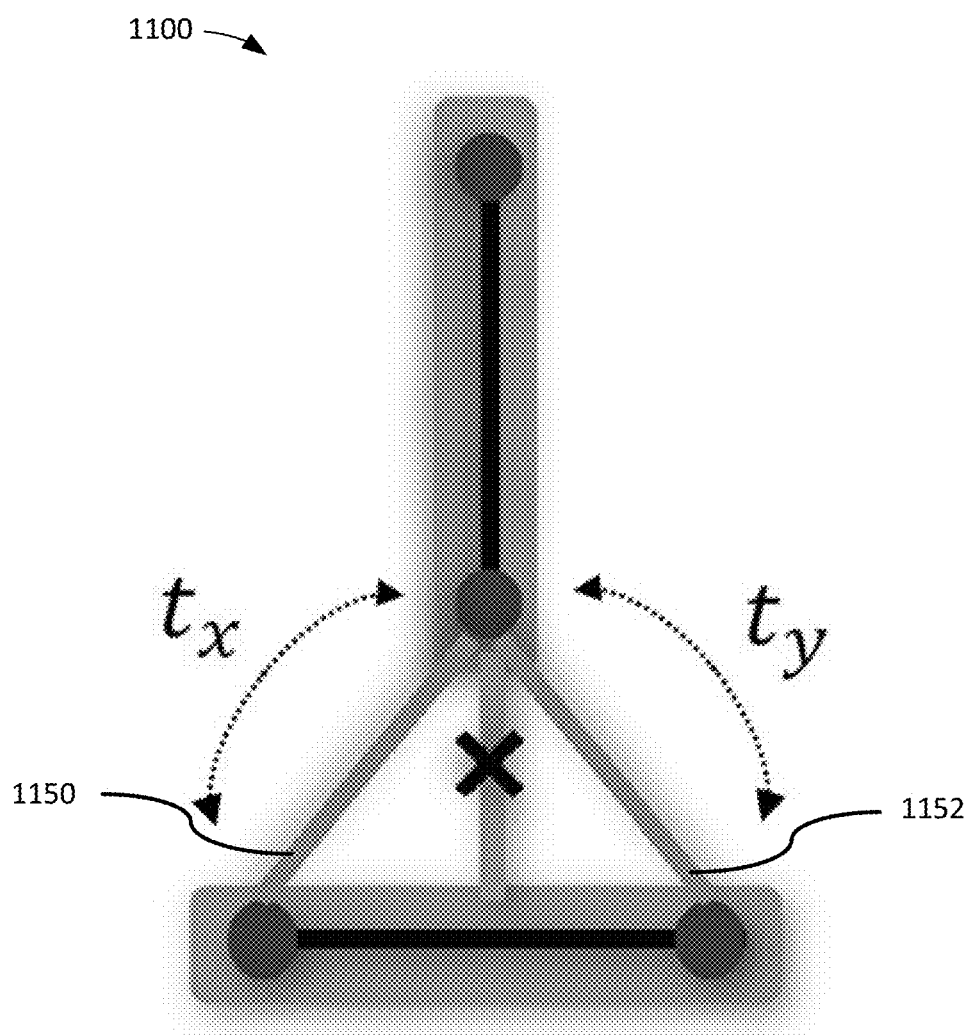
FIG. 11 is a schematic block diagram showing another representation of FIG. 9 including further non-superconducting semiconductor wires.

FIG. 11 is a schematic block diagram 1100 showing a representation of FIG. 9 where wire (grey wires) 1150, 1152 indicate normal (non-superconducting) semiconductor wire. Tuning the voltage on the semiconductor wires allows tuning the electron tunneling amplitudes $t_x$ and $t_y$ between the Majorana zero modes.

This section begins by describing an implementation where charging energies are the dominant energies in the system. The complexity of analysis then gradually increases, by first describing the physics of a single effective spin, then two vertically coupled spins that will form the unit cell of the Kitaev model, and subsequently the horizontal couplings that will link all of the two-spin unit cells into the full effective spin model.

Single Spin

Consider the configuration shown in FIG. 9, which comprises two superconducting islands, labelled A (910) and B (912), each of which is proximity coupled to a Majorana nanowire (shown as nanowires 930, 932, respectively). Each superconducting island is separated by a capacitance $C_g$ to a gate voltage $V_g$. The A and B islands are coupled together through a Josephson junction (shown as Josephson junction 914), with Josephson coupling $E_J$ and junction capacitance $C_J$. The effective Hamiltonian for this system is $$H_{ss} = \sum_{j=A,B} H_{BdG}[\Delta_j e^{i\varphi_j}, \psi_j^\dagger, \psi_j] - E_J\cos(\varphi_A - \varphi_B) + \frac{1}{2}\sum_{i,j=A,B} Q_i C_{ij}^{-1} Q_j. \quad (14)$$

Here, $\varphi_j$ for j=A, B is the superconducting phase on the A and B islands, $H_{BdG}[\Delta_j e^{i\varphi_j}, \psi_j^\dagger, \psi_j]$ is the BdG Hamiltonian for the nanowire on the jth island, where $|\Delta_j|$ is the proximity-induced superconducting gap on the jth nanowire. $Q_j$ is the excess charge on the jth superconducting island-nanowire combination; it can be written as:

$$Q_j = e(-2i\partial_{\varphi_j} + N_j - n_{offj}), \quad (15)$$

where $-i\partial_{\varphi_j}$ represents the number of Cooper pairs on the jth superconducting island, $N_j = \int \psi_j^\dagger \psi_j$ is the total number of electrons on the jth nanowire, and $n_{offj}$ is the remaining offset charge on the jth island, which can be tuned continuously with the gate voltage $V_g$.

The capacitance matrix is given by $$C = \begin{pmatrix} C_g + C_J & -C_J \\ -C_J & C_g + C_J \end{pmatrix} \quad (16)$$

The charging energy term can be rewritten in terms of the total and relative charges on the A and B islands:

$$\frac{1}{2}\sum_{i,j=A,B} Q_i C_{ij}^{-1} Q_j = \frac{1}{4C_g}(Q_A + Q_B)^2 + \quad (17)$$

$$\frac{1}{4}\frac{1}{C_g + 2C_J}(Q_A - Q_B)^2$$

$$= \frac{e^2}{C_g}(-i\partial_{\varphi A} - i\partial_{\varphi B} + (N_+ - n_{off+})/2)^2 +$$

$$\frac{e^2}{C_g + 2C_J}(-i\partial_{\varphi A} + i\partial_{\varphi B} +$$

$$(N_- - n_{off-})/2)^2,$$

where $$N_\pm = N_A \pm N_B,$$

$$n_{off\pm} = n_{offA} \pm n_{offB}. \quad (18)$$

The BdG Hamiltonian for the nanowire is given by $$H_{BdG}[\Delta e^{i\varphi}, \psi^\dagger, \psi] = \qquad (19)$$

$$\int_0^L dx \left[ \psi^\dagger(x) \left( -\frac{1}{2m^*}\partial_x^2 - \mu + i\alpha\sigma_y\partial_x + g\mu_B \vec{B}\cdot\vec{\sigma} \right) \psi(x) + \right.$$

$$\left. \left( \Delta e^{i\varphi}, \psi_\uparrow^\dagger\psi_\downarrow^\dagger + H.c. \right) \right],$$

where $\psi = \begin{pmatrix} \psi_\uparrow \\ \psi_\downarrow \end{pmatrix}$.

Here x is taken to be the coordinate along the wire and L is the length of the wire. $\alpha$ is the Rasha spin-orbit coupling, $\mu$ is the chemical potential, and $m^*$ is the effective mass of the electrons in the nanowire, $\vec{B}$ is the magnetic field and $g\mu_B|B|$ is the Zeeman energy.

It is now useful to perform a unitary transformation $U = e^{-i\Sigma_{j=A,B}(N_j/2 - n_{Mj}/2)\varphi_j}$ in order to decouple the phase $\varphi_j$ from the fermions $\psi_j$ in $H_{BdG}$. Here, $n_{Mj}=0, 1$ is the occupation number of the pair of Majorana zero modes on wire j. It is given in terms of the Majorana zero modes as $$n_{MA} = (1 + i\gamma^a\gamma')/2,$$

$$n_{MB} = (1 + i\gamma^x\gamma^y)/2. \qquad (20)$$

Under this transformation, the charge $Q_j$ transforms as:

$$Q_j' = U^\dagger Q_j U = e(-2i\partial_{\varphi j} + n_{Mj} - n_{\text{off}j}). \qquad (21)$$

Thus, taking $H_{ss} \to U^\dagger H_{ss} U$, one obtains $$H_{ss}' = U^\dagger H_{ss} U = \sum_j H_{BdG}[\Delta_j, \psi_j^\dagger, \psi_j] + H_+ + H_-, \qquad (22)$$

$$H_+ = +\frac{4e^2}{C_g}\left(-i\partial_{\varphi_+} + \frac{n_{M+} - n_{\text{off},+}}{4}\right)^2$$

$$H_- = \frac{4e^2}{C_g + 2C_J}\left(-i\partial_{\varphi_-} + \frac{n_{M-} - n_{\text{off},-}}{4}\right)^2 - E_J\cos(\varphi_-).$$

Here, the following combinations are defined:

$$n_{M\pm} = n_{MA} \pm n_{MB},$$

$$\varphi_\pm = \varphi_A \pm \varphi_B,$$

$$\partial_{\varphi_\pm} = \tfrac{1}{2}(\partial_{\varphi_A} \pm \partial_{\varphi_B}). \qquad (23)$$

With this definition, $$[i\partial_{\varphi_\rho}(x), \varphi_{\rho'}(x')] = i\delta_{\rho\rho'}\delta(x-x'),\ \rho,\rho' = \pm \qquad (24)$$

It is also useful to define $$N_j' = -i\partial_{\varphi_j},\ j = A,B$$

$$N_+' = (N_A' + N_B')/2$$

$$Q_\pm' = Q_A' \pm Q_B'. \qquad (25)$$

With these definitions, one sees that the compactification of $\varphi_+, \varphi_-$ is:

$$(\varphi_+, \varphi_-) \sim (\varphi_+ + 2\pi, \varphi_- + 2\pi) \sim (\varphi_+ + 2\pi, \varphi_- - 2\pi). \qquad (26)$$

While $\varphi_+$ and $\varphi_-$ are formally decoupled in the Hamiltonian, they are coupled through their boundary conditions. The ground state of $H_{ss}'$ can now be written as $$\tfrac{1}{2}\int_{-2\pi}^{2\pi} d\varphi_+ d\varphi_- \psi_{n_{MA},n_{MB}}(\varphi_+,\varphi_-)|\varphi_+,\varphi_-,n_{MA},n_{MB}\rangle \qquad (27)$$

Here, $|n_{MA}, n_{MB}\rangle$ is the state of the Majorana zero modes, and $|\varphi_+, \varphi_-\rangle$ is the state for the phase degrees of freedom.

Importantly, the wave function of $\varphi_+, \varphi_-$ itself does depend on the values of $n_{MA}, n_{MB}$. Since the Hamiltonians for $H_+$ and $H_-$ are decoupled, one can immediately write the ground state wave function for $\varphi_+, \varphi_-$:

$$\psi_{n_{MA},n_{MB}}(\varphi_+, \varphi_-) = \frac{1}{\sqrt{2\pi}} e^{iN_+'\varphi_+} f_{n_{M-}}(\varphi_-), \qquad (28)$$

where $f_{n_{M-}}(\varphi_-)$ is the ground state wave function for $H_-$, which is peaked at $\varphi_- = 0$. Because of the compactification conditions on $\varphi_\pm$, one sees that if $N_+' = (N_A' + N_B')/2$ is integer (half-integer), then $f_{n_{M-}}(\varphi_-)$ is periodic (antiperiodic) in $\varphi_- \to \varphi_- + 2\pi$.

For energies much less than the proximity-induced gap $\Delta$, one can ignore the excited single particle states associated with $H_{BdG}$, and the system can be described by the following effective Hamiltonian:

$$H_{\text{eff}} = \frac{4e^2}{C_g}\left(N_+' + \frac{n_{M+} - n_{\text{off},+}}{4}\right)^2 + \qquad (29)$$

$$\frac{4e^2}{C_g + 2C_J}\left(-i\partial_{\varphi_-} + \frac{n_{M-} - n_{\text{off},-}}{4}\right)^2 - E_J\cos(\varphi_-)$$

Now define:

$$E_{C+} = \frac{4e^2}{C_g}, \qquad (30)$$

$$E_{C-} = \frac{4e^2}{C_g + 2C_J}.$$

One sees that the effect of $H_+$ is to fix the total charge $N_+'$ on the pair of A, B islands to a fixed value, and gives an energy cost of $E_{C+}$ to increase the charge by one unit. If one sets $$n_{\text{off}+} = 2m+1,\ m \in \mathbb{Z} \qquad (31)$$

then the ground state of the system will be given by $$N_+' = m/2,\ n_{M+} = 1. \qquad (32)$$

Therefore, the system will have two lowest energy states, associated with $n_{M-} = \pm 1$. Thus one can define an effective spin degree of freedom:

$$S^z \equiv n_{M-} = \pm 1. \qquad (33)$$

These two states can be denoted as $|S^z\rangle$:

$$|S^z\rangle \propto \int_0^{2\pi} d\varphi_+ d\varphi_- f_{S^z}(\varphi_-)\left|\varphi_+, \varphi_-, n_{MA} = \frac{1+S^z}{2}, n_{MB} = \frac{1+S^z}{2}\right\rangle, \qquad (34)$$

where $N_+' = m/2 = 0$ is chosen for simplicity. Note that $|S^z = \pm 1\rangle$ differ both in the value of $n_{M-} = \pm$ and also the wave function $f_{n_{M-}}(\varphi_-)$. For future reference, it will also be useful to define the state $$|\bar{S}\rangle \propto \int_0^{2\pi} d\varphi_+ d\varphi_- f_{-S^z}(\varphi_-)\left|\varphi_+, \varphi_-, n_{MA} = \frac{1+S^z}{2}, n_{MB} = \frac{1-S^z}{2}\right\rangle, \qquad (35)$$

which has the opposite wave function $f_{-S^z}(\varphi_-)$ as compared with $|S^z\rangle$.

The effective Hamiltonian in the two-dimensional space $|S^z=\pm1\rangle$ is given (up to an overall constant) by $$H_{eff} = h_z S^z. \quad (36)$$

The value of $h_z$ depends on parameters in $H_{eff}$, as described below.

Numerical Solution

The Hamiltonian $H_{ss}' = H_{BdG} + H_+ + H_-$ (see Eq. (22)). The three terms, $H_{BdG}$, $H_+$, $H_-$ commute with each other and can be separately solved. As discussed above, $H_{BdG}$ is gapped for energies below $\Delta$, aside from the zero energy states arising from the Majorana zero modes, while $H_+$ has a gap of $E_{C+}$. It is useful to solve $H_-$ numerically, for the different Majorana occupation numbers.

Figure 12:
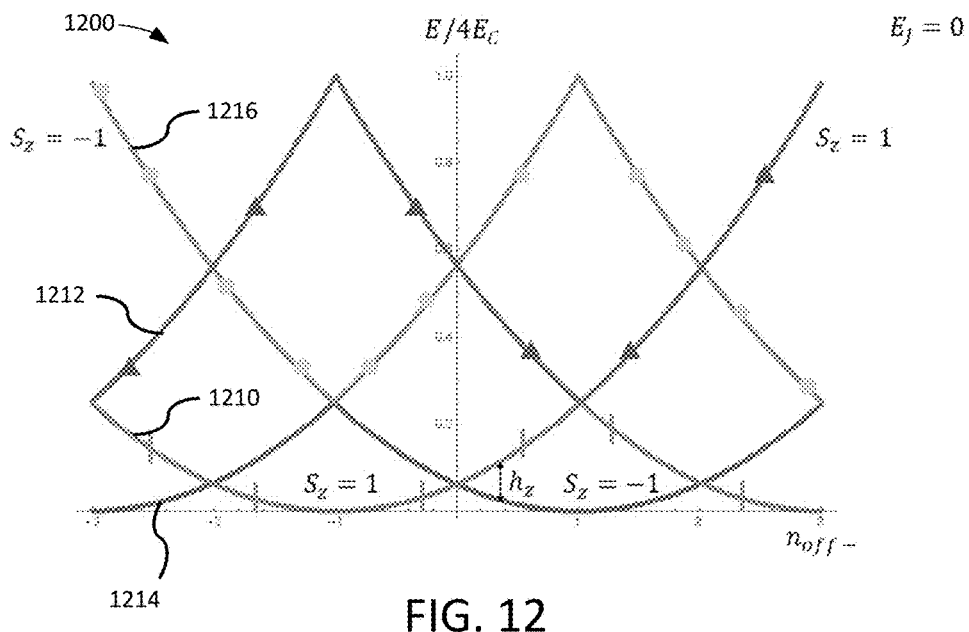
FIGS. 12 and 13 are graphs plotting the energy spectra for the four lowest energy states of $H_-$, as a function of the offset charge $n_{off,-}$, for the two different values of the Majorana occupation numbers $S^z = n_{M-} = \pm 1$.
Figure 13:
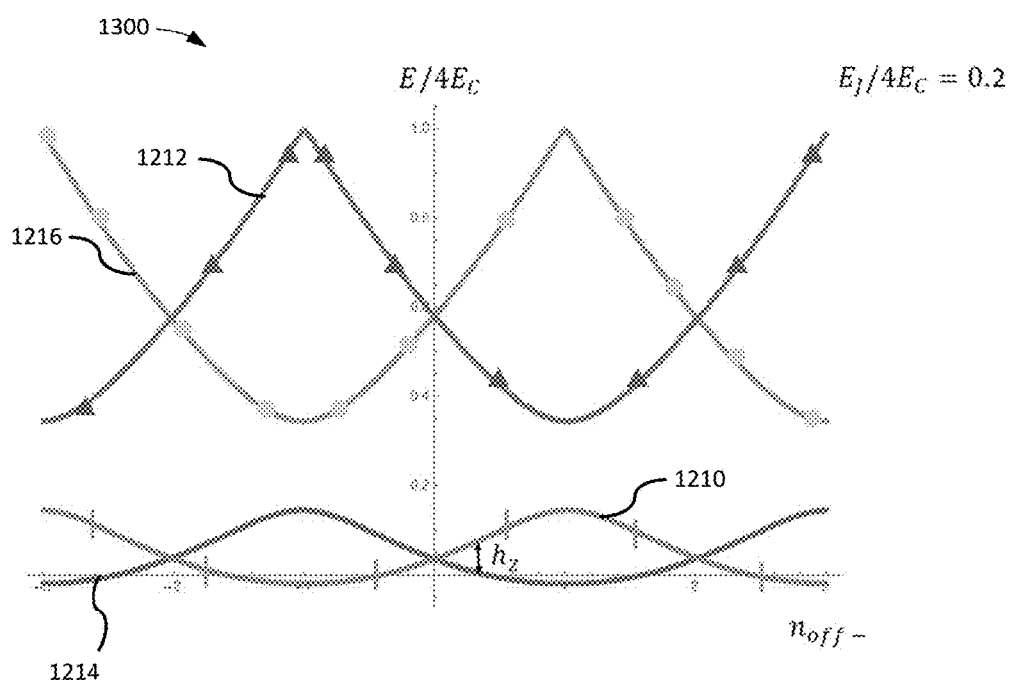

FIG. 12 and FIG. 13 are graphs 1200, 1300, respectively, plotting the energy spectra for the four lowest energy states of $H_-$, as a function of the offset charge $n_{off,-}$, for the two different values of the Majorana occupation numbers $S^z = n_{M-} = \pm 1$. To connect with some standard notation in the literature for the well-known Hamiltonian $H_-$, it will be useful to define $$E_C = E_{C-}/4 = \frac{e^2}{C_g + 2C_J}. \quad (37)$$

One can see that for energies much smaller than $E_C$, the system simply consists of the two states $|S^z=\pm1\rangle$. These are degenerate when $n_{off-}=0$, and acquire a small splitting when $n_{off-}\neq 0$.

More specifically, FIG. 12 is a plot of energy spectrum of $H_-$, in units of $4E_C$. In the figure, $E_J=0$. Green (1210) and red (1212) curves are the ground state and the first excited state energies, respectively, for the case $S^z=n_{M-}=1$, as a function of the offset charge $n_{off-}$. Blue (1214) and yellow (1216) curves are the ground state and first excited energies, respectively, for the case $S^z=n_{M-}=-1$. One can see that at $n_{off-}=0$, there is a degeneracy between $S^z=\pm1$, with a gap of order $E_C$ to all other states. Non-zero $n_{off-}$ acts like a Zeeman field that splits the energies of the two spin states.

FIG. 13 is the same plot as in FIG. 12, but for $E_J=0.2$ ($4E_C$).

Analytical Solution

The Hamiltonian $H_-$ can also be fully solved analytically through the use of Mathieu functions.

Here, this solution is provided for reference. In particular:

$$h_z = E_c(a_{v+}(-E_J/2E_C) - a_{v-}(-E_J/2E_C))/2 \quad (38)$$

where $a_v(q)$ is Mathieu's characteristic value, and $$v_\pm = 2[-n_{g\pm} + k(0, n_{g\pm})], \quad (39)$$

$$n_{g\pm} = (\pm 1 - n_{off-})/4 + \frac{m \bmod 2}{2}, \quad (40)$$

$$k(0, n_{g\pm}) = \text{int}(n_{g\pm}) \sum_{l=\pm 1} (\text{int}(2n_{g\pm} + l/2) \bmod 2).$$

int(x) rounds x to the nearest integer. The average charge $Q_B'$ on the B island is given by:

$$\langle S^z|Q_B'|S^z\rangle = -\frac{1}{2}\langle S^z|Q_-'|S^z\rangle - e\langle S^z|-2i\partial_{\varphi_-} + (S^z - n_{off,-})/2|S^z\rangle \quad (41)$$

$$= \frac{e}{E_C}\frac{\langle S^z|\partial H_{ss}'|S^z\rangle}{\partial n_{off-}} = S^z \frac{e}{E_C}\frac{\partial h_z}{\partial n_{off-}}.$$

Evaluating the partial derivative:

$$\frac{\partial h_z}{\partial n_{off-}} = \frac{E_c}{2}(a_{v+}'(-E_J/2E_C) - a_{v-}'(-E_J/2E_C)), \quad (42)$$

where $$a_v'(x) \equiv \frac{\partial a_v(x)}{\partial v}. \quad (43)$$

Note it has been assumed that $\partial k/\partial n_{g\pm}=0$, which is true except for certain fine-tuned values of $n_{g\pm}$.

Effective $S^x$ and $S^y$ Terms

Above, it was shown that tuning $n_{off-}$ away from zero effectively acts like a Zeeman field in the $S^z$ direction. Zeeman fields in the $S^x$ and $S^y$ direction can also be generated, by allowing electron tunneling, with amplitude $t_x$ and $t_y$, through the semiconducting wires as shown in FIG. 11. Consider the following electron tunneling perturbations to $H_{ss}$:

$$\delta H = t_x \psi_x^\dagger \psi_t + t_y \psi_y^\dagger \psi_t + H.c. \quad (44)$$

After the unitary transformation U, $\delta H$ changes:

$$\delta H' = (U^\dagger \delta H U = t_x(\psi_x')^\dagger \psi_t' + t_y(\psi_y')^\dagger \psi_t' + H.c., \quad (45)$$

where $$\psi_x' = U^\dagger \psi_x U = e^{i\varphi_B(1-F_{pB})/2}\psi_x,$$

$$\psi_y' = U^\dagger \psi_y U = e^{i\varphi_B(1-F_{pB})/2}\psi_y,$$

$$\psi_t' = U^\dagger \psi_t U = e^{i\varphi_A(1-F_{pA})/2}\psi_t, \quad (46)$$

where $$F_{pA} = i\gamma^z \gamma^t,$$

$$F_{pB} = i\gamma^x \gamma^y \quad (47)$$

are the fermion parities of the A and B islands, respectively. Assuming the regime $$t_x, t_y \ll \Delta, \quad (48)$$

where $\Delta$ is the superconductivity-induced proximity gap in the semiconducting nanowire, one can write the electron operators at low energies in terms of the Majorana zero modes:

$$\psi_\alpha = u_\alpha \gamma^\alpha, \quad (49)$$

where $\alpha = x, y, z, t$, and $u_\alpha$ are complex numbers (whose magnitude is order unity) that depend on microscopic details. Thus, the following can be obtained:

$$\delta H' = t_x u_x^* u_t \gamma^x e^{-i\varphi_B(1-F_{pB})/2 + i\varphi_A(1-F_{pA})/2}\gamma^t + t_y u_y^* u_t \gamma^y e^{-i\varphi_B(1-F_{pB})/2 + i\varphi_A(1-F_{pA})/2}\gamma^t + H.c. \quad (50)$$

Recall that $n_{M+}=1$, and that $n_{MA}=(1+F_{pA})/2$, $n_{MB}=(1+F_{pB})/2$, which implies that $$F_{pA}+F_{pB}=0. \tag{51}$$

It is useful to define $$\tilde{t}_x = t_x u_x^* u_t$$

$$\tilde{t}_y = t_y u_y^* u_t \tag{52}$$

Thus, one gets $$\delta H' = \tilde{t}_x e^{-i\varphi_B(1-F_{pA})/2 + i\varphi_A(1-F_{pA})/2} \gamma^x \gamma^t + \tag{53}$$
$$\tilde{t}_y e^{-i\varphi_B(1-F_{pA})/2 + i\varphi_A(1-F_{pA})/2} \gamma^y \gamma^t + H.c.,$$
$$= \tilde{t}_x e^{i\varphi_-(1-F_{pA})/2} \gamma^x \gamma^t + \tilde{t}_y e^{i\varphi_-(1-F_{pA})/2} \gamma^y \gamma^t + H.c.,$$

where $\gamma^x$, $\gamma^y$ are also commuted through the exponential term. Note further that $S^z = n_{M-} = n_{MA} - n_{MB} = (F_{pA} - F_{pB})/2 = F_{pA}$. The above can then be rewritten as $$\delta H' = \left(\frac{1+S^z}{2} + \frac{1-S^z}{2} e^{i\varphi_-}\right)(\tilde{t}_x \gamma^x \gamma^t + \tilde{t}_y \gamma^y \gamma^t) + H.c., \tag{54}$$
$$= \left(\frac{1+S^z}{2} + \frac{1-S^z}{2} e^{i\varphi_-}\right)(\tilde{t}_x \gamma^x \gamma^t + \tilde{t}_y \gamma^y \gamma^t) + H.c.,$$
$$= i\gamma^x \gamma^t \text{Im}(\tilde{t}_x(1+e^{i\varphi_-}) - \tilde{t}_y(1-e^{i\varphi_-})) +$$
$$i\gamma^y \gamma^t \text{Im}(\tilde{t}_y(1+e^{i\varphi_-}) - \tilde{t}_x(1-e^{i\varphi_-}))$$

Thus, $$\delta H' = a_x i\gamma^x \gamma^t + a_y i\gamma^y \gamma^t, \tag{55}$$

with $$a_x = \text{Im}(\tilde{t}_x(1+e^{i\varphi_-}) - \tilde{t}_y(1-e^{i\varphi_-}))$$
$$a_y = \text{Im}(\tilde{t}_y(1+e^{i\varphi_-}) - \tilde{t}_x(1-e^{i\varphi_-})) \tag{56}$$

For $t_x$, $t_y \ll E_C$, one can treat $\delta H'$ perturbatively around $H_{ss}$. Thus, one can get an effective Hamiltonian $H_{eff}$ such that $$\langle m|H_{eff}|n\rangle = \langle m|H_{ss} + \delta H'|n\rangle \tag{57}$$
$$= \delta_{mn} E_m + \langle m|\delta H'|n\rangle,$$

where $|m\rangle$ are the normalized eigenstates of the unperturbed Hamiltonian $H_{ss}$. Then one can write the effective Hamiltonian in the low energy spin space as $$H_{eff} = \sum_m E_m |m\rangle\langle m| + \sum_{m,n} \langle m|\delta H'|n\rangle |m\rangle\langle n| \tag{58}$$
$$= h_z S^z + h_x S^x + h_y S^y,$$

where $$h_z = E_{S^z=1} - E_{S^z=-1} + \langle S^z=1|\delta H'|S^z=1\rangle - \langle S^z=-1|\delta H'|S^z=-1\rangle,$$

$$h_x = \text{Re}[\langle S^z=-1|\delta H'|S^z=1\rangle],$$

$$h_y = \text{Im}[\langle S^z=-1|\delta H'|S^z=1\rangle]. \tag{59}$$

Recall that the two spin states of interest, $|S^z\rangle$ are defined as in Eq. (34). Thus:

$$\langle S^z|\delta H'|S^z\rangle = 0, \tag{60}$$

$$\langle S^z|\delta H'|-S^z\rangle = \langle S^z|a_x i\gamma^x \gamma^t + a_y i\gamma^y \gamma^t|-S^z\rangle$$
$$= \langle S^z|a_x|\tilde{S}^z\rangle - i S^z \langle S^z|a_y|\tilde{S}^z\rangle,$$

where $|\widetilde{S^z}\rangle$ is defined in Eq. (35). Therefore:

$$h_x = \text{Re}[\langle -1|a_x|\widetilde{-1}\rangle + i\langle -1|a_y|\widetilde{-1}\rangle]$$

$$h_y = \text{Im}[\langle -1|a_x|\widetilde{-1}\rangle + i\langle -1|a_y|\widetilde{-1}\rangle] \tag{61}$$

Two Spin Unit Cell

Figure 14:
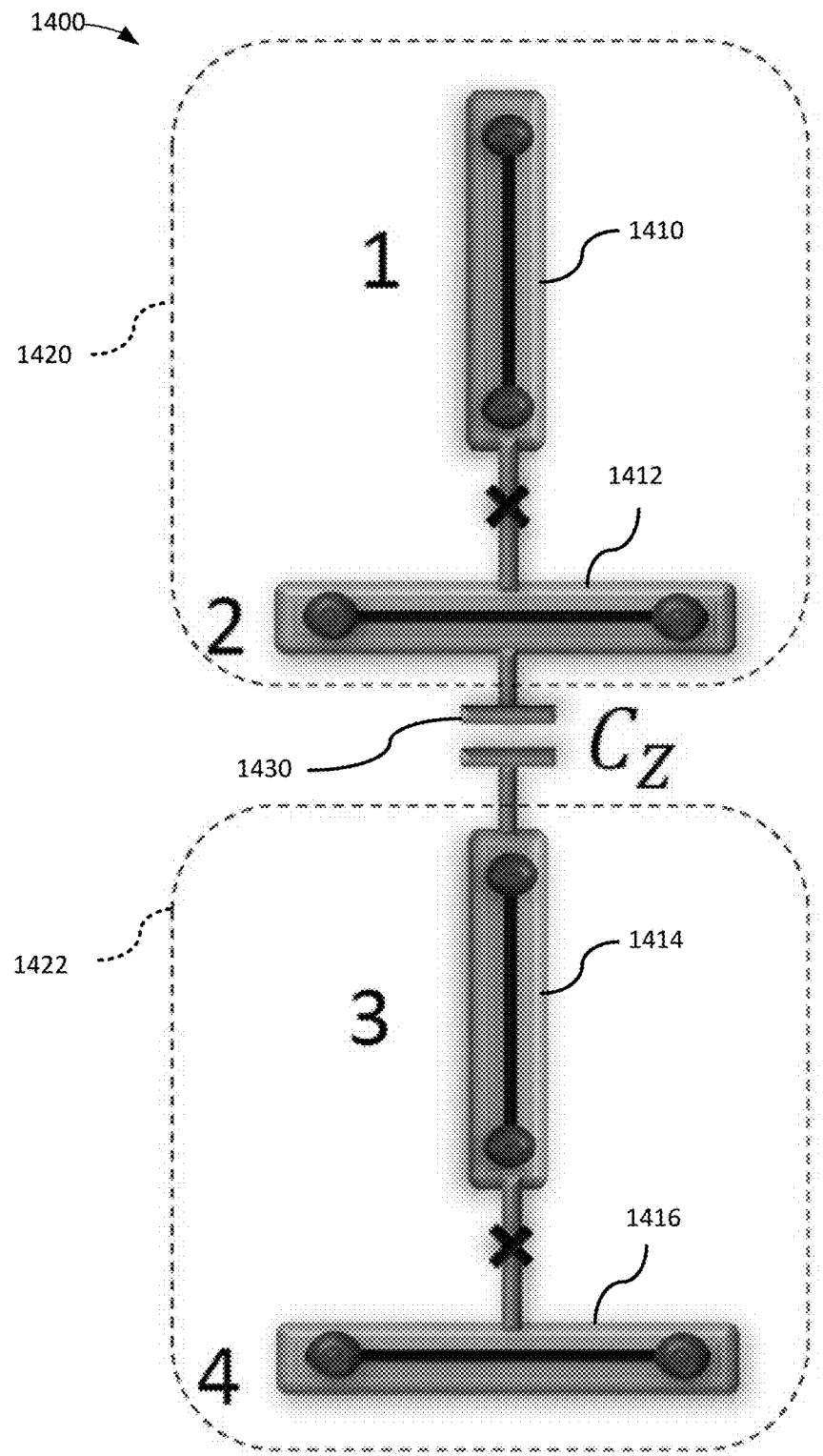
FIG. 14 is a schematic block diagram showing two vertically coupled spins, comprising 4 superconducting islands.

FIG. 14 is a schematic block diagram 1400 showing two vertically coupled spins (shown as heterostructures 1420, 1422), comprising 4 superconducting islands. Each island is labelled 1, . . . , 4 as shown (island 1410 labeled "1", island 1412 labeled "2", island 1414 labeled "3", and island 1416 "4"). $C_z$ is a capacitor 1430 connecting islands 2 and 3. In order to optimize energy scales, a capacitance $C_z'$ connecting islands 1 and 4 is also considered (not explicitly shown).

Now consider a pair of vertically separated effective spins, which will form the unit cell for an exemplary brick lattice Kitaev model. This comprises two pairs of A and B islands, as shown in FIGS. 9 and 11 Here, a capacitive coupling $C_Z$ is considered, as shown in FIG. 14 In this analysis, the islands are labeled 1, . . . , 4 as shown. A capacitance $C_Z'$ is also considered, purely for subsequent numerical optimization of energy scales, between islands 1 and 4, though this is not explicitly shown in FIG. 14 The Hamiltonian for such a two-spin system is given by $$H_{2s} = \sum_{j=1}^{4} H_{BdG}[\Delta_j, \psi_j^\dagger, \psi_j] + \tag{62}$$
$$\frac{1}{2} \sum_{ij} Q_i C_{ij}^{-1} Q_j - E_J(\cos(\varphi_1 - \varphi_2) + \cos(\varphi_3 - \varphi_4)).$$

The charges $Q_j$ (after the unitary transformation discussed in the previous subsection) are $$Q_j = 2e\left(-i\partial_{\varphi_j} + \frac{n_{Mj} - n_{offj}}{2}\right). \tag{63}$$

Note the primed superscripts are omitted in the preceding equation and throughout the rest of the discussion. The capacitance matrix C is now a 4×4 matrix:

$$C = \begin{pmatrix} C_g + C_J + C_Z' & -C_J & 0 & -C_Z' \\ -C_J & C_g + C_J + C_Z & -C_Z & 0 \\ 0 & -C_Z & C_g + C_J + C_Z & -C_J \\ -C_Z' & 0 & -C_J & C_g + C_J + C_Z' \end{pmatrix} \tag{64}$$

It is useful to write $H_{2s}$ as $$H_{2s} = H_{12} + H_{34} + H_{1234}, \tag{65}$$

where $$H_{12} = \sum_{j=1}^{2} H_{BdG}[\Delta_j, \psi_j^\dagger, \psi_j] + \frac{1}{2}\sum_{i,j=1}^{2} Q_i C_{ij}^{-1} Q_j - E_J \cos(\varphi_1 - \varphi_2) \quad (66)$$

$$= \sum_{j=1}^{2} H_{BdG}[\Delta_j, \psi_j^\dagger, \psi_j] - E_J \cos(\varphi_{12,-}) +$$

$$Q_{12,+}^2 \frac{1}{4}(C_{11}^{-1}/2 + C_{22}^{-1}/2 + C_{12}^{-1}) +$$

$$Q_{12,-}^2 \frac{1}{4}(C_{11}^{-1}/2 + C_{22}^{-1}/2 - C_{12}^{-1}) + Q_{12,+} Q_{12,-} \frac{1}{4}(C_{11}^{-1} - C_{22}^{-1})$$

$$H_{34} = \sum_{j=3}^{4} H_{BdG}[\Delta_j, \psi_j^\dagger, \psi_j] + \frac{1}{2}\sum_{i,j=3}^{4} Q_i C_{ij}^{-1} Q_j - E_J \cos(\varphi_3 - \varphi_4)$$

$$= \sum_{j=3}^{4} H_{BdG}[\Delta_j, \psi_j^\dagger, \psi_j] - E_J \cos(\varphi_{34,-}) +$$

$$Q_{34,+}^2 \frac{1}{4}(C_{33}^{-1}/2 + C_{44}^{-1}/2 + C_{34}^{-1}) +$$

$$Q_{34,-}^2 \frac{1}{4}(C_{33}^{-1}/2 + C_{44}^{-1}/2 - C_{34}^{-1}) + Q_{34,+} Q_{34,-} \frac{1}{4}(C_{33}^{-1} - C_{44}^{-1})$$

$$H_{1234} = \sum_{i=1}^{2}\sum_{j=3}^{4} Q_i C_{ij}^{-1} Q_j$$

$$= \sum_{\sigma_1, \sigma_2 = \pm} Q_{12,\sigma_1} Q_{34,\sigma_2} A_{\sigma_1 \sigma_2}$$

where $Q_{ij,\pm} = Q_i \pm Q_j$ and $$A_{\sigma_1 \sigma_2} = \frac{1}{4}(C_{13}^{-1} + \sigma_2 C_{14}^{-1} + \sigma_1 C_{23}^{-1} + C_{24}^{-1}) \quad (67)$$

The terms $H_{12}$ and $H_{14}$ are just the Hamiltonians for a single effective spin, which was analyzed in the previous section. These spins are labeled by $S_{\vec{r}}^z$ and $S_{\vec{r}-\hat{z}}^z$. $\vec{r}$ and $\vec{r}-\hat{z}$ label the two different effective sites, as shown in FIG. 14. $H_{1234}$, then, couples the two effective spins.

Analytical Treatment

Now, $H_{1234}$ is treated perturbatively around the decoupled limit $H_{12}+H_{34}$. This is valid if $$A_{--}, A_{-+}, A_{+-} \ll E_C. \quad (68)$$

To lowest order in perturbation theory, one can replace $H_{1234}$ with the effective Hamiltonian $H_{\text{eff},z}$:

$$\langle S_{\vec{r}}^z, S_{\vec{r}-\hat{z}}^z | H_{\text{eff},z} | S_{\vec{r}}^z, S_{\vec{r}-\hat{z}}^z \rangle = \langle S_{\vec{r}}^z, S_{\vec{r}-\hat{z}}^z | H_{1234} | S_{\vec{r}}^z, S_{\vec{r}-\hat{z}}^z \rangle \quad (69)$$

$$= A_{--} \langle S_{\vec{r}}^z, S_{\vec{r}-\hat{z}}^z | Q_{12,-} Q_{34,-} | S_{\vec{r}}^z, S_{\vec{r}-\hat{z}}^z \rangle$$

$$= A_{--} \langle S_{\vec{r}}^z | Q_{12,-} | S_{\vec{r}}^z \rangle \langle S_{\vec{r}-\hat{z}}^z | Q_{34,-} | S_{\vec{r}-\hat{z}}^z \rangle$$

$$= J_z S_{\vec{r}}^z S_{\vec{r}-\hat{z}}^z,$$

where (see eq. 41)

$$J_z = A_{--}\left(\frac{e}{E_C}\frac{\partial h_z}{\partial n_{\text{off}-}}\right)^2. \quad (70)$$

The second equality in eq. (69) follows because $\langle Q_{12,-}\rangle = \langle Q_{34,-}\rangle = 0$, so only the $\langle Q_{12,-} Q_{34,-}\rangle$ term remains non-zero. It was assumed for simplicity at the two A,B island pairs have the same parameters $E_J$, $E_C$, $n_{\text{off}\pm}$.

Therefore, to first order in perturbation theory, the effect of the vertical capacitances $C_Z$, $C_Z'$, which couple the two spins at $\vec{r}$ and $\vec{r}-\hat{z}$, is to induce an $S_{\vec{r}}^z S_{\vec{r}-\hat{z}}^z$ coupling.

Numerical Solution

Now, a more comprehensive analysis of the two-spin model is provided by employing a numerical solution. In FIGS. 15-22, the results of such a numerical solution are presented for certain choices of parameters.

Figure 15:
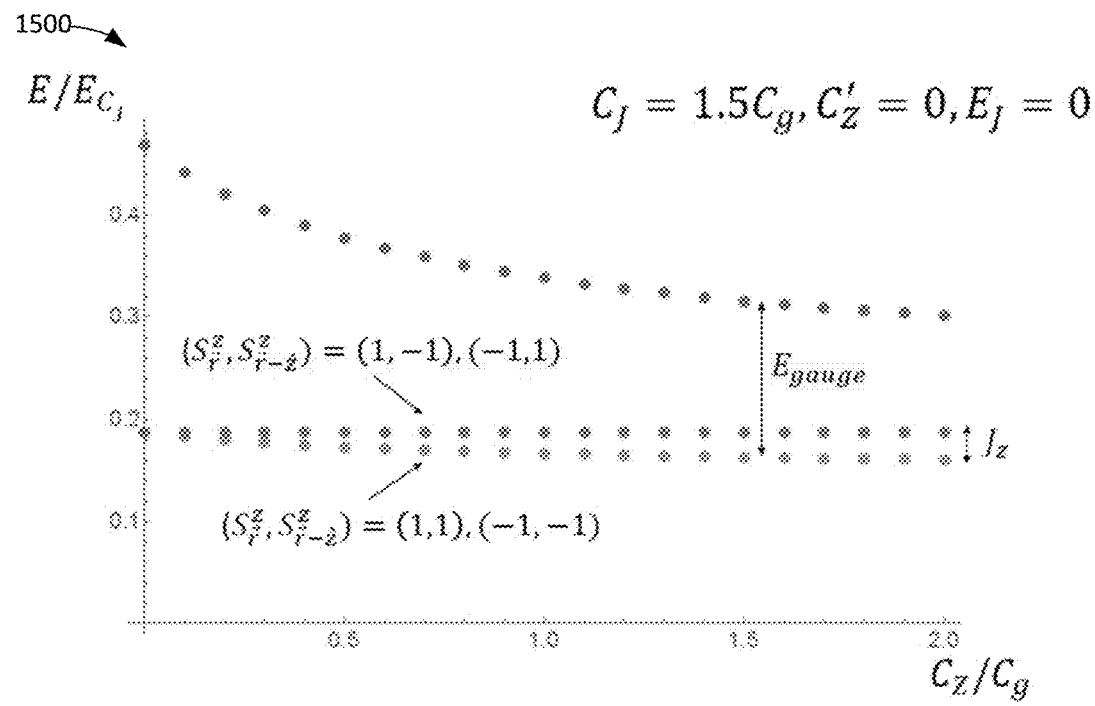
FIGS. 15-22 are graphs showing analyzing the two-spin model of FIG. 14 using a numerical solution across a variety of parameters.

In particular, FIG. 15 is a plot 1500 of energy spectrum of $H_{2s}$ (ignoring the excited state spectrum of $H_{BdG}$), for the lowest energy states, as a function of the capacitance $C_Z$. The other parameters are set to $C_J=1.5 C_g$, $C_Z'=0$, $E_J=0$. The lowest energy curve is doubly degenerate, and is associated with the states $(S_{\vec{r}}^z, S_{\vec{r}-\hat{z}}^z)=(1, 1), (-1, -1)$. The next excited state, whose energy difference with the lowest energy curve defines $J_z$, is also doubly degenerate and associated with the spin states $(S_{\vec{r}}^z, S_{\vec{r}-\hat{z}}^z)=(1, -1), (-1, 1)$. The next excited state lies outside of the effective "spin" subspace, and the gap to these excited states is defined as $E_{gauge}$. The notation $E_{gauge}$ is used because states with energies $E > E_{gauge}$ can violate the "gauge" constraint $\gamma^x \gamma^y \gamma^z \gamma^t = 1$ that is required for the Kitaev spin model.

Figure 16:
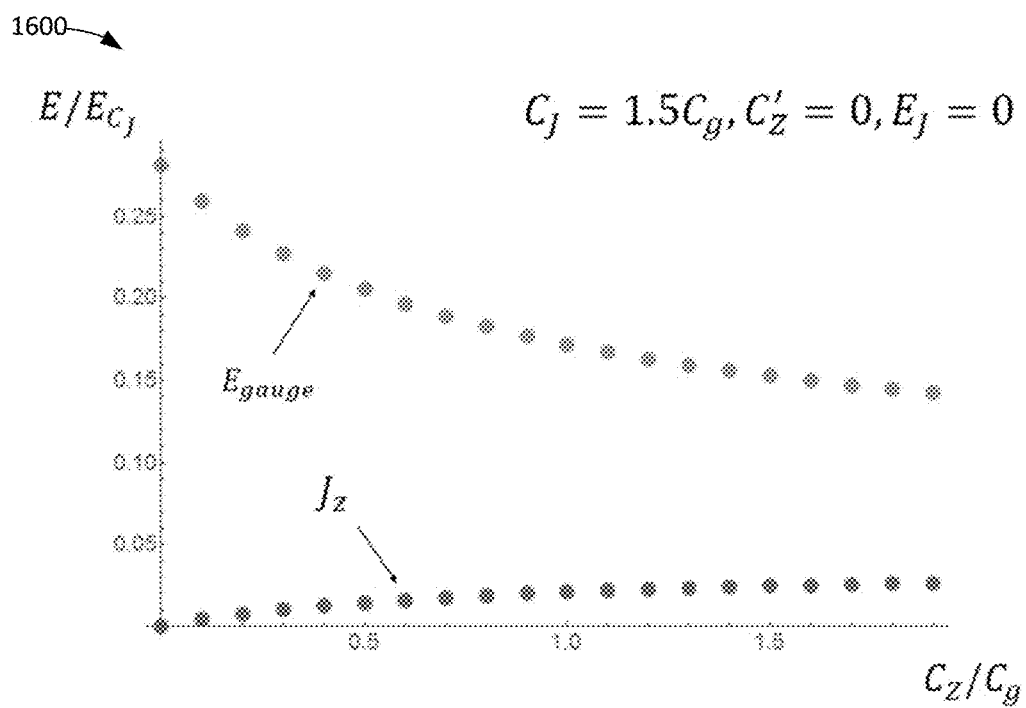
Figure 17:
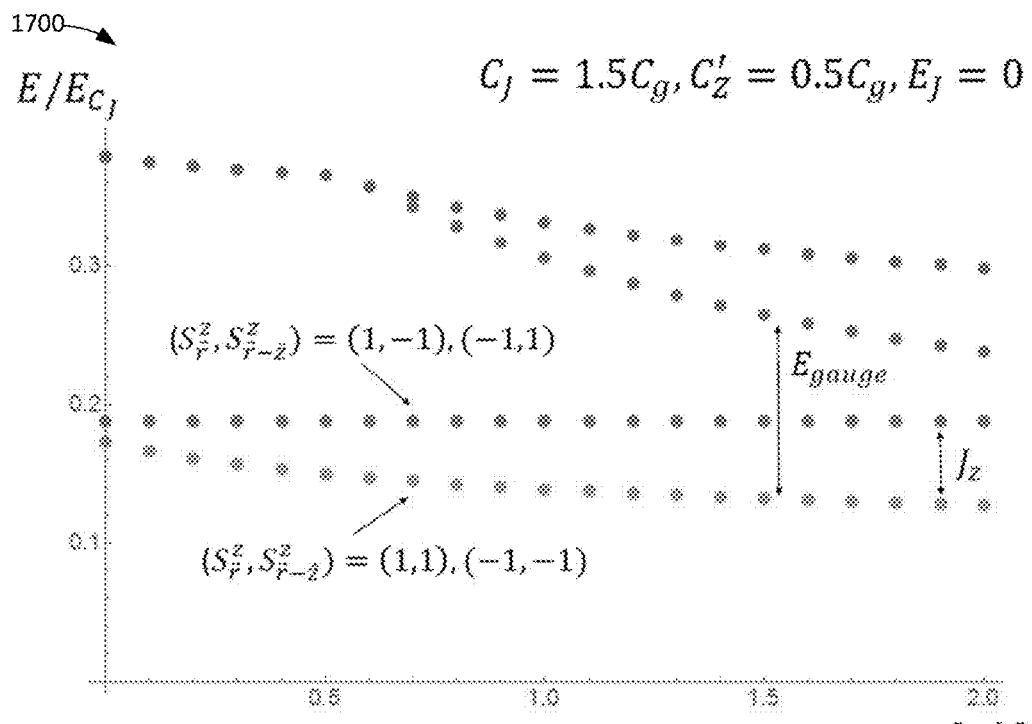
Figure 18:
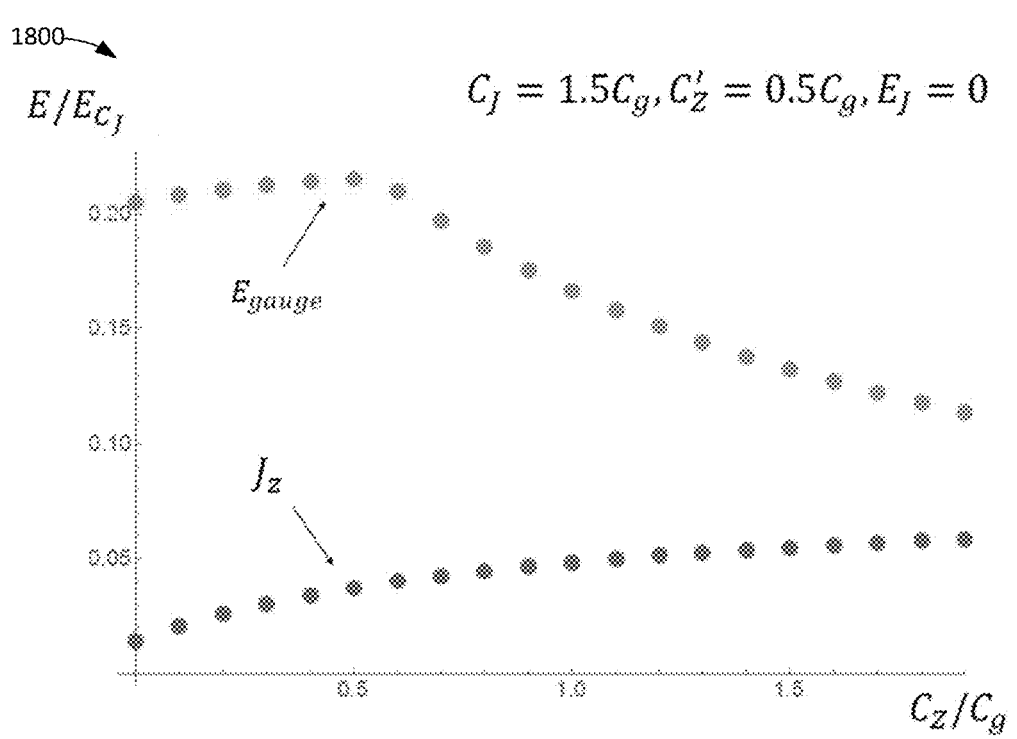
Figure 19:
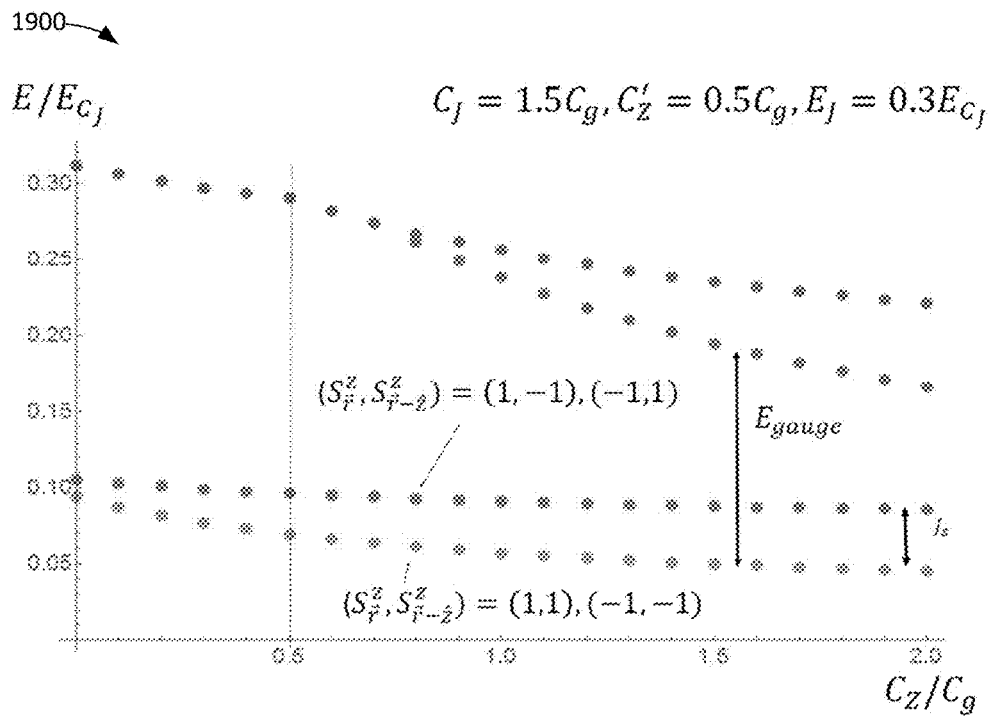
Figure 20:
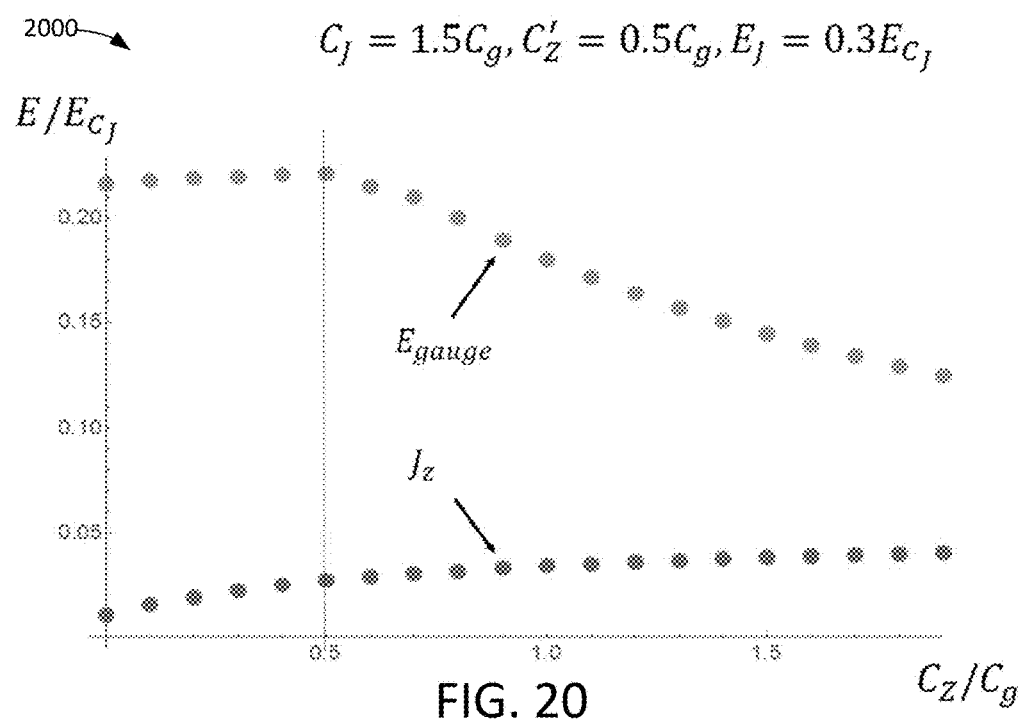
Figure 21:
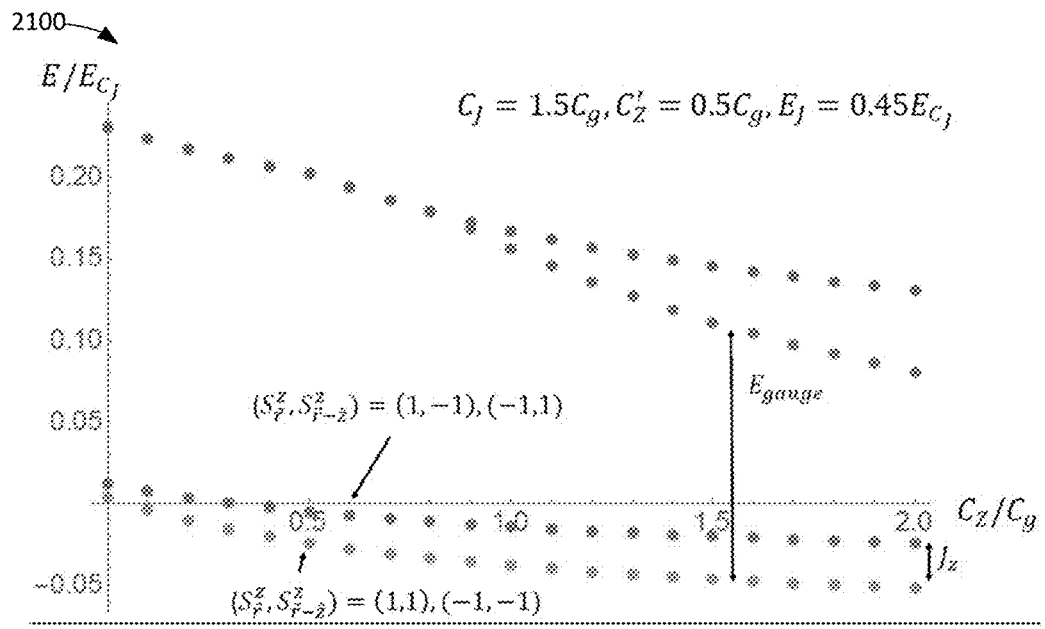
Figure 22:
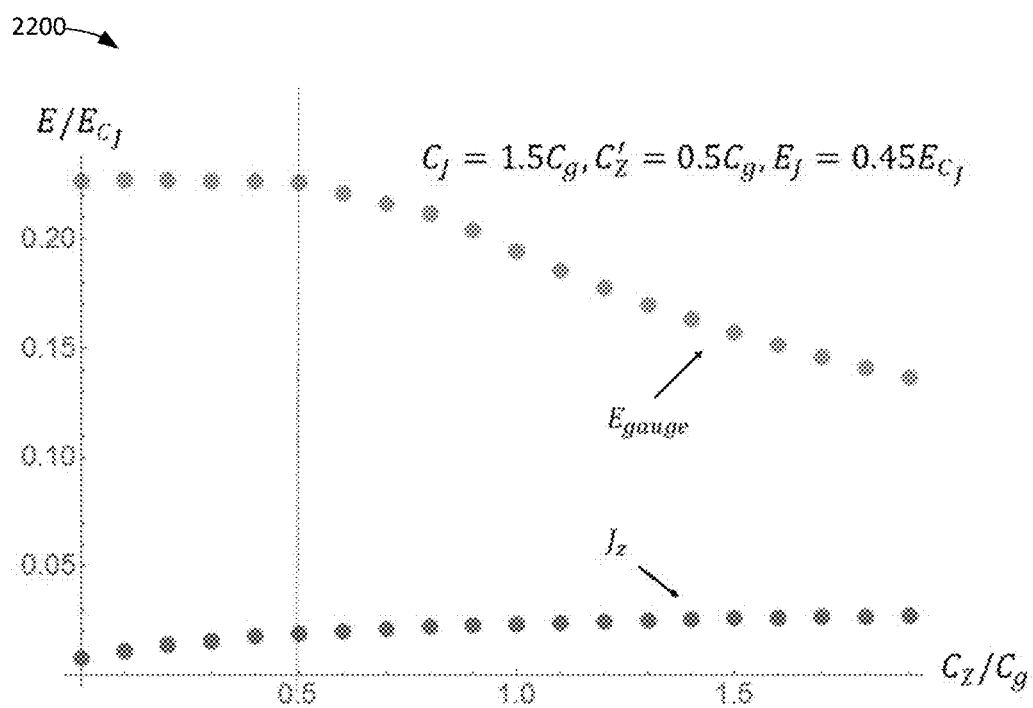

FIG. 16 is a plot 1600 of $J_z$ and $E_{gauge}$. FIGS. 17 and 18 are plots 1700 and 1800 that are the same as in FIGS. 15 and 16 with different parameters as indicated. FIGS. 19 and 20 are plots 1900 and 2000 that are the same as in FIGS. 15 and 16 with different parameters as indicated. FIGS. 21 and 22 are plots 2100 and 2200 that are the same as in FIGS. 15 and 16 with different parameters as indicated. It can be seen that a particularly optimal point occurs when $C_Z=0.5 C_g$.

Horizontally Coupled Unit Cells: Four Spins

Figure 23:
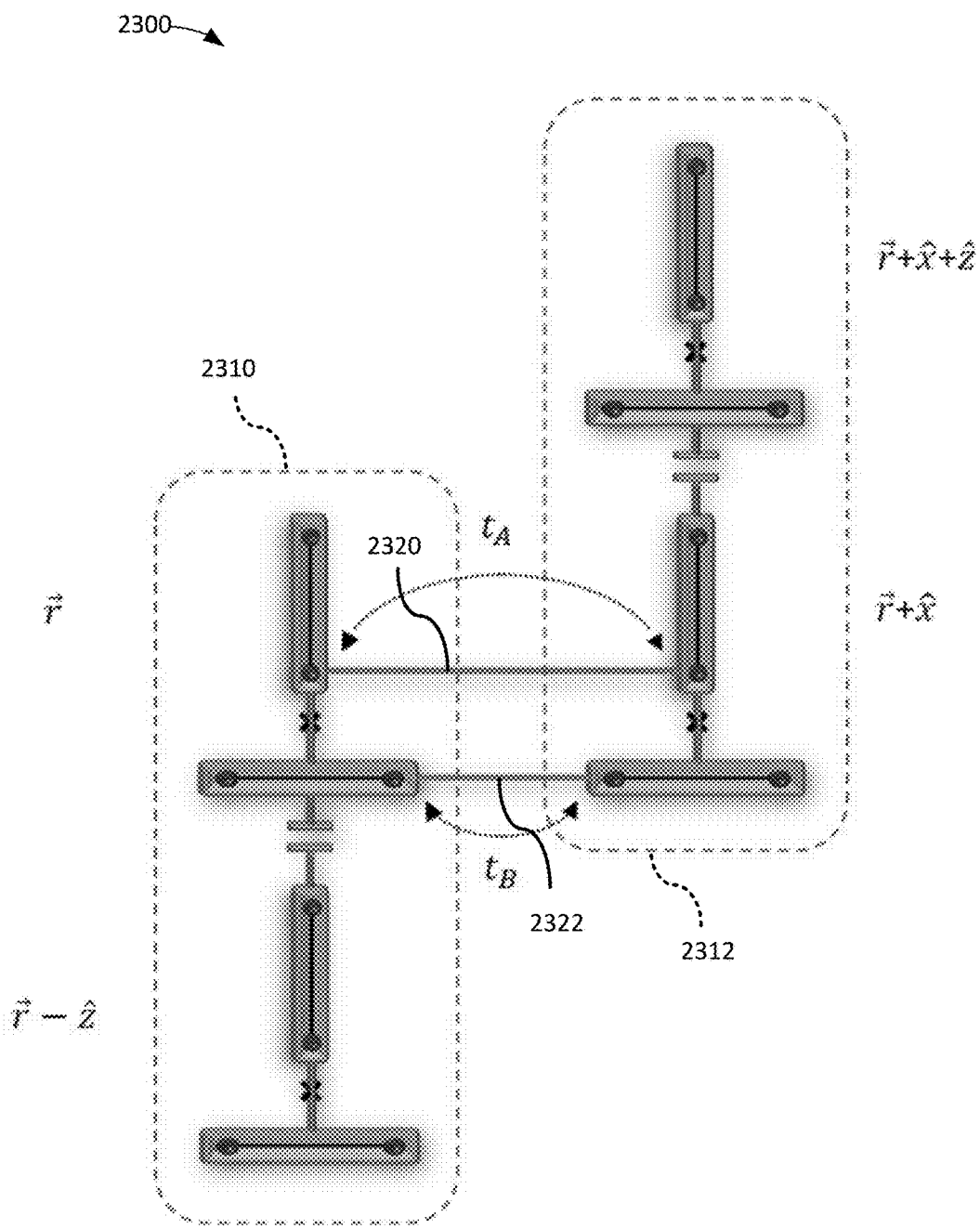
FIG. 23 is a schematic block diagram showing two horizontally coupled unit cells, comprising 4 spins total.

FIG. 23 is a schematic block diagram 2300 showing two horizontally coupled unit cells 2310, 2312, comprising 4 spins total. Dashed lines encircle each unit cell. The locations of the spins are $\vec{r}$, $\vec{r}-\hat{z}$, $\vec{r}+\hat{x}$, $\vec{r}+\hat{x}+\hat{z}$. $t_A$ and $t_B$ indicate electron tunneling, as shown.

FIG. 23 illustrates two horizontally separated unit cells connected with semiconductor wires 2320, 2322 as shown, which allows electrons to tunnel between the end points of the wires, with tunneling amplitudes $t_A$ and $t_B$, as shown. The effective Hamiltonian for this system is now $$H_{4s} = \sum_I H_{2s,I} + H_{tun}, \quad (71)$$

where $H_{2s,I}$ is the Hamiltonian for the Ith unit cell, which is given by $H_{2s}$ above. $H_{tun}$ contains the horizontal couplings, as explained below.

Here, it is shown that in a suitable parameter regime, at low energies the effective Hamiltonian can be described by the following spin model:

$$H_{eff,4s} = J_z S_{\vec{r}}^z S_{\vec{r}-\hat{z}}^z + J_z S_{\vec{r}+\hat{x}}^z S_{\vec{r}+\hat{x}+\hat{z}}^z + J_{yx} S_{\vec{r}}^y S_{\vec{r}+\hat{x}}^x, \quad (72)$$

with corrections to this effective Hamiltonian being much smaller in energy scale than $J_z$, $J_{yx}$.

The electron tunneling terms $t_A$ and $t_B$ are considered, as shown in FIG. 23

This gives rise to an effective tunneling Hamiltonian (written in the basis before the unitary transformation U):

$$H_{tun} = [t_A \psi_{t,\vec{r}}^\dagger \psi_{t,\vec{r}+\hat{x}} + H.c.] + [t_B \psi_{y,\vec{r}}^\dagger \psi_{x,\vec{r}+\hat{x}} + H.c.] \quad (73)$$

Here, $\vec{r}$ labels the effective spins, each of which consists of an A and a B island. After the unitary transformation by U, $$H_{tun}' = U^\dagger H_{tun} U = [t_A (\psi_{t,\vec{r}}')^\dagger \psi_{t,\vec{r}+\hat{x}}' + H.c.] + [t_B (\psi_{y,\vec{r}}')^\dagger \psi_{x,\vec{r}+\hat{x}}' + H.c.]. \quad (74)$$

where $$\psi'_{\alpha,\vec{r}} = U^\dagger \psi_{\alpha,\vec{r}} U = e^{i\varphi_j \vec{r} (1-F_{pj,\vec{r}})/2} \psi_{\alpha,\vec{r}},$$

$$(\psi_{\alpha,\vec{r}}')^\dagger = \psi_{\alpha,\vec{r}}^\dagger e^{-i\varphi_j \vec{r}(1-F_{pj,\vec{r}})/2} \quad (75)$$

where j=A, B depending on whether α=z, t or x, y. Therefore, the tunneling Hamiltonian is, after the unitary transformation:

$$H_{tun}' = [t_A \psi_{t,\vec{r}}^\dagger e^{-i(1-F_{pA,\vec{r}})\varphi_A \vec{r}/2 + i(1-F_{pA,\vec{r}+\hat{x}})\varphi_A \vec{r}+\hat{x}/2} \psi_{t,\vec{r}+\hat{x}} + H.c.] + [t_B \psi_{y,\vec{r}}^\dagger e^{-i(1-F_{pB,\vec{r}})\varphi_B \vec{r}/2 + i(1-F_{pB,\vec{r}+\hat{x}})\varphi_B \vec{r}+\hat{x}/2} \psi_{x,\vec{r}+\hat{x}} + H.c.], \quad (76)$$

Here, the limit is considered where $$t_A, t_B \ll \Delta, \quad (77)$$

where Δ is the proximity-induced superconducting gap in the semiconducting nanowire. In this limit, the electron operator ψ can be replaced by $$\psi_{\alpha,\vec{r}} = u_{\alpha,\vec{r}} \gamma_{\vec{r}}^\alpha, \quad (78)$$

where $u_{\alpha,\vec{r}}$ are complex numbers that depend sensitively on microscopic details. Also defined are:

$$\tilde{t}_A = t_A (u_{\vec{r}}^t)^* u_{\vec{r}+\hat{x}}^t,$$

$$\tilde{t}_B = t_B (u_{\vec{r}}^y)^* u_{\vec{r}+\hat{x}}^x, \quad (79)$$

Therefore, one can write $H_{tun}'$ as $$H_{tun}' = \Lambda_{\vec{r}}, \quad (80)$$

$$\Lambda_{\vec{r}} = \left[ \tilde{t}_A \gamma_{\vec{r}}^t e^{-i(1-F_{p,A,\vec{r}})\varphi_{A\vec{r}}/2 + i(1-F_{p,A,\vec{r}+\hat{x}})\varphi_{A\vec{r}+\hat{x}}/2} \gamma_{\vec{r}+\hat{x}}^t + \tilde{t}_B \gamma_{\vec{r}}^y e^{-i(1-F_{p,B,\vec{r}})\varphi_{B\vec{r}}/2 + i(1-F_{p,B,\vec{r}+\hat{x}})\varphi_{B\vec{r}+\hat{x}}/2} \gamma_{\vec{r}+\hat{x}}^x + H.c. \right]$$

$$= \left[ \tilde{t}_A e^{-i(1+F_{p,A,\vec{r}})\varphi_{A\vec{r}}/2 + i(1-F_{p,A,\vec{r}+\hat{x}})\varphi_{A\vec{r}+\hat{x}}/2} \gamma_{\vec{r}}^t \gamma_{\vec{r}+\hat{x}}^t + \tilde{t}_B e^{-i(1+F_{p,B,\vec{r}})\varphi_{B\vec{r}}/2 + i(1-F_{p,B,\vec{r}+\hat{x}})\varphi_{B\vec{r}+\hat{x}}/2} \gamma_{\vec{r}}^y \gamma_{\vec{r}+\hat{x}}^x + H.c. \right]$$

These single electron tunneling processes violate the charging energy constraint and are therefore suppressed in the limit $$\tilde{t}_j \ll E_{gauge}, \quad (81)$$

where $E_{gauge}$ is the energy cost to adding a single electron to the two-spin unit cell. Perturbing in $\tilde{t}_j/E_{gauge}$, one can obtain an effective Hamiltonian:

$$H_{eff} = -\frac{1}{E_{gauge}} \Lambda_{\vec{r}}^\dagger \Lambda_{\vec{r}} + O(\tilde{t}^4/E_{gauge}^3) \quad (82)$$

Expanding, one can obtain, up to a constant term, $$H_{t,eff} = -\frac{1}{E_{gauge}} (h_{t;1} + h_{t;2} + h_{t;3}) \quad (83)$$

$$h_{t;1} = -\tilde{t}_A^2 e^{-i(\varphi_{A,\vec{r}} - \varphi_{A,\vec{r}+\hat{x}})} - \tilde{t}_B^2 e^{-i(\varphi_{B,\vec{r}} - \varphi_{B,\vec{r}+\hat{x}})} + H.c. \quad (84)$$

$$h_{t;2} = 2\tilde{t}_A \tilde{t}_B e^{-i(1+F_{p,A,\vec{r}})\varphi_{A\vec{r}}/2 + i(1-F_{p,A,\vec{r}+\hat{x}})\varphi_{A\vec{r}+\hat{x}}/2} \quad (85)$$

$$e^{-i(1+F_{p,B,\vec{r}})\varphi_{B\vec{r}}/2 + i(1-F_{p,B,\vec{r}+\hat{x}})\varphi_{B\vec{r}+\hat{x}}/2}$$

$$\gamma_{\vec{r}}^t \gamma_{\vec{r}+\hat{x}}^y \gamma_{\vec{r}}^x \gamma_{\vec{r}+\hat{x}}^x + H.c.$$

$$= 2\tilde{t}_A \tilde{t}_B e^{-i\varphi_{+,\vec{r}}/2 - i(F_{p+,\vec{r}\varphi+,\vec{r}} + F_{p-,\vec{r}\varphi-,\vec{r}})/4}$$

$$e^{i\varphi_{+,\vec{r}+\hat{x}}/2 - i(F_{p+,\vec{r}\varphi+,\vec{r}+\hat{x}} + F_{p-,\vec{r}\varphi-,\vec{r}+\hat{x}})/4}$$

$$\gamma_{\vec{r}}^t \gamma_{\vec{r}+\hat{x}}^y \gamma_{\vec{r}}^x \gamma_{\vec{r}+\hat{x}}^x + H.c.$$

$$h_{t;3} = 2\tilde{t}_B \tilde{t}_A^* e^{-i(1+F_{p,A,\vec{r}})\varphi_{A\vec{r}}/2 + i(1-F_{p,A,\vec{r}+\hat{x}})\varphi_{A\vec{r}+\hat{x}}/2} \quad (86)$$

$$e^{i(1-F_{p,B,\vec{r}})\varphi_{B\vec{r}}/2 - i(1+F_{p,B,\vec{r}+\hat{x}})\varphi_{B\vec{r}+\hat{x}}/2}$$

$$\gamma_{\vec{r}}^t \gamma_{\vec{r}+\hat{x}}^x \gamma_{\vec{r}+\hat{x}}^y + H.c.$$

$$= 2\tilde{t}_B \tilde{t}_A^* e^{-i\varphi_{-,\vec{r}}/2 - i(F_{p+,\vec{r}\varphi+,\vec{r}} + F_{p-,\vec{r}\varphi-,\vec{r}})/4}$$

$$e^{i\varphi_{-,\vec{r}+\hat{x}}/2 - i(F_{p+,\vec{r}+\hat{x}\varphi+,\vec{r}+\hat{x}} + F_{p-,\vec{r}+\hat{x}\varphi-,\vec{r}+\hat{x}})/4}$$

$$\gamma_{\vec{r}}^t \gamma_{\vec{r}+\hat{x}}^y \gamma_{\vec{r}+\hat{x}}^x \gamma_{\vec{r}}^y + H.c.$$

Note that in the limit within the analysis is working, $$\frac{2|\tilde{t}_A \tilde{t}_B|}{E_{gauge}}, \frac{2|\tilde{t}_A|^2}{E_{gauge}}, \frac{2|\tilde{t}_B|^2}{E_{gauge}} \ll E_{gauge} \quad (87)$$

Thus, due to the charging energy on each site $\vec{r}$, $\varphi_+$ is highly fluctuating independently on each site. Treating (83) perturbatively around the decoupled limit $H_{2s}$, one can see that the following can be set:

$$F_{p+,\vec{r}} = F_{pA,\vec{r}} + F_{pB,\vec{r}} = 0, \quad (88)$$

$$F_{p-,\vec{r}} = 2F_{pA,\vec{r}} = -2F_{pB,\vec{r}} = 2S_{\vec{r}}^z. \quad (89)$$

Moreover, one can replace $h_{t;2}$, $h_{t;1}$, $h_{t;3}$ by their expectation values in the ground state manifold of $H_{2s}$:

$$\langle m|h_{t;1,eff}|n\rangle = \langle m|h_{t;1}|n\rangle = 0 \quad (90)$$

$$\langle m|h_{t;2,eff}|n\rangle = \langle m|h_{t;2}|n\rangle = 2t_A t_B u_{t,\vec{r}}^* u_{t,\vec{r}+\hat{x}} u_{y,\vec{r}}^* u_{x,\vec{r}+\hat{x}}$$

$$\langle m|e^{-i\varphi+,\vec{r}/2 - iS_{\vec{r}}^z \varphi-,\vec{r}} e^{i\varphi+,\vec{r}+\hat{x}/2 - iS_{\vec{r}+\hat{x}}^z \varphi-,\vec{r}+\hat{x}} \gamma_{\vec{r}}^t \gamma_{\vec{r}+\hat{x}}^t \gamma_{\vec{r}}^y \gamma_{\vec{r}+\hat{x}}^x + H.c.|n\rangle = 0. \quad (91)$$

Here, the following is defined:

$$\tilde{t}_A \tilde{t}_B^* = |\tilde{t}_A \tilde{t}_B| e^{i\theta} \quad (92)$$

Note that the phase θ depends on two quantities: the magnetic flux normal to the system, and the angle between the Zeeman field and the Rashba spin-orbit field. These can both be tuned, and therefore θ can be viewed as a tunable quantity.

$$\langle m|h_{t;3,\text{eff}}|n\rangle = \langle m|h_{t;3}|n\rangle \tag{93}$$

$$\left\langle m \left| 2\tilde{t}_A \tilde{t}_B^* e^{-i\varphi_{-,\vec{r}}} \right/2^{-iS^z_{\vec{r}}\varphi_{-,\vec{r}}}\right/2 \, e^{i\varphi_{-,\vec{r}+\hat{x}}}/2^{-iS^z_{\vec{r}+\hat{x}}\varphi_{-,\vec{r}+\hat{x}}}/2 \right.$$

$$\left. \gamma^t_{\vec{r}} \gamma^t_{\vec{r}+\hat{x}} \gamma^x_{\vec{r}+\hat{x}} \gamma^y_{\vec{r}} + H.c. \right| n \right\rangle$$

$$= \left\langle m \left| \frac{\tilde{t}_A \tilde{t}_B^*}{2} \left(1 + e^{-i\varphi_{-,\vec{r}}} + \left(e^{-i\varphi_{-,\vec{r}}} - 1\right)S^z_{\vec{r}}\right) \right.\right.$$

$$\left.\left. \left(\left(e^{i\varphi_{-,\vec{r}+\hat{x}}} + 1\right) + \left(1 - e^{i\varphi_{-,\vec{r}+\hat{x}}}\right)S^z_{\vec{r}+\hat{x}}\right) \times \right.\right.$$

$$\left.\left. \gamma^t_{\vec{r}} \gamma^t_{\vec{r}+\hat{x}} \gamma^x_{\vec{r}+\hat{x}} \gamma^y_{\vec{r}} + H.c. \right| n \right\rangle.$$

The eigenstates of interest can be labelled as $$|S^z_{\vec{r}-\hat{z}} S^z_{\vec{r}} S^z_{\vec{r}+\hat{x}} S^z_{\vec{r}+\hat{x}+\hat{z}}\rangle. \tag{94}$$

Thus, the following matrix elements are of interest:

$$\left\langle S^z_{\vec{r}-\hat{z}} S^z_{\vec{r}} S^z_{\vec{r}+\hat{x}} S^z_{\vec{r}+\hat{x}+\hat{z}} |h_{t;3}|(S^z_{\vec{r}-\hat{z}})'(S^z_{\vec{r}})'(S^z_{\vec{r}+\hat{x}})'(S^z_{\vec{r}+\hat{x}+\hat{z}})' \right\rangle. \tag{95}$$

one can see that the only non-zero matrix elements are those for which $(S^z_{\vec{r}-\hat{z}})' = S^z_{\vec{r}-\hat{z}}$, $(S^z_{\vec{r}})' = -S^z_{\vec{r}}$, $(S^z_{\vec{r}+\hat{x}})' = -S^z_{\vec{r}+\hat{x}}$, and $(S^z_{\vec{r}+\hat{x}+\hat{z}})' = S^z_{\vec{r}+\hat{x}+\hat{z}}$. Thus, one can compute $$\left\langle S^z_{\vec{r}-\hat{z}} S^z_{\vec{r}} S^z_{\vec{r}+\hat{x}} S^z_{\vec{r}+\hat{x}+\hat{z}} |h_{t;3}| S^z_{\vec{r}-\hat{z}}, -S^z_{\vec{r}}, -S^z_{\vec{r}+\hat{x}}, S^z_{\vec{r}+\hat{x}+\hat{z}} \right\rangle. \tag{96}$$

In terms of these matrix elements, one can then write the effective Hamiltonian:

$$h_{t;3,\text{eff}} = \sum_{\{S^z\}} \langle S^z_{\vec{r}-\hat{z}} S^z_{\vec{r}} S^z_{\vec{r}+\hat{x}} S^z_{\vec{r}+\hat{x}+\hat{z}} |h_{t;3}| S^z_{\vec{r}-\hat{z}}, -S^z_{\vec{r}}, -S^z_{\vec{r}+\hat{x}}, S^z_{\vec{r}+\hat{x}+\hat{z}}\rangle \times$$

$$|S^z_{\vec{r}-\hat{z}} S^z_{\vec{r}} S^z_{\vec{r}+\hat{x}} S^z_{\vec{r}+\hat{x}+\hat{z}}\rangle\langle S^z_{\vec{r}-\hat{z}}, -S^z_{\vec{r}}, -S^z_{\vec{r}+\hat{x}}, S^z_{\vec{r}+\hat{x}+\hat{z}}|$$

$$= \sum_{s_1,s_2,s_3,s_4=\pm 1} h_{t;3}^{s_1,s_2,s_3,s_4} \frac{(1+s_1 S^z_{\vec{r}-\hat{z}})}{2} \frac{S^x_{\vec{r}} + s_2 i S^y_{\vec{r}}}{2} \frac{S^x_{\vec{r}+\hat{x}} + s_3 i S^y_{\vec{r}+\hat{x}}}{2} \frac{(1+s_4 S^z_{\vec{r}+\hat{x}+\hat{z}})}{2}$$

$$= \sum_{a,d=1,z \atop b,c=x,y} c_{abcd} S^a_{\vec{r}-\hat{z}} S^b_{\vec{r}} S^c_{\vec{r}+\hat{x}} S^d_{\vec{r}+\hat{x}+\hat{z}},$$

where $$c_{zxx1} = \frac{1}{16}\sum_s h_{t;3}^{s_1,s_2,s_3,s_4} s_1, \qquad c_{1xxz} = \frac{1}{16}\sum_s h_{t;3}^{s_1,s_2,s_3,s_4} s_4$$

$$c_{zxy1} = \frac{1}{16}\sum_s h_{t;3}^{s_1,s_2,s_3,s_4} is_1 s_3, \qquad c_{1xyz} = \frac{1}{16}\sum_s h_{t;3}^{s_1,s_2,s_3,s_4} is_4 s_3$$

$$c_{zyx1} = \frac{1}{16}\sum_s h_{t;3}^{s_1,s_2,s_3,s_4} is_1 s_2, \qquad c_{1yxz} = \frac{1}{16}\sum_s h_{t;3}^{s_1,s_2,s_3,s_4} is_4 s_2$$

$$c_{zyy1} = -\frac{1}{16}\sum_s h_{t;3}^{s_1,s_2,s_3,s_4} s_1 s_2 s_3, \qquad c_{1yyz} = -\frac{1}{16}\sum_s h_{t;3}^{s_1,s_2,s_3,s_4} s_4 s_2 s_3$$

$$(98)$$

$$c_{zxxz} = \frac{1}{16}\sum_s h_{t;3}^{s_1,s_2,s_3,s_4} s_1 s_4, \qquad c_{1xx1} = \frac{1}{16}\sum_s h_{t;3}^{s_1,s_2,s_3,s_4}$$

$$c_{zxyz} = \frac{1}{16}\sum_s h_{t;3}^{s_1,s_2,s_3,s_4} is_1 s_3 s_4, \qquad c_{1xy1} = \frac{1}{16}\sum_s h_{t;3}^{s_1,s_2,s_3,s_4} is_3$$

$$c_{zyxz} = \frac{1}{16}\sum_s h_{t;3}^{s_1,s_2,s_3,s_4} is_1 s_2 s_4, \qquad c_{1yx1} = \frac{1}{16}\sum_s h_{t;3}^{s_1,s_2,s_3,s_4} is_2$$

$$c_{zyyz} = -\frac{1}{16}\sum_s h_{t;3}^{s_1,s_2,s_3,s_4} s_1 s_2 s_3 s_4, \qquad c_{1yy1} = -\frac{1}{16}\sum_s h_{t;3}^{s_1,s_2,s_3,s_4} s_2 s_3$$

$$(99)$$

Now, simplifying $h_{t;3}^{s_1,s_2,s_3,s_4}$:

$$h_{t;3}^{s_1,s_2,s_3,s_4} = i\tilde{t}_A \tilde{t}_B^* |(\langle s_1,s_2,s_3,s_4|i\text{Im}(e^{i\theta}(e^{-i\varphi_{-,\vec{r}}}-1)(e^{i\varphi_{-,\vec{r}+\hat{x}}}+1))|s_1,\tilde{s}_2,\tilde{s}_3,s_4\rangle + s_2\langle s_1,s_2,s_3,s_4|\text{Re}(e^{i\theta}(e^{-i\varphi_{-,\vec{r}}}+1)(e^{i\varphi_{-,\vec{r}+\hat{x}}}+1))|s_1,\tilde{s}_2,\tilde{s}_3,s_4\rangle + s_3\langle s_1,s_2,s_3,s_4|\text{Re}(e^{i\theta}(e^{-i\varphi_{-,\vec{r}}}-1)(-e^{i\varphi_{-,\vec{r}+\hat{x}}}+1))|s_1,\tilde{s}_2,\tilde{s}_3,s_4\rangle + s_2 s_3\langle s_1,s_2,s_3,s_4|i\text{Im}(e^{i\theta}(e^{-i\varphi_{-,\vec{r}}}+1)(1-e^{i\varphi_{-,\vec{r}+\hat{x}}}))|s_1,\tilde{s}_2,\tilde{s}_3,s_4\rangle) \tag{100}$$

Here, the following has been defined $$|s_1,s_2,s_3,s_4\rangle = |S^z_{\vec{r}-\hat{z}}=s_1, S^z_{\vec{r}}=s_2, S^z_{\vec{r}+\hat{x}}=s_3, S^z_{\vec{r}+\hat{x}+\hat{z}}=s_4\rangle. \tag{101}$$

The states with the tildes over the s's indicate that the phase mode has the opposite wave function as compared with the spin degree of freedom, as described for the single spin case in Eq. (35). Now define $$A_{s_1,s_2,s_3,s_4}^{\sigma_1,\sigma_2} = \langle s_1,s_2,s_3,s_4|\text{Re}(e^{i\theta}(e^{-i\varphi_{-,\vec{r}}}+\sigma_1)(\sigma_2 e^{i\varphi_{-,\vec{r}+\hat{x}}}+1))|s_1,\tilde{s}_2,\tilde{s}_3,s_4\rangle,$$

$$B_{s_1,s_2,s_3,s_4}^{\sigma_1,\sigma_2} = \langle s_1,s_2,s_3,s_4|i\text{Im}(e^{i\theta}(e^{-i\varphi_{-,\vec{r}}}+\sigma_1)(\sigma_2 e^{i\varphi_{-,\vec{r}+\hat{x}}}+1))|s_1,\tilde{s}_2,\tilde{s}_3,s_4\rangle. \tag{102}$$

In terms of A one has $$h_{t;3}^{s_1,s_2,s_3,s_4} = i\tilde{t}_A \tilde{t}_B^* (B_{s_1,s_2,s_3,s_4}^{-1,1} + s_2 A_{s_1,s_2,s_3,s_4}^{1,1} + s_3 A_{s_1,s_2,s_3,s_4}^{-1,-1} + s_2 s_3 B_{s_1,s_2,s_3,s_4}^{1,-1}) \tag{103}$$

It can be seen that the following expectation values can be computed for the two-spin system:

$$v_{s_1,s_2;\pm} = \langle S_{\vec{r}-\hat{z}}^z = s_1, S_{\vec{r}}^z = s_2 | e^{\pm i\varphi \vec{r}} | S_{\vec{r}-\hat{z}}^z = s_1, S_{\vec{r}}^z = \tilde{s}_2 \rangle$$

$$w_{s_1,s_2;\pm} = \langle S_{\vec{r}-\hat{z}}^z = s_1, S_{\vec{r}}^z = s_2 | e^{\pm i\varphi \vec{r}-\hat{z}} | S_{\vec{r}-\hat{z}}^z = \tilde{s}_1, S_{\vec{r}}^z = s_2 \rangle,$$

$$g_{1,s_1,s_2} = \angle S_{\vec{r}-\hat{z}}^z = s_1, S_{\vec{r}}^z = s_2 | S_{\vec{r}-\hat{z}}^z = s_1, \widetilde{S_{\vec{r}}^z = s_2} \rangle$$

$$g_{2,s_1,s_2} = \angle S_{\vec{r}-\hat{z}}^z = s_1, S_{\vec{r}}^z = s_2 | \widetilde{S_{\vec{r}-\hat{z}}^z = s_1}, S_{\vec{r}}^z = s_2) \quad (104)$$

In terms of these expectation values, $$A_{s_1,s_2,s_3,s_4}^{\sigma_1,\sigma_2} = \tfrac{1}{2} e^{i\theta}(v_{s_1s_2,-} + \sigma_1 g_{1,s_1,s_2})(\sigma_2 w_{s_3s_4,-} + g_{2,s_3,s_4}) + \tfrac{1}{2} e^{-i\theta}(v_{s_1s_2,+} + \sigma_1 g_{1,s_1,s_2})(\sigma_2 w_{s_3s_4,+} + g_{2,s_3,s_4})$$

$$B_{s_1,s_2,s_3,s_4}^{\sigma_1,\sigma_2} = \tfrac{1}{2} e^{i\theta}(v_{s_1s_2,-} + \sigma_1 g_{1,s_1,s_2})(\sigma_2 w_{s_4s_3,-} + g_{2,s_3,s_4}) - \tfrac{1}{2} e^{-i\theta}(v_{s_1s_2,+} + \sigma_1 g_{1,s_1,s_2})(\sigma_2 w_{s_4s_3,+} + g_{2,s_3,s_4}) \quad (105)$$

Figure 24:
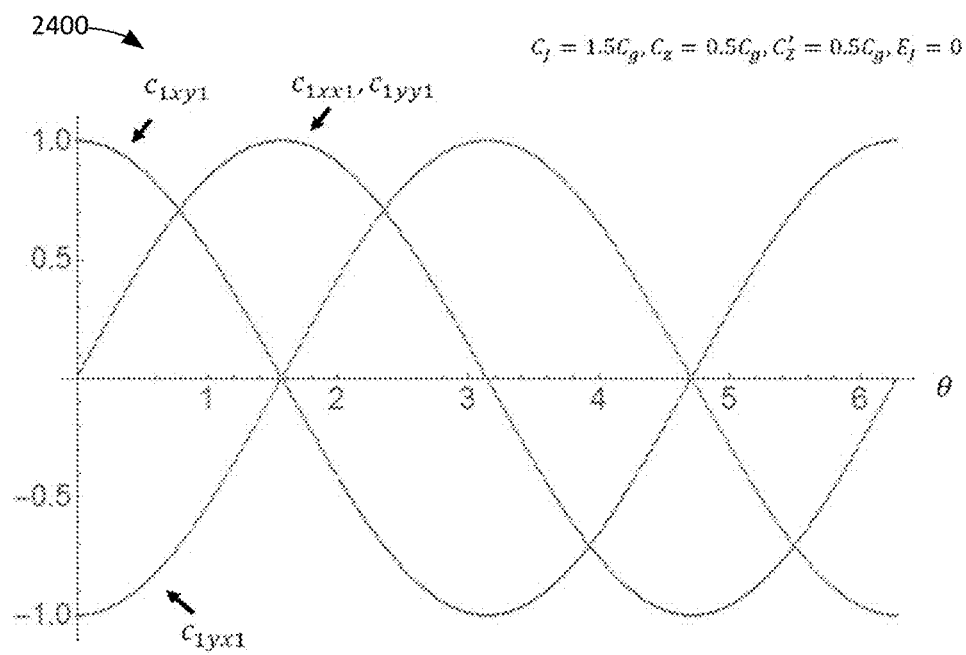
FIGS. 24-26 are plots of 16 parameters $c_{abcd}$ available in the configuration of FIG. 23 as a function of θ for various parameter settings.
Figure 25:
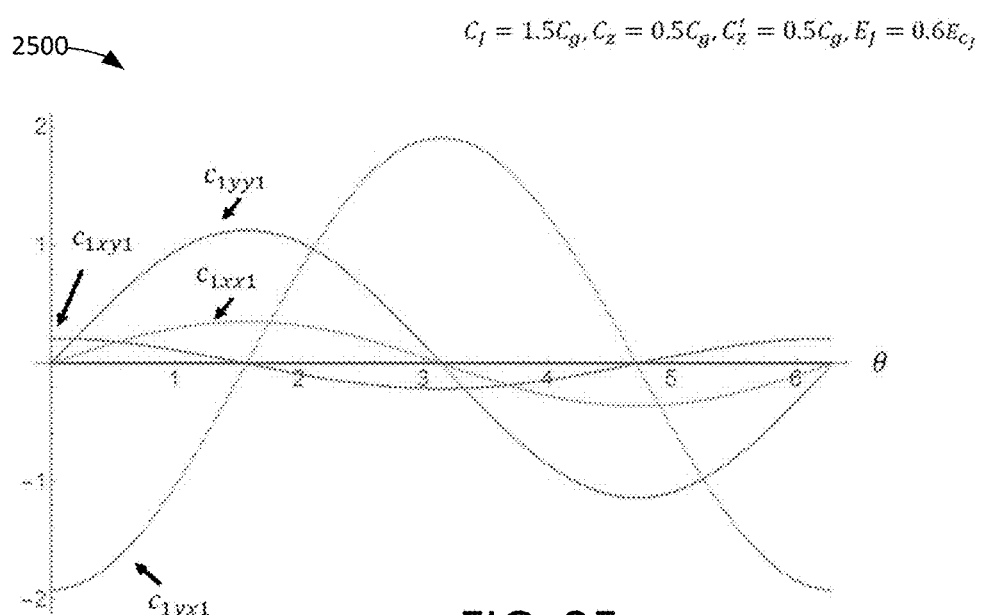
Figure 26:
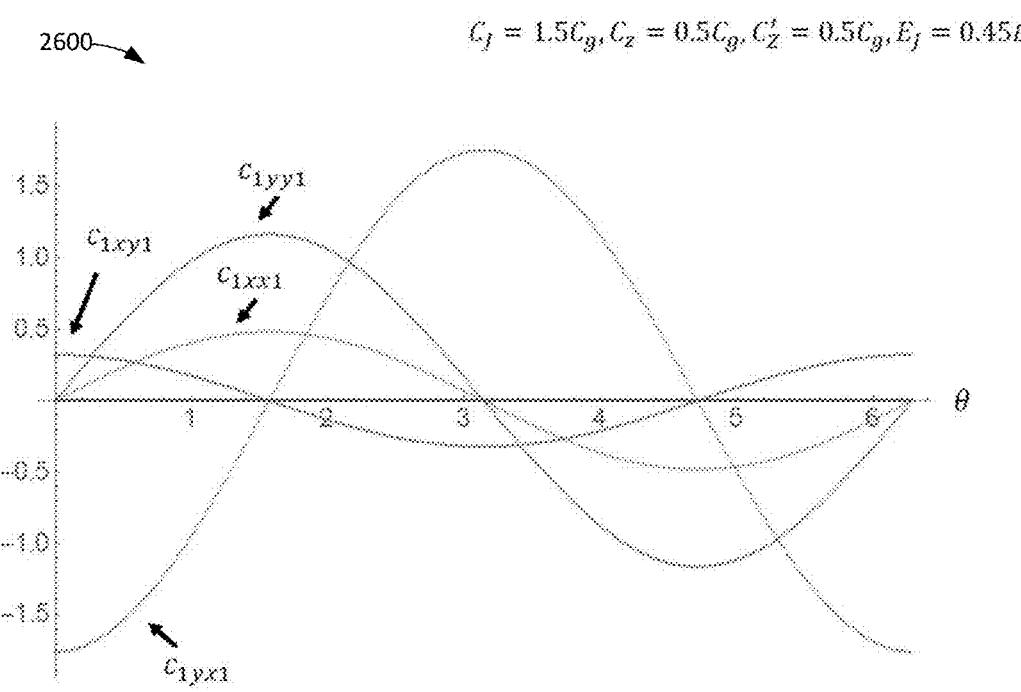

Note that the eigenstates $|S_{\vec{r}-\hat{z}}^z = s_1, S_{\vec{r}}^z = \tilde{s}_2\rangle$ can be changed by a phase, which will modify the expressions above. It is useful to pick a choice of phase so that, when possible, g, v, w>0. In FIGS. 24-26 some results for the numerical calculation of $c_{abcd}$ are displayed in plots 2400, 2500, and 2600. FIG. 24 is a plot 2400 of the 16 parameters $c_{abcd}$, for a, d=1, z and b, c=x, y, as a function of θ. The only ones that differ appreciably from zero are $c_{1bc1}$. FIG. 25 is a plot 2500 of the 16 parameters $c_{abcd}$, for a, d=1, z and b, c=x, y, as a function of θ. The only ones that differ appreciably from zero are $c_{1bc1}$. One can see that for θ≈0, π, $c_{1yx1}$ is much larger than $c_{1xy1}$, $c_{1xx1}$, and $c_{1yy1}$. FIG. 26 is a plot 2600 of the 16 parameters $c_{abcd}$, for a, d=1, z and b, c=x, y, as a function of θ.

One can see that in all cases, the only appreciable couplings are $c_{1ab1}$; $c_{zbcd}$ and $c_{abcz}$ are both quite small. This is because the amplitudes $h_{r;3}^{s_1s_2s_3s_4}$ have a very weak dependence on $s_1$ and $s_4$ and thus essentially cancel each other in the sum.

When $E_J=0$, then FIG. 24 shows that at θ=0, only $c_{1xy1}=-c_{1yx1}=1$; for all values of θ, at least two of the four couplings $c_{1xx1}$, $c_{1xy1}$, $c_{1yx1}$, and $c_{1yy1}$ are of the same order. As shown in FIGS. 25-26 when $E_J\neq0$, one can enter the regime where only $c_{1yx1}$ is appreciable while all others are much smaller. In fact, one can see from the equations above that if the matrix element $\langle s_1, s_2, s_3, s_4 | e^{i\varphi-\vec{r}} | \tilde{s}_1, \tilde{s}_2, \tilde{s}_3, s_4\rangle$ is close to one, which is the case for large $E_J$, then the only appreciable term in $c_{1bc1}$ will be $c_{1yx1}$. This is the reason that $E_J\neq0$. The optimal point would be to take $E_J$ to be as large as possible; however this would dramatically reduce the $J_z$ coupling, which was calculated in the previous section. Therefore, it is desirable to find an optimal point where $E_J$ is non-zero so that only $c_{1yx1}$ is appreciable, while $J_z$ is still large enough.

2D Networks

Figure 27:
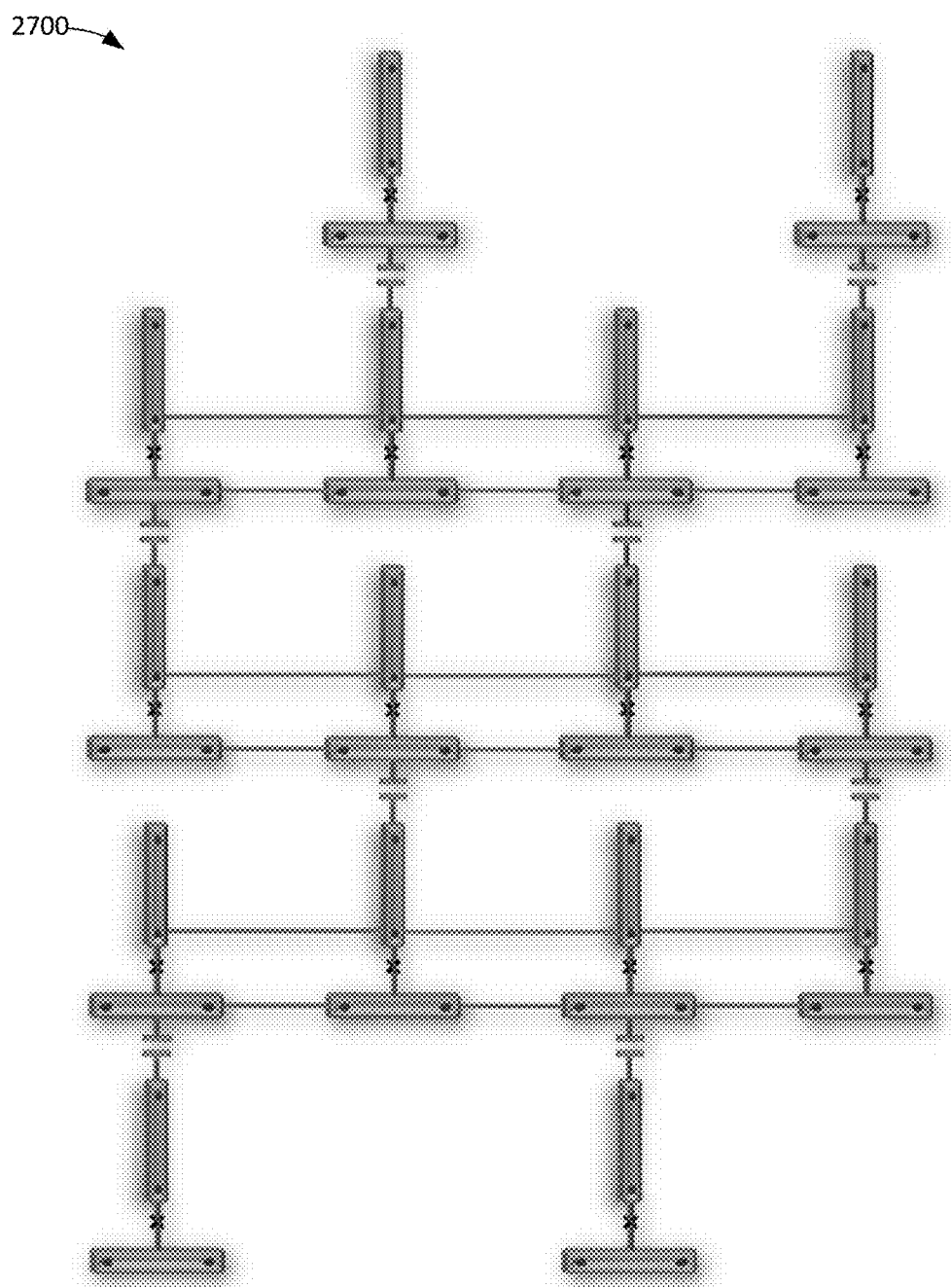
FIG. 27 is a schematic block diagram showing a two-dimensional network formed from the unit model of FIG. 1.

Now consider the 2D network 2700 shown in FIG. 27. The effective Hamiltonian for this is given by $$H_{2D} = \sum_I H_{2s,I} + H_{tun}, \quad (106)$$

where $H_{2s,I}$ is the Hamiltonian for the Ith unit cell; for each unit cell, this is given by $H_{2s}$ above. $H_{tun}$ contains the horizontal tunneling terms, which were analyzed for the case of two horizontally coupled unit cells in the preceding section. For the full 2D system, it is given by:

$$H_{tun} = \sum_{\vec{r}} [t_A \psi_{t,\vec{r}}^\dagger \psi_{t,\vec{r}+\hat{x}} + t_B \psi_{y,\vec{r}}^\dagger \psi_{x,\vec{r}+\hat{x}} + H.c.]. \quad (107)$$

Perturbing around the independent unit cell limit $t_A$, $t_B=0$, a simple generalization of the analysis of the preceding section gives the following effective Hamiltonian, which operates in the subspace spanned by the two effective spin states on each site:

$$H_{2D;eff} = \sum_{\vec{R}} J_z S_{\vec{R}}^z S_{\vec{R}-\hat{z}}^z + J_{yx} \sum_{\vec{r}} S_{\vec{r}}^y S_{\vec{r}+\hat{x}}^x + \delta H, \quad (108)$$

where $\Sigma_{\vec{R}}$ sums over all unit cells, and $\vec{R}$ refers to the top spin of each two-spin unit cell. As was shown in the preceding sections, there exist parameter regimes where the additional terms in δH are negligible:

$$\|\delta H\| << J_z, J_{yx}. \quad (109)$$

$H_{2D;eff}$ can be recognized to be the Kitaev honeycomb spin model. Specifically, one can perform a π spin rotation around $S^z$ on every other site, which brings the $H_{2D;eff}$ into the form $$H_{2D;eff} = \sum_{\vec{R}} (J_z S_{\vec{R}}^z S_{\vec{R}-\hat{z}}^z + J_y S_{\vec{R}}^y S_{\vec{R}+\hat{x}}^y + J_x S_{\vec{R}}^x S_{\vec{R}-\hat{x}}^x) + \delta H, \quad (110)$$

which is the more familiar form of the Kitaev model. Here, $J_y=-J_x=J_{yx}$.

Numerical Estimates of Energy Scales

In the discussion and figures above, the results of several numerical calculations of the energy spectra of the single effective spin, the two spin unit cell, and the couplings constants of the effective spin interaction terms were presented. From FIGS. 15-22, it can be seen that the $J_z$ interactions, which couple the vertically separated spins via an interaction $S_{\vec{R}}^z S_{\vec{R}-\hat{z}}^z$, are on the order of a few percent of the Josephson charging energy $e^2/C_J$, in order for the low energy spin manifold to be comfortably separated from the rest of the excitations of the system. FIGS. 24-26 show that a finite Josephson coupling $E_J$ is required, so that the horizontal couplings will be in the appropriate regime of the Kitaev honeycomb model.

Preliminary calculations suggest that the following parameter regime is a good one:

$$C_J=1.5C_g, C_Z=C_Z'=0.5C_g, E_J=0.45E_{C_J}, \theta=0,$$
$$|t_A|=|t_B|\approx 0.1 E_{gauge}. \quad (111)$$

With this choice of parameters, one finds that $J_z\approx 0.02 E_{C_J}$, while the energy cost to the other excited states of the two-spin unit cell is approximately ten times as large, $E_{gauge}\approx 0.23 E_{C_J}$. This gives a comfortable energy window that separates the low-lying effective spin states and the rest of the states of the system. FIG. 26 shows that with this choice of parameters, $c_{1yx1}\approx -1.75$, while $c_{1xy1}\approx 0.3$, and $c_{1xx1}=c_{1yy1}=0$, as are all other horizontal coupling terms. This gives almost a factor of approximately 6 between the horizontal couplings that are desired and the undesired ones. In terms of absolute energy scales, one has:

$$|J_x|=|J_y|=1.75|t_A t_B|/E_{gauge}. \quad (112)$$

If one sets $|\tilde{t}_A|=|\tilde{t}_B|=0.2 E_{gauge}$ to ensure the single electron tunneling processes are suppressed relative to the second order process, one finds $|J_x|=|J_y|=1.75 \times 0.04 E_{gauge}=0.016 E_{C_J}$, which is almost the same order as the $J_z$ estimate above.

Therefore, one can see that to get an effective spin model whose dominant interactions are the Kitaev interactions, while all other interactions are suppressed, one can get energy scales that are roughly in the range of a few percent of the Josephson charging energies $E_{C_J}$. To get a large energy scale, then, one can use a physical setup with the largest possible Josephson charging energy $e^2/C_J$, which can also simultaneously accommodate a Josephson coupling $E_J \approx 0.5 e^2/C_J$.

Typical Al—Al$_x$O$_{1-x}$ Josephson junctions have Josephson charging energies on the order of $E_{C_J} \approx 1$ K, which can therefore give interaction strengths $J_z$, $J_x$, $J_y \approx 20$ mK.

Josephson junctions made from gated semiconductor wires, such as Al—InAs—Al junctions, can yield much larger Josephson charging energies, because the distance between the superconductors (ie the length of the nanowire junction) can be much larger. For example, consider InAs wires with radius r and a distance d between the Al superconductors. For r=20-60 nm and d=100-450 nm, critical supercurrents $I_c$=1-135 nA have been measured, which corresponds to $E_J = \hbar I_c/2e \approx 0.05$-3 K. If one considers d=100 nm and the superconductor consisting of a wire of Al epitaxially grown on the InAs nanowire with total radius 100 nm, one can estimate $C_J = \epsilon_r \epsilon_0 \pi (100 \text{ nm})^2/(100 \text{ nm})$. Taking $\epsilon_r=15$ for InAs, this implies a charging energy $e^2/C_J \approx 40$ K. This can be further reduced by increasing the radius or decreasing d.

Interestingly, devices with d=30 nm have also been fabricated, and have been reported to yield critical currents as high as $I_c$=800 nA, for InAs nanowires with radius r=40 nm. This corresponds to $E_J \approx 40$ K. If one assumes the parallel plate capacitor formula for a radius 40 nm and d=30 nm, one would get $e^2/C_J \approx 75$ K. However, it is not clear whether such a high supercurrent is due to unwanted parasitic effects that are introduced during the fabrication process.

To put this on a somewhat more theoretical footing, consider that the supercurrent is typically given by $$I_c R_N = \pi \Delta / 2e, \tag{113}$$

where $R_N$ is the normal-state resistance of the junction, and $\Delta$ is the superconducting gap. For a semiconducting wire with $N_c$ channels, this implies $$E_J = \hbar I_c/2e = \frac{h}{e^2}\frac{\pi}{4} \Delta N_c \frac{e^2}{h} = \Delta N_c/8 \tag{114}$$

where the conductance is $e^2/h$ per channel. For Al, with $\Delta=1.2$ K, this implies that $E_J=0.15 N_c$ K.

The above considerations, and in particular the experimental measurements, suggest that it could be possible, with Al—InAs—Al junctions, to get to a regime where $E_{C_J}=2E_J \approx 5$-10 K. This would then imply $$J_z, J_x, J_y \approx 0.1\text{-}0.2 \text{ K}. \tag{115}$$

Note that Nb is also a candidate material that can be used in these setups, instead of Al. Indeed, Nb—InAs—Nb Josephson junctions have been fabricated and measured (see, e.g., H. Y. Gnel, I. E. Batov, H. Hardtdegen, K. Sladek, A. Winden, K. Weis, G. Panaitov, D. Grtzmacher, and T. Schpers, Journal of Applied Physics 112, 034316 (2012), URL http://scitation.aip.org/content/aip/journal/jap/112/3/10.1063/1.4745024). While the use of Nb presents certain technical obstacles for fabricating the required semiconductor-superconductor heterostructures, it has the advantage that the superconducting gap is much larger, $\Delta_{Nb} \approx 9$ K. This implies that the energy scales considered above will be a factor of $\Delta_{Nb}/\Delta_{Al}=7.5$ larger if Nb is used instead and good contact can be made between the Nb and the InAs. So far such an enhancement in the critical supercurrent has not been observed due to contact quality, but there are no fundamental obstacles to improving this contact quality and thus achieving this factor of 7-8 enhancement.

This would then suggest the theoretical possibility $$J_z, J_x, J_y \approx 0.5\text{-}2 \text{ K}. \tag{116}$$

Superconductors with even larger gaps, such as NbTiN, could potentially yield even larger energy scales.

Quantum Phase Slip Based Implementation

Further Single Spin Embodiments

In this section, an alternative possible architecture is considered, which utilizes the physics of quantum phase slips to engineer an effective Kitaev spin model. The main building block of this architecture is a set of four Majorana fermion zero modes, as shown in FIG. 28.

Figure 28:
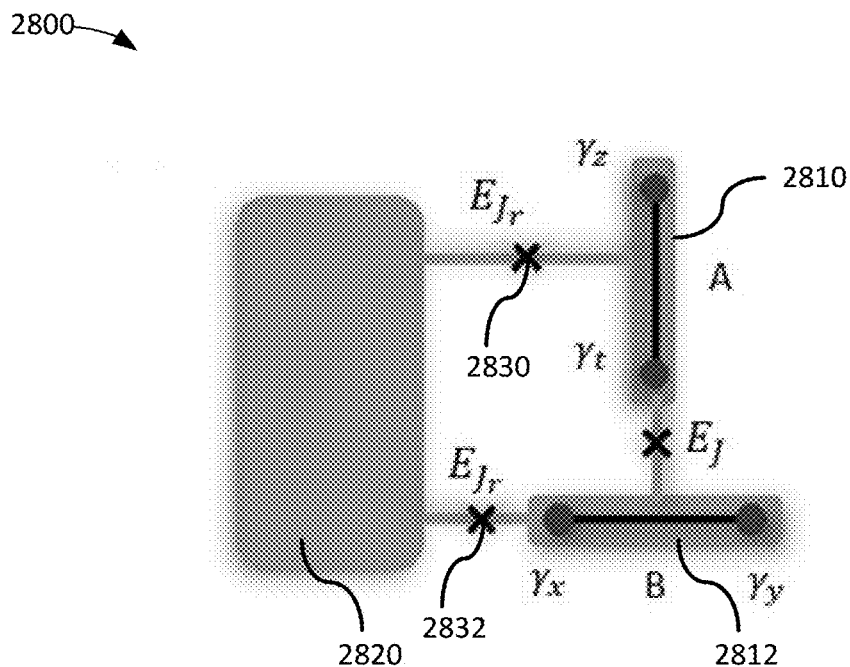
FIG. 28 is a schematic block diagram showing a configuration that exhibits a single effective spin.

In particular FIG. 28 is a schematic block diagram 2800 showing a configuration that exhibits a single effective spin. The A and B islands (2810, 2812, respectively) are each coupled to a large superconductor 2820 with Josephson couplings $J_r$ (2830, 2832). This is to emulate the embedding of the single spin into a larger network.

Each pair of Majorana zero modes arises from the endpoints of a spin-orbit coupled semiconductor nanowire, proximity coupled to a superconducting island. Each pair of Majorana fermion zero modes gives rise to two degenerate states, associated with whether the fermion parity on the island is even or odd. The four Majorana zero modes will be labelled as $\gamma^x$, $\gamma^y$, $\gamma^z$, and $\gamma^t$, as shown in FIG. 28.

The effective Hamiltonian for the system shown in FIG. 28 is $$H_{ss} = \sum_{j=A,B} H_{BdG}[\Delta_j e^{i\varphi_j}, \psi_j^\dagger, \psi_j] - \tag{117}$$
$$E_J \cos(\varphi_A - \varphi_B) - E_{J_r} \sum_{i=A,B} \cos(\varphi_i) + \frac{1}{2} \sum_{i,j=A,B} Q_i C_{ij}^{-1} Q_j$$

Here, $\varphi_j$ for j=A, B is the superconducting phase on the A and B islands, $H_{BdG}[\Delta_j e^{i\varphi_j}, \psi_j^\dagger, \psi_j]$ is the BdG Hamiltonian for the nanowire on the jth island, where $|\Delta_j|$ is the proximity-induced superconducting gap on the jth nanowire. $Q_j$ is the excess charge on the jth superconducting island-nanowire combination; it can be written as:

$$Q_j = e(-2i\partial_{\varphi_j} + N_j - n_{off_j}), \tag{118}$$

where $-i\partial_{\varphi_j}$ represents the number of Cooper pairs on the jth superconducting island, $N_j = \int \psi_j^\dagger \psi_j$ is the total number of electrons on the jth nanowire, and $n_{off_j}$ is the remaining offset charge on the jth island, which can be tuned continuously with the gate voltage $V_g$. The capacitance matrix is $$C = \begin{pmatrix} C_g + C_J + C_r & -C_J \\ -C_J & C_g + C_J + C_r \end{pmatrix} \tag{119}$$

As in the single spin subsection, a unitary transformation $U=e^{-i\Sigma_{j=A,B}(N_j/2-n_{Mj}/2)\varphi_j}$ is performed in order to decouple the phase $\varphi_j$ from the fermions $\psi_j$ in $H_{BdG}$. Here, $n_{Mj}=0, 1$ is the occupation number of the pair of Majorana zero modes on wire j. It is given in terms of the Majorana zero modes as $n_{MA}=(1+i\gamma^x\gamma^y)/2$, $n_{MB}=(1+i\gamma^{\tilde{x}}\gamma^{\tilde{y}})/2$. (120)

Under this transformation, the charge $Q_j$ transforms as:

$Q_j'=U^\dagger Q_j U=e(-2i\partial_{\varphi_j}+n_{Mj}-n_{off})$. (121)

Thus, taking $H_{ss}\to U^\dagger H_{ss}U$, one obtains $$H'_{ss} = U^\dagger H_{ss}U = \sum_j H_{BdG}[\Delta_j, \psi_j^\dagger, \psi_j] - E_J\cos(\varphi_A-\varphi_B) - \quad (122)$$

$$E_{J_r}\sum_{i=A,B}\cos(\varphi_i) + \frac{1}{2}\sum_{i,j=A,B}Q_i'C_{ij}^{-1}Q_j'$$

$$= \sum_j H_{BdG}[\Delta_j, \psi_j^\dagger, \psi_j] - E_J\cos(\varphi_-) -$$

$$2E_{J_r}\cos(\varphi_+/2)\cos(\varphi_-/2) + \frac{1}{4}(Q'_+)^2(C_{AA}^{-1}+C_{AB}^{-1}) +$$

$$\frac{1}{4}(Q'_-)^2(C_{AA}^{-1}-C_{AB}^{-1}),$$

where $C_{AA}=C_{BB}$, and $Q_\pm=Q_A\pm Q_B$. (123)

In what follows, the prime superscripts are dropped for convenience.

It is helpful to consider the Lagrangian for this system, which is given by $$L_\varphi = \frac{1}{2}\frac{1}{4e^2}\dot\varphi_i C_{ij}\dot\varphi_j + \frac{1}{2}(n_{Mi}-n_{off})\dot\varphi_i + \quad (124)$$

$$E_J\cos(\varphi_A-\varphi_B) + E_{J_r}\sum_{i=A,B}\cos(\varphi_i)$$

The limit is considered where $E_J, E_{J_r} \gg e^2 C_{IJ}^{-1}$, (125)

in which case $\varphi_A$, $\varphi_B$ are pinned, while the conjugate variables $\hat{N}_A$, $\hat{N}_B$ are highly fluctuating. For energy scales below $E_J$, $E_{J_r}$, the effective Hamiltonian of this two island system takes the form $H_{0D}=\zeta_A i\gamma^x\gamma^y+\zeta_B i\gamma^{\tilde{x}}\gamma^{\tilde{y}}-\zeta_{AB}\gamma^x\gamma^y\gamma^{\tilde{x}}\gamma^{\tilde{y}}$ (126)

The first two terms are due to quantum phase slip events where either $\varphi_A$ or $\varphi_B$ change by $2\pi$. The last term is due to the quantum phase slip event where both islands A and B collectively change their phase by $2\pi$, relative to the phase $\Phi$ of the reservoir. These phase slip processes effectively measure the fermion parity of the region undergoing the phase slip, which can be expressed in terms of the Majorana fermion modes.

The quantum phase slip amplitudes, $\zeta_A$, $\zeta_B$, $\zeta_{AB}$, can be computed using the standard instanton calculation, in the limit of dilute instantons. To leading order in $e^{-\sqrt{8(E_J+E_{J_r})/E_{C_{AA}}}}$ this is estimated to be $$\zeta_A = -\cos(\pi n_{offA})8E_{C_{AA}}\sqrt{\frac{2}{\pi}}\left(\frac{E_J+E_{J_r}}{2E_{C_{AA}}}\right)^{3/4}e^{-\sqrt{8(E_J-E_{J_r})/E_{C_{AA}}}} \quad (127)$$

$$\zeta_B = -\cos(\pi n_{offB})8E_{C_{BB}}\sqrt{\frac{2}{\pi}}\left(\frac{E_J+E_{J_r}}{2E_{C_{BB}}}\right)^{3/4}e^{-\sqrt{8(E_J+E_{J_r})/E_{C_{BB}}}}$$

$$\zeta_{AB} = -\cos(\pi n_{off+})8E_{C_{AB}}\sqrt{\frac{2}{\pi}}\left(\frac{E_{J_r}}{E_{C_{AB}}}\right)^{3/4}e^{-\sqrt{8(2E_{J_r})/E_{C_{AB}}}}$$

where $E_{C_{ii}} = \frac{e^2}{2C_{ii}}$, and $E_{C_{AB}} = \frac{e^2}{4}(C_{AA}^{-1}+C_{AB}^{-1})$.

It is assumed that the direct coupling between these different Majorana zero modes, which is generated by electron tunneling between the two ends of the wires, is much smaller than all other energy scales in the problem, and can therefore be ignored.

Observe now that if one sets $n_{offI}=\frac{1}{2}, I=A,B,$ (128)

then the effective Hamiltonian is simply $H_{eff,ss}=-\zeta_{AB}\gamma^x\gamma^y\gamma^{\tilde{x}}\gamma^{\tilde{y}}$, (129)

which enforces the constraint $\gamma^x\gamma^y\gamma^{\tilde{x}}\gamma^{\tilde{y}}=1$ (130)

for states with energies much less than $\zeta_{AB}$. The ground state subspace of this system is therefore doubly degenerate and acts like a spin, with $S^z=i\gamma^x\gamma^{\tilde{x}}$. (131)

Slightly tuning the offset $n_{offA}$ and/or $n_{offB}$ away from $\frac{1}{2}$ acts like a Zeeman field $h_z S^z$.

1D Chain

Next, consider a 1D chain of the A, B superconducting island pairs introduced in the previous subsection.

Figure 29:
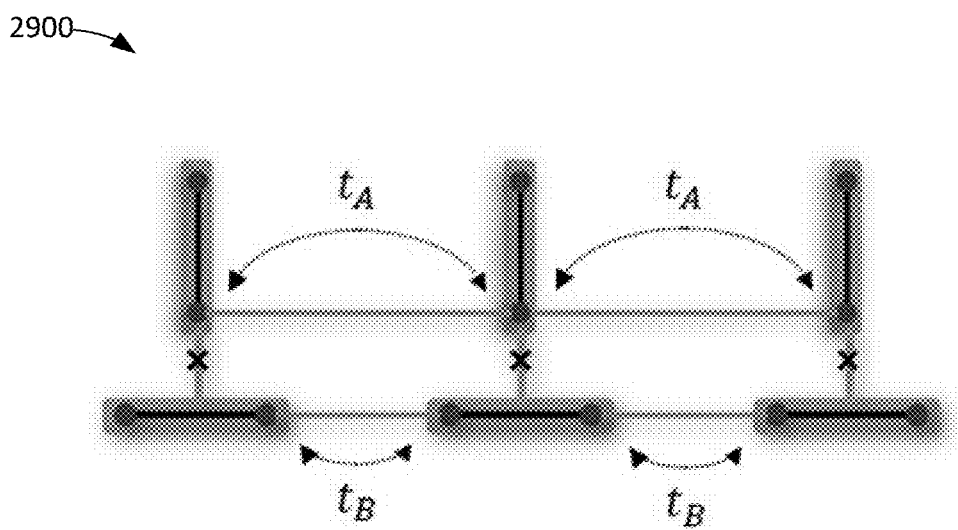
FIG. 29 is a schematic block diagram showing a 1D chain.

In particular, FIG. 29 is a schematic block diagram 2900 showing a 1D chain. In FIG. 29, $t_A$ and $t_B$ indicate electron tunneling.

The coupling between the effective sites of the chain consists of the Majorana fermion tunneling terms shown in FIG. 29 with tunneling amplitudes $t_A$ and $t_B$. In addition to the single particle tunneling terms between the Majorana zero modes, there are pair tunneling terms that induce Josephson couplings $J_A$, $J_B$ between the islands. Finally, there are cross-capacitances between the different superconducting islands; the regime is considered where the charging energies due to these cross-capacitances are much smaller than the tunneling and Josephson couplings, and can therefore be ignored. The effective Hamiltonian of the chain is therefore $$H_{1D} = \sum_{\vec{r}}[h_{\vec{r}}+h_{\vec{r},\vec{r}+\hat{x}}], \quad (132)$$

where each $h_{\vec{r}}$ is given by the Hamiltonian $H_{ss}$ described in the previous section, and $h_{\vec{r},\vec{r}+\hat{x}}=t_A\psi_{\vec{r}}^\dagger\psi_{\vec{r}+\hat{x}}+t_B\psi_{\vec{y},\vec{r}}^\dagger\psi_{\vec{x},\vec{r}+\hat{x}}-J_A\cos(\varphi_{\vec{r},A}-\varphi_{\vec{r}+\hat{x},A})-J_B\cos(\varphi_{\vec{r},B}-\varphi_{\vec{r}+\hat{x},B})$. (133)

Note that the pair tunnelings $J_A$ and $J_B$ in this setup are generated by pair tunneling between the Majorana zero modes, and thus $J_A < t_A$, $J_B < t_B$. Performing the unitary transformation U in the previous section, and then setting $$\psi_{\alpha\vec{r}} = u^\alpha \gamma_{\vec{r}}^\alpha \qquad (134)$$

as in the previous section, one gets:

$$h_{\vec{r},\vec{r}+\hat{x}} = [\tilde{t}_A e^{-i(1+F_{p,A}\vec{r})\varphi_{A\vec{r}}/2 + i(1-F_{p,A},\vec{r}+\hat{x})\varphi_{A\vec{r}+\hat{x}}/2} \gamma_{\vec{r}}^t \gamma_{\vec{r}+\hat{x}}^t + \tilde{t}_B e^{-(1+F_{p,B},\vec{r})\varphi_{B\vec{r}}/2 + i(1-F_{p,B},\vec{r}+\hat{x})\varphi_{B\vec{r}+\hat{x}}/2} \gamma_{\vec{r}}^y \gamma_{\vec{r}+\hat{x}}^y + H.c.] - J_A \cos(\varphi_{\vec{r},A} - \varphi_{\vec{r}+\hat{x},A}) - J_B \cos(\varphi_{\vec{r},B} - \varphi_{\vec{r}+\hat{x},B}). \qquad (135)$$

Now, since one is in the limit of large Josephson couplings, all of the phases of the superconducting islands can be set equal to each other, which can be set to zero without loss of generality:

$$\varphi_{A\vec{r}} = \varphi_{B\vec{r}} = 0, \qquad (136)$$

with corrections coming from instanton events. Thus, $h_{\vec{r},\vec{r}+\hat{x}}$ becomes $$h_{\vec{r},\vec{r}+\hat{x}} = [2i\text{Im}(\tilde{t}_A)\gamma_{\vec{r}}^t \gamma_{\vec{r}+\hat{x}}^t + 2i\text{Im}(\tilde{t}_B)\gamma_{\vec{r}}^y \gamma_{\vec{r}+\hat{x}}^y]. \qquad (137)$$

Here, consider the limit where $$\tilde{t}_A, \tilde{t}_B \ll \zeta_{AB}. \qquad (138)$$

In this case, the single tunneling events are suppressed; perturbing to second order in $h_{\vec{r},\vec{r}+\hat{x}}$, an effective Hamiltonian as follows is obtained:

$$h_{\vec{r},\vec{r}+\hat{x}}^{eff} = -\frac{4\text{Im}(\tilde{t}_A)\text{Im}(\tilde{t}_B)}{\zeta_{AB}} \gamma_{\vec{r}}^y \gamma_{\vec{r}}^t \gamma_{\vec{r}+\hat{x}}^x \gamma_{\vec{r}+\hat{x}}^t. \qquad (139)$$

Therefore, the effective Hamiltonian of the 1D chain is given by:

$$H_{1D} = \sum_{\vec{r}} \left[ \zeta_A i \gamma_{\vec{r}}^x \gamma_{\vec{r}}^y + \zeta_B i \gamma_{\vec{r}}^z \gamma_{\vec{r}}^t - \zeta_{AB} \gamma_{\vec{r}}^x \gamma_{\vec{r}}^y \gamma_{\vec{r}}^z \gamma_{\vec{r}}^t - \frac{4\text{Im}(\tilde{t}_A)\text{Im}(\tilde{t}_B)}{\zeta_{AB}} \gamma_{\vec{r}}^y \gamma_{\vec{r}}^t \gamma_{\vec{r}+\hat{x}}^x \gamma_{\vec{r}+\hat{x}}^t \right] \qquad (140)$$

If it is assumed for simplicity that $J_A = J_B = J$, then the quantum phase slip amplitudes are essentially as given in Eqn. 147, with $E_{J_r} = 2J$, and $C_r$ being twice the capacitance across the semiconductor wires.

2D Network

Now consider assembling the 1D chains described above into a two-dimensional network. In particular, consider the network shown in FIG. 30, which effectively forms a brick (honeycomb) lattice.

Figure 30:
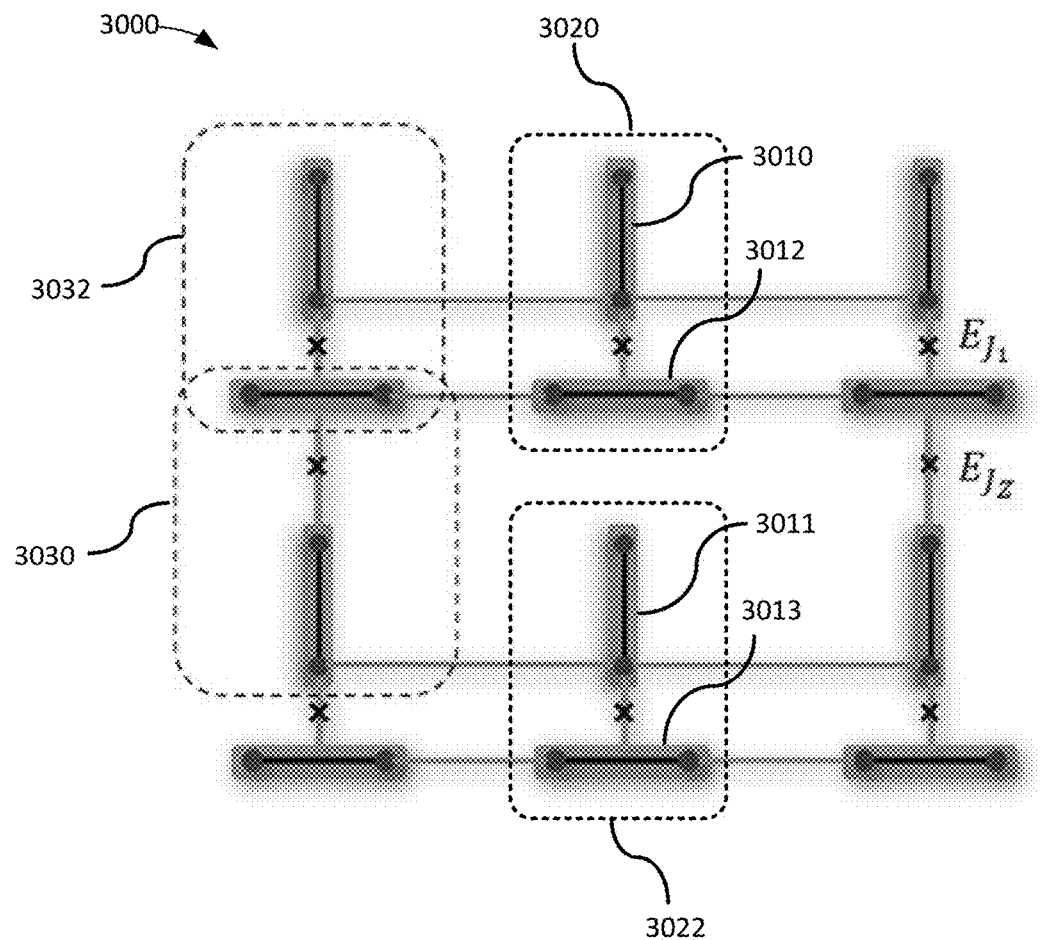
FIG. 30 is a schematic block diagram showing a single plaquette of the 2D network.

In particular, FIG. 30 is a schematic block diagram 3000 showing a single plaquette of the 2D network. The Josephson coupling between different spins is $E_{J_Z}$ (also represented by dashed line 3030), while $E_{J_1}$ is the Josephson coupling between the A and B island of a single spin (also represented by dashed line 3032).

Each unit cell (e.g., unit cells 3020, 3022) of the lattice comprises two pairs of superconducting islands: two A islands (A islands 3010, 3011) and two B islands (B islands 3012, 3013), separated vertically from each other.

The Hamiltonian for the system can be written as $$H_{2D} = \sum_{\vec{R}} H_{2s,\vec{R}} + H_{tun}, \qquad (141)$$

where $\vec{R}$ is the location of the top spin of each unit cell, $\Sigma_{\vec{R}}$ is thus a sum over unit cells, and the Hamiltonian for each unit cell $H_{2s;\vec{R}}$:

$$H_{2s;\vec{R}} = \sum_{I=1}^{4} H_{BdG} + \frac{1}{2} \sum_{I,J=1}^{4} Q_I C_{IJ}^{-1} Q_J - E_{J_1} \cos(\varphi_{A\vec{R}} - \varphi_{B\vec{R}}) - E_{J_1} \cos(\varphi_{A\vec{R}-\hat{z}} - \varphi_{B\vec{R}-\hat{z}}) - E_{J_Z} \cos(\varphi_{B\vec{R}} - \varphi_{A\vec{R}-\hat{z}}). \qquad (142)$$

The 4×4 capacitance matrix now is $$C = \begin{pmatrix} C_g + C_J & -C_J & 0 & 0 \\ -C_J & C_g + C_J + C_{J_Z} & -C_{J_Z} & 0 \\ 0 & -C_{J_Z} & C_g + C_J + C_{J_Z} & -C_J \\ 0 & 0 & -C_J & C_g + C_J \end{pmatrix} \qquad (143)$$

The tunneling Hamiltonian $H_{tun}$ is:

$$H_t = \sum_{\vec{r}} \left[ t_A \psi_{t\vec{r}}^\dagger \psi_{t\vec{r}+\hat{x}} + t_B \psi_{y\vec{r}}^\dagger \psi_{x\vec{r}+\hat{x}} + H.c. \right] \qquad (144)$$

Here, the capacitance between horizontally separated islands is ignored, as the islands are assumed to be far enough apart that their capacitance is negligible.

Based on the analysis of the single spin case and the 1D chain, one can see that the low energy effective Hamiltonian for this system can be written as $$H_{2D;eff} = H_1 + H_2 + H_{t;eff}, \qquad (145)$$

where $H_1$ consists of single island phase slips:

$$H_1 = \sum_{\vec{R}} \left( \zeta_{\vec{r}}^A i \gamma_{\vec{R}}^z \gamma_{\vec{R}}^t + \zeta_{\vec{R}-\hat{z}}^A \gamma_{\vec{R}-\hat{z}}^z \gamma_{\vec{R}-\hat{z}}^t + \zeta_{\vec{R}}^B i \gamma_{\vec{R}}^x \gamma_{\vec{R}}^y + \zeta_{\vec{R}-\hat{z}}^B \gamma_{\vec{R}-\hat{z}}^x \gamma_{\vec{R}-\hat{z}}^y \right) \qquad (146)$$

$H_2$ comprises two-island phase slips:

$$H_2 = -\sum_{\vec{r}} \zeta_{\vec{r}}^{AB} \gamma_{\vec{r}}^z \gamma_{\vec{r}}^t \gamma_{\vec{r}}^x \gamma_{\vec{r}}^y - \sum_{\vec{R}} \zeta_Z^{AB} \gamma_{\vec{R}}^y \gamma_{\vec{R}}^t \gamma_{\vec{R}-\hat{z}}^z \gamma_{\vec{R}-\hat{z}}^t - \sum_{\vec{r}} \zeta_X^{AA} \gamma_{\vec{r}}^z \gamma_{\vec{r}}^t \gamma_{\vec{r}+\hat{x}}^z \gamma_{\vec{r}+\hat{x}}^t - \sum_{\vec{r}} \zeta_X^{BB} \gamma_{\vec{r}}^y \gamma_{\vec{r}}^y \gamma_{\vec{r}+\hat{x}}^x \gamma_{\vec{r}+\hat{x}}^y \qquad (147)$$

These phase slip amplitudes are given in terms of the Josephson couplings and charging energies:

$$\zeta_{\vec{R}}^{A} = -\cos(\pi n_{\text{off}A,\vec{R}}) 8E_{C_{11}} \sqrt{\frac{2}{\pi}} \left(\frac{E_{J_1}}{2E_{C_{11}}}\right)^{3/4} e^{-\sqrt{8(E_{J_1})/E_{C_{11}}}} \quad (148)$$

$$\zeta_{\vec{R}-\hat{z}}^{A} =$$
$$-\cos(\pi n_{\text{off}A,\vec{R}-\hat{z}}) 8E_{C_{33}} \sqrt{\frac{2}{\pi}} \left(\frac{E_{J_1}+E_{J_Z}}{2E_{C_{11}}}\right)^{3/4} e^{-\sqrt{8(E_{J_1}+E_{J_Z})/E_{C_{33}}}}$$

$$\zeta_{\vec{R}}^{B} = -\cos(\pi n_{\text{off}B,\vec{R}}) 8E_{C_{22}} \sqrt{\frac{2}{\pi}} \left(\frac{E_{J_1}+E_{J_Z}}{2E_{C_{22}}}\right)^{3/4} e^{-\sqrt{8(E_{J_1}+E_{J_Z})/E_{C_{22}}}}$$

$$\zeta_{\vec{R}-\hat{z}}^{B} = -\cos(\pi n_{\text{off}B,\vec{R}-\hat{z}}) 8E_{C_{44}} \sqrt{\frac{2}{\pi}} \left(\frac{E_{J_1}}{2E_{C_{44}}}\right)^{3/4} e^{-\sqrt{8(E_{J_1})/E_{C_{44}}}}$$

$$\zeta_{\vec{r}}^{AB} = \qquad (149)$$
$$-\cos(\pi(n_{\text{off}A,\vec{r}}+n_{\text{off}B,\vec{r}})) 8E_{C_{AB}} \sqrt{\frac{2}{\pi}} \left(\frac{E_{J_Z}}{2E_{C_{AB}}}\right)^{3/4} e^{-\sqrt{8(E_{J_Z})/E_{C_{AB}}}}$$

$$\zeta_{Z}^{AB} = -\cos(\pi(n_{\text{off}B,\vec{r}}+n_{\text{off}A,\vec{r}-\hat{z}})) 8E_{C_{BA}}$$
$$\sqrt{\frac{2}{\pi}} \left(\frac{2E_{J_1}}{2E_{C_{BA}}}\right)^{3/4} e^{-\sqrt{8(E_{J_1})/E_{C_{BA}}}}$$

where $$E_{C_{AB}} = \frac{e^2}{2} \frac{1}{2C_g + C_Z} \qquad (150)$$

$$E_{C_{BA}} = \frac{e^2}{2} \frac{1}{2C_g + 2C_J}$$

The phase slip amplitudes $\zeta_X^{AA}$, $\zeta_X^{BB}$ are approximately given by products of the single island phase slips, $$\zeta_X^{AA} \approx \zeta_{\vec{R}}^{A} \zeta_{\vec{R}-\hat{z}}^{A},$$

$$\zeta_X^{BB} \approx \zeta_{\vec{R}}^{B} \zeta_{\vec{R}-\hat{z}}^{B}, \qquad (151)$$

because the horizontal Josephson couplings are negligible.

All other two-island phase slips, and collective phase slips of more than two islands, can be ignored, as their amplitudes are exponentially suppressed relative to the terms considered here. Finally, $H_{tun}$ includes the Majorana tunneling terms $t_A$ and $t_B$:

$$H_{tun} = \sum_{\vec{r}} \left[ 2i\text{Im}(\tilde{t}_A)\gamma_{t,\vec{r}}\gamma_{t,\vec{r}+\hat{x}} + 2i\text{Im}(\tilde{t}_B)\gamma_{y,\vec{r}}\gamma_{x,\vec{r}+\hat{x}} \right] \qquad (152)$$

If one sets $n_{\text{off},A,\vec{r}} = n_{\text{off},B,\vec{r}} = 1/2$, then the single island phase slips vanish. The effective Hamiltonian becomes $$H_{2D;\text{eff}} = -\sum_{\vec{r}} \zeta_{\vec{r}}^{AB} \gamma_{\vec{r}}^{z} \gamma_{\vec{r}}^{t} \gamma_{\vec{r}}^{x} \gamma_{\vec{r}}^{y} - \qquad (153)$$
$$\sum_{\vec{R}} \zeta_{Z}^{AB} \gamma_{\vec{R}}^{x} \gamma_{\vec{R}}^{y} \gamma_{\vec{R}-\hat{z}}^{z} \gamma_{\vec{R}-\hat{z}}^{t} - \frac{4\text{Im}(\tilde{t}_A)\text{Im}(\tilde{t}_B)}{\zeta_{AB}} \gamma_{\vec{r}}^{y} \gamma_{\vec{r}}^{t} \gamma_{\vec{r}+\hat{x}}^{x} \gamma_{\vec{r}+\hat{x}}^{t}$$

If one further considers the regime where $$\zeta_{\vec{r}}^{AB} \gg \zeta_{Z}^{AB}, 2\text{Im}(\tilde{t}_A), 2\text{Im}(\tilde{t}_B), \qquad (154)$$

one sees that the system can be described by an effective spin model:

$$H_{2D;\text{eff}} = \sum_{\vec{R}} J_z S_{\vec{R}}^{z} S_{\vec{R}-\hat{z}}^{z} + J_{yx} \sum_{\vec{r}} S_{\vec{r}}^{y} S_{\vec{r}-\hat{x}}^{x}, \qquad (155)$$

with $$J_z = \zeta_Z^{AB}, \qquad (156)$$

$$J_{yx} = \frac{4\text{Im}(\tilde{t}_A)\text{Im}(\tilde{t}_B)}{\zeta_{AB}}$$

Upon rotating every other spin around the z axis by $\pi/2$, the above Hamiltonian can be put into the more familiar Kitaev form:

$$H_{2D;\text{eff}} = \sum_{\langle ij \rangle = z\text{-link}} J_z S_i^z S_j^z + \sum_{\langle ij \rangle = x\text{-link}} J_{yx} S_i^x S_j^x - \sum_{\langle ij \rangle = y\text{-link}} J_{yx} S_i^y S_j^y, \qquad (157)$$

Realizing the Ising Topological Order

As has been shown, the physical architectures described above can give rise to an effective realization of the 2D Kitaev honeycomb spin model:

$$H_K = J_x \sum_{x\text{-links}} S_i^x S_j^x + J_y \sum_{y\text{-links}} S_i^y S_j^y + J_z \sum_{z\text{-links}} S_i^z S_j^z. \qquad (158)$$

It is well-known that this model is proximate to a non-Abelian topological state with Ising topological order. There are a number of known ways to access the non-Abelian state. One way to access the non-Abelian state is to apply a small effective Zeeman field:

$$\delta H = \sum_{\vec{r}} h_x S_{\vec{r}}^x + h_y S_{\vec{r}}^y + h_z S_{\vec{r}}^z. \qquad (159)$$

As explained in the single spin subsection, the $h_z$ term above can be generated by tuning the gate voltage on each of the superconducting islands. The $h_x$ and $h_y$ terms are more difficult, but possible, to generate as well. They require connecting the Majorana zero modes with additional semiconductor wires, as shown in FIG. 11 to allow for electron tunneling as shown.

A second way of realizing the Ising topological order is to consider effectively the same model, but on a different lattice (see FIGS. 5 and 6) as proposed by Yao and Kivelson. As a spin model, the Kitaev Hamiltonian, Eq. (158) is time-reversal invariant. On the lattice structure proposed by Yao-Kivelson the ground state spontaneously breaks time reversal symmetry, yielding a ground state with Ising (or its time-reversed partner, $\overline{\text{Ising}}$) topological order. In the completely isotropic limit where all couplings are equal to J, the energy gap of the Ising state is also equal to J. Interestingly, disorder in the spin couplings can actually be beneficial and can enlarge the region of stability of the Ising phase.

By adding a small effective time-reversal symmetry breaking perturbation to the spin model, one can tune whether the topological order is Ising or $\overline{\text{Ising}}$, and avoid having domains of either, as would be realistically expected in the case where the effective time-reversal symmetry is broken spontaneously. A Zeeman term $\Sigma_{\vec{r}} h_z S_{\vec{r}}^z$ by itself is insufficient. One can consider either a Zeeman term that includes both $h_z$ and $h_y$. Or, in order to avoid requiring $h_y$ or $h_x$ terms, which are more difficult to generate, one can make use of the smaller perturbations $S_{\vec{R}}^y S_{\vec{R}+\hat{x}}^x$, $S_{\vec{r}}^x S_{\vec{r}+\hat{x}}^y$, that are naturally generated in the first charging energy based implementation presented above.

Genons

Ising×Ising Topological Order

Figure 31:
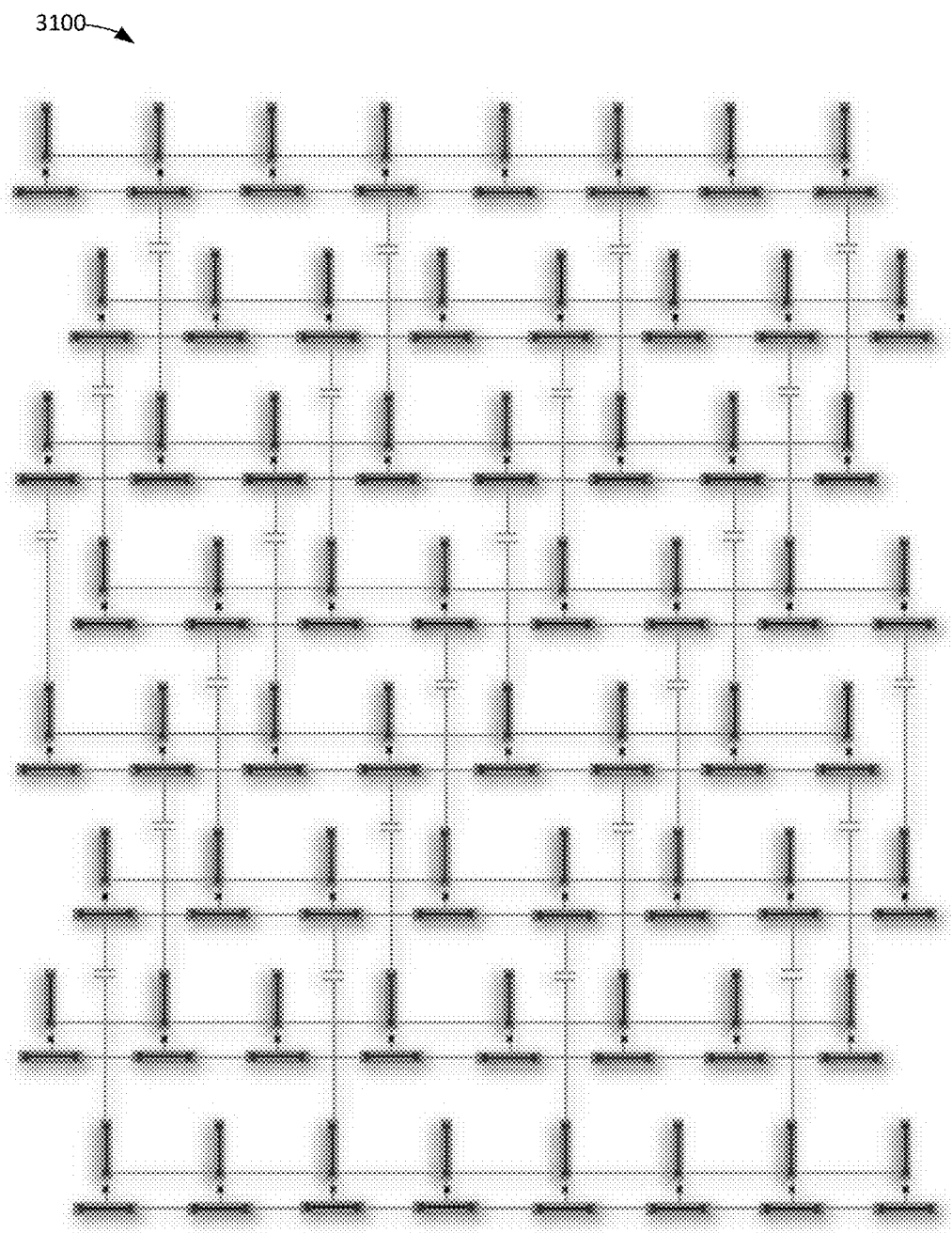
FIGS. 31 and 32 are schematic block diagrams showing a second way of realizing the Ising topological order on a different lattice.

FIG. 31 is a block diagram 3100 showing that two essentially decoupled copies of the capacitance-based model can be created by using short overpasses to couple next nearest neighbor chains.

Figure 34:
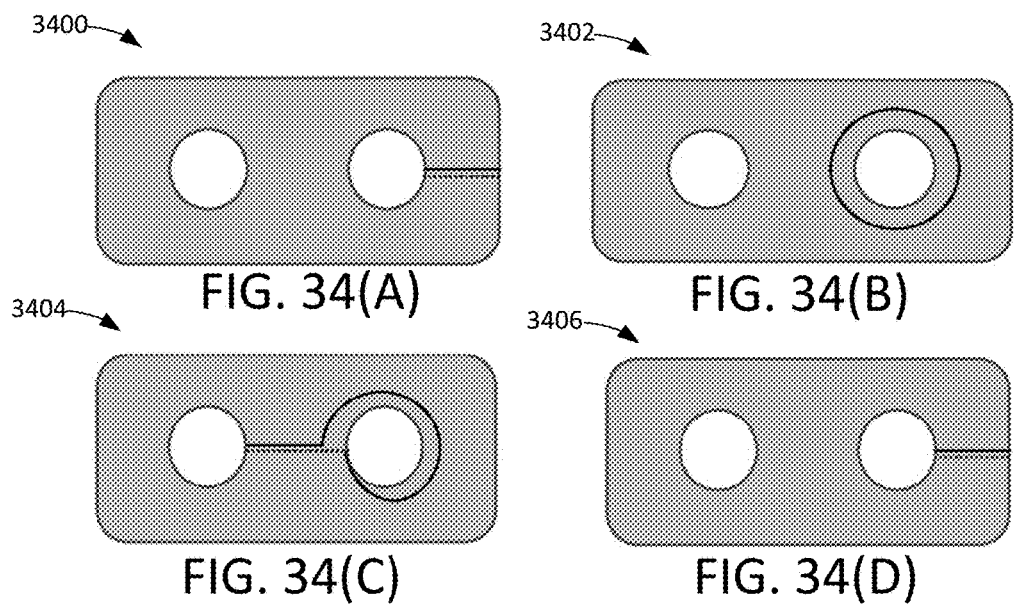
FIGS. 34(A)-(D) show schematic block diagrams illustrating example measurement based braiding of genons.

Given a microscopic architecture to realize a quantum state with Ising topological order, one can then consider designing two independent copies of such a state (referred to as the Ising×Ising state) by utilizing present-day nanofabrication technology to create short overpasses among different superconducting wires, as shown in FIG. 34.

Creating Genons

Figure 32:
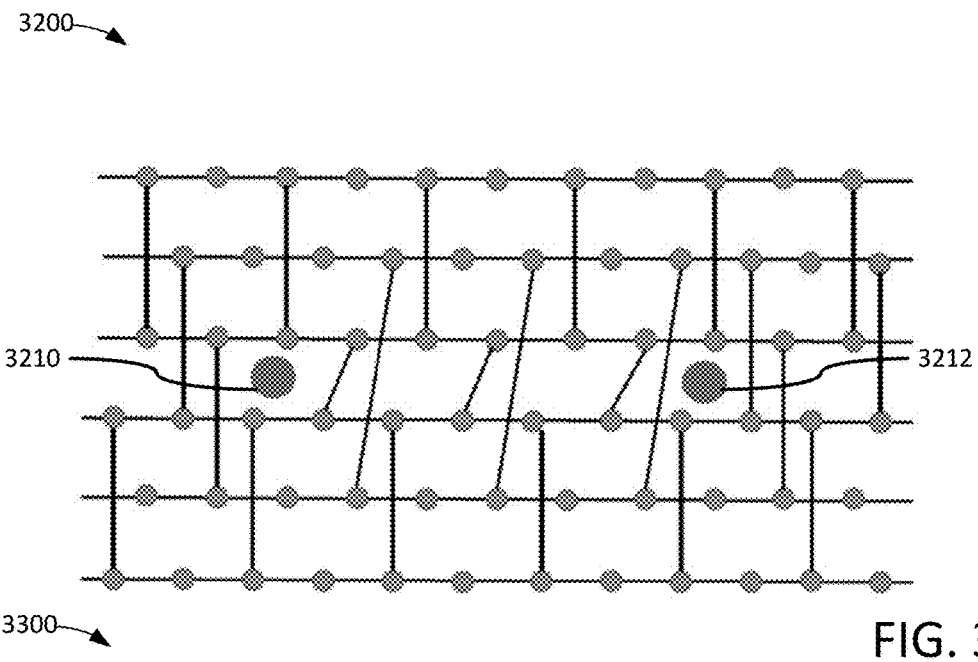
Figure 33:
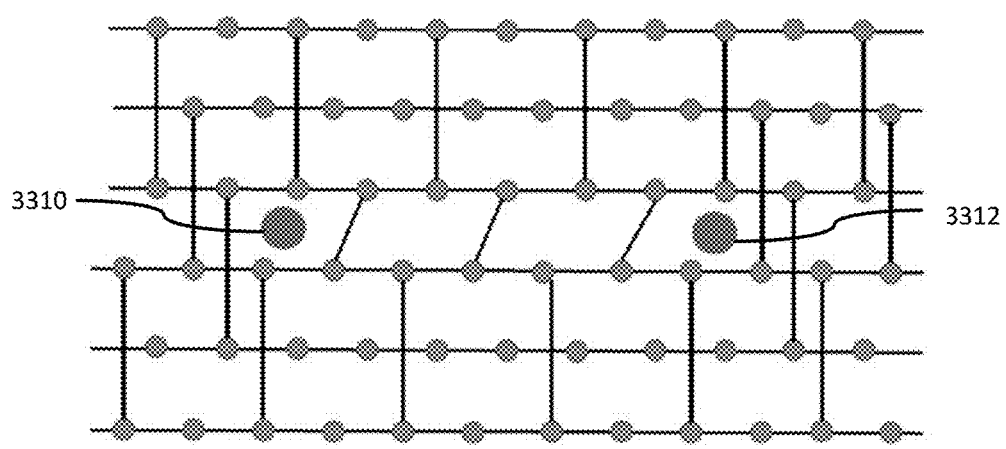

A genon in an Ising×Ising state can then be realized by modifying the overpass connections to create a segment along which the connections among the horizontal chains is twisted, as shown in FIGS. 32-33. These segments effectively create branch lines that connect one layer to the other, and vice versa. The end-points of the segments realize exotic non-Abelian twist defects, which have been referred to as genons. The topological degeneracy of the system in the presence of the genons mimics that of a single copy Ising system on a surface of non-trivial topology.

More specifically, FIGS. 32 and 33 are schematic block diagrams 3200, 3300 of architectures for creating genons in the effective spin model. The location of the genons corresponds to the end point of the branch lines, and are marked green circles (3210, 3212 in FIGS. 32 and 3310, 3312 in FIG. 33, respectively). FIG. 32 shows the full lattice dislocation, whereas FIG. 33 shows the configuration where vertical bonds that skip two chains along the branch cut are removed. The fact that these vertical bonds can be removed follows the analysis of M. Barkeshli and X.-L. Qi, Phys Rev X 4, 041035 (2014), which showed in a different context that half of the branch cut is sufficient.

Technically, there are three topologically distinct types of genons, which are labeled here as $\langle$, $X_\psi$, and $X_\sigma$. See M. Barkeshli, P. Bonderson, M. Cheng, and Z. Wang (2014), arXiv:1410.4540.

Physically, they correspond to whether a $\mathbb{I}$, $\psi$, $\sigma$ particle, from either layer, is bound to the genon. The genons have the following fusion rules:

$\langle \times \langle = (\mathbb{I}, \mathbb{I}) + (\psi, \psi) + (\sigma, \sigma)$ $\langle \times (\mathbb{I}, \psi) = \mathbb{I} \times (\psi, \mathbb{I}) = X_\psi$ $\langle \times (\mathbb{I}, \sigma) = \mathbb{I} \times (\sigma, \mathbb{I}) = X_\sigma$ (160)

It follows from the above that $\langle$, $X_\psi$ have quantum dimension 2, while $X_\sigma$ has quantum dimension $2\sqrt{2}$.

Effective Braiding of Genons and the Topological π/8 Phase Gate

The braiding of genons can be used to realize a topologically protected π/8 phase gate. In the present system, the braiding of genons is complicated by the fact that it is difficult to continuously modify the physical location of the genons to execute a braid loop in real space. Fortunately, this is not necessary, as the braiding of the genons can be implemented through a measurement-based approach. To do this, it is required that it be possible to measure the joint fusion channel of any pair of genons and project it into either the ($\mathbb{I}$, $\mathbb{I}$) channel or the ($\psi$, $\psi$) channel.

Measurement-Based Braiding of Genons

Importantly, the braiding of the genons can be achieved without moving them continuously around each other in space, but rather through tuning the effective interactions between them. Specifically, what is required to braid two genons is the ability to project the fusion channel of pairs of genons onto an Abelian charge sector.

In order to implement the π/8 phase gate, one can start with two pairs of genons, labelled 1, . . . , 4, and have the ability to braid genons 2 and 3. In order to do this, an ancillary pair of genons, labelled 5 and 6, is used. The braiding process is then established by projecting the genons 5 and 6 onto the fusion channel $b_{56}$, then the genons 5 and 3 onto the fusion channel $b_{35}$, the genons 5 and 2 onto the fusion channel $b_{25}$, and finally again the genons 5 and 6 onto the fusion channel $b_{56}'$.

FIGS. 8(A)-(D) show schematics for measurement based braiding of genons. In order to effectively braid genons 2 and 3, the following protocol can be performed. As shown at 810 of FIG. 8(A), the fusion channel of genons 5 and 6 is projected onto the anyon $b_{56}$. At 812, of FIG. 8(B), the fusion channel of genons 5 and 3 is projected onto $b_{53}$. At 814, of FIG. 8(C), the fusion channel of genons 5 and 2 is projected onto $b_{52}$. At 816, of FIG. 8(D), the fusion channel of genons 5 and 6 is projected onto $b_{56}'$.

Here it is assumed that $b_{56}=b_{56}'$. If the genons 5 and 6 are created out of the vacuum, then it will in fact be natural to have $b_{56}=b_{56}'=(\mathbb{I}, \mathbb{I})$. In this situation, one can derive the resulting braid matrix for the genons, following the results of P. Bonderson, Phys. Rev. B 87, 035113 (2013). When $b_{25}=b_{35}$, the braid matrix for genons 2 and 3 is given by $$R_{23} = e^{i\phi}\begin{pmatrix} 1 & 0 & 0 \\ 0 & -1 & 0 \\ 0 & 0 & e^{i\pi/8} \end{pmatrix}, \quad (161)$$

where $e^{i\varphi}$ is an undetermined, non-topological phase. In other words, the state obtains a phase of ±1 or $e^{i\pi/8}$, depending on whether the fusion channel of genons 2 and 3 is ($\mathbb{I}$, $\mathbb{I}$), ($\psi$, $\psi$), or ($\sigma$, $\sigma$). If instead $b_{25} \neq b_{35}$, then $$R_{23} = e^{i\phi}\begin{pmatrix} -1 & 0 & 0 \\ 0 & 1 & 0 \\ 0 & 0 & e^{i\pi/8} \end{pmatrix} \quad (162)$$

Physical Implementation of Projection of Pairs of Genons onto ($\mathbb{I}$, $\mathbb{I}$) or ($\psi$, $\psi$) Fusion Channels When two genons are separated by a distance L, the effective Hamiltonian in the degenerate subspace spanned by the genons obtains non-local Wilson loop operators:

$H_{genon} = t_{(\psi,\psi)} W_{(\psi,\psi)}(C) + t_{(\sigma,\sigma)} W_{(\sigma,\sigma)}(C) + H.c.$ (163)

$W_{(\psi,\psi)}(C)$ describes the exchange of a $(\psi, \psi)$ particle between the two genons, which equivalently corresponds to a $(\mathbb{I}, \psi)$ or $(\psi, \mathbb{I})$ particle encircling the pair of genons. Similarly, $W_{(\sigma,\sigma)}(C)$ describes the exchange of a $(\sigma, \sigma)$ particle between the two genons, which equivalently corresponds to a $(\mathbb{I}, \sigma)$ or $(\sigma, \mathbb{I})$ particle encircling the pair of genons. $t_\psi \propto e^{-L\Delta_\psi/v_\psi}$ and $t_\sigma \propto e^{-L\Delta_\sigma/v_\sigma}$ are the tunneling amplitudes, with $\Delta_\psi$ and $\Delta_\sigma$ being the energy gaps for the $\psi$ and $\sigma$ particles, and $v_\psi$, $v_\sigma$ some appropriate velocity scales.

Next, suppose that the pair of genons shown in FIG. 34 fuse to the quasiparticle (b, b). The outcome of the process where a (1, a) quasiparticle encircles a topological charge (b, b) is determined by the topological S matrix of the Ising phase, and is given by $S_{ab}/S_{b\mathbb{I}}$, where $$S = \begin{pmatrix} 1/2 & 1/\sqrt{2} & 1/2 \\ 1/\sqrt{2} & 0 & -1/\sqrt{2} \\ 1/2 & -1/\sqrt{2} & 1/2 \end{pmatrix}, \quad (164)$$

and where the entries are ordered $\mathbb{I}$, $\sigma$, $\psi$. In other words, the eigenvalues of $W_{(a,a)}(C)$ are given by $S_{ab}/S_{b\mathbb{I}}$, where (b, b) is the fusion channel of the two genons connected by the path C.

The ground state of $H_{genon}$, which depends on $t_\sigma$, $t_\psi$ therefore corresponds to a definite fusion channel for the pair of genons involved. One can distinguish the following possibilities:

1. $|t_\sigma| > |t_\psi|$ and $t_\sigma > 0$. The ground state subspace of $H_{genon}$ corresponds to the case where the two genons have fused to the $(\psi, \psi)$ channel.
2. $|t_\sigma| > |t_\psi|$ and $t_\sigma < 0$. The ground state subspace of $H_{genon}$ corresponds to the case where the two genons have fused to the $(\mathbb{I}, \mathbb{I})$ channel.
3. $|t_\sigma| < |t_\psi|$, $t_\psi < 0$, $t_\sigma > 0$. The ground state subspace of $H_{genon}$ corresponds to the case where the two genons have fused to the $(\psi, \psi)$ channel.
4. $|t_\sigma| < |t_\psi|$, $t_\psi < 0$, $t_\sigma < 0$. The ground state subspace of $H_{genon}$ corresponds to the case where the two genons have fused to the $(\mathbb{I}, \mathbb{I})$ channel.
5. $|t_\sigma| < |t_\psi|$, $t_\psi > 0$. The ground state subspace of $H_{genon}$ corresponds to the case where the two genons have fused to the $(\sigma, \sigma)$ fusion channel.

One sees that there is only one possibility that is desirably prevented, which is the last one, where $|t_\sigma| < |t_\psi|$, $t_\psi > 0$. To do this, one can flip the sign of $t_\psi$ by flipping the sign of the coupling along a single link of the shortest path that connects the genons. Moreover, note that one can also pick the precise path C along which the quasiparticles tunnel by depressing the gap along that path, which can be done by decreasing the couplings along that path.

Ising×$\overline{\text{Ising}}$ Topological Order and Gapped Boundaries

In the above, an example method for creating genons in the Ising×Ising topological state was presented. The braiding of the genons, which can be performed in a measurement-based fashion, can be used for the topologically protected π/8 gate. Here, it is noted that the same topologically robust transformations can also be achieved with the Ising×$\overline{\text{Ising}}$ topological state in the presence of multiple disconnected gapped boundaries, where $\overline{\text{Ising}}$ refers to the time-reversed conjugate of the Ising state.

In particular, FIGS. 34(A)-(D) shows an Ising×$\overline{\text{Ising}}$ system in the presence of two holes (three gapped boundaries). This is effectively equivalent to the Ising×Ising system with 6 genons. The topologically robust operation described in FIG. 8 can be adapted to this case, by projecting the topological charge through the loops shown to be equal to $b_1, \ldots, b_4$. The solid line indicates that it is in the "top" layer, while the dashed line indicates that it is in the "bottom" layer.

The main observation is that the Ising×$\overline{\text{Ising}}$ state in the presence of n disconnected gapped boundaries can be viewed as effectively a flattened version of a single Ising state on a genus g=n−1 surface. This is similar to the fact that an Ising×$\overline{\text{Ising}}$ state, in the presence of n pairs of genons, can also be effectively mapped onto a single Ising state on a genus g=n−1 surface. The measurement-based braiding protocol for the genons of the Ising×Ising state can be readily adapted to the case of the Ising×$\overline{\text{Ising}}$ with gapped boundaries. This adapted protocol is discussed in more detail below.

Consider the Ising×$\overline{\text{Ising}}$ state in the presence of two disconnected gapped boundaries, i.e. on an annulus. This is equivalent to a single Ising state on a torus, similar to the case of the Ising×Ising state with four genons. In order to carry out an effective Dehn twist in this effective torus, an ancillary gapped boundary can be used, as shown in FIG. 34 This system is now equivalent to a genus 2 surface. In order to effectively carry out the Dehn twist, a series of projections is performed along various loops in the system. The loops shown in FIGS. 34(A)-(D) are considered, and the topological charge through those loops is sequentially projected to be $b_1, \ldots, b_4$. This is precisely analogous to the genon braiding case described in FIG. 8, where the fusion channel of genons was projected onto $b_{56}$, $b_{35}$, $b_{25}$, and $b_{56}'$. Thus if one takes $b_1 = b_4$ and $b_1, \ldots, b_4$ to be all Abelian topological charges, the equivalence between the Ising×Ising system with genons and the Ising×$\overline{\text{Ising}}$ with gapped boundaries implies that the desired operation has effectively been carried out. Further details concerning this projection-based approach are described in M. Barkeshli, M. Freedman, arXiv:1602.01093.

As in the case of the genons in the Ising×Ising state described in the previous sections, these projections can effectively be implemented by reducing the gap for quasiparticle tunneling along the various loops as required.

Discussion

In this disclosure, it was shown that it is indeed possible to achieve universal topological quantum computation from a coupled network of Majorana nanowires. Among the embodiments disclosed herein are embodiments of a physical architecture, including, for example, embodiments in two distinct limits, with two distinct physical mechanisms, that can realize an effective Kitaev honeycomb spin model. The particular physical implementations of the disclosed architecture makes it possible to create short overpasses in order to create the Ising×Ising topological state, and to make a genon—a lattice defect in the effective spin model, whose braiding statistics allows for universal TQC.

Concluding Remarks

Having illustrated and described the principles of the disclosed technology, it will be apparent to those skilled in the art that the disclosed embodiments can be modified in arrangement and detail without departing from such principles.

Further details concerning Majorana zero modes and semiconductor/superconductor nanowire devices, any one or more of which can be used in fabricating, creating, and/or using embodiments of the disclosed technology are discussed in: J. D. Sau, R. M. Lutchyn, S. Tewari, and S. Das Sarma, Phys. Rev. Lett. 104, 040502 (2010); R. M. Lutchyn, J. D. Sau, and S. Das Sarma, Phys. Rev. Lett. 105, 077001 (2010); J. Alicea, Reports on Progress in Physics 75, 076501 (2012); C. Beenakker, Annual Review of Condensed Matter Physics 4, 113 (2013); V. Mourik. K. Zuo. S. Frolov, S. Plissard, E. Bakkers, and L. Kouwenhoven, Science 336, 1003 (2012); L. P. Rokhinson, X. Liu, and J. K. Furdyna, Nat. Phys. 8, 795, (2012), ISSN 1745-2473, arXiv: 1204.4212; M. T. Deng, C. L. Yu, G. Y. Huang. M. Larsson, P. Caroff, and H. Q. Xu, Nano Letter 12, 6414 (2012), arXiv:1204.4130; H. O. H. Churchill, V. Fatemi, K. Grove-Rasmussen, M. T. Deng. P. Caroff. H. Q. Xu, and C. M. Marcu, Phys. Rev. B 87, 241401 (2013); S. Nadj-Perge, I. K. Drozdov, J. Li, H. Chen, S. Jeon, J. Seo, A. H. Macdonald, B. A. Bernevig, and A. Yazdani, Science 346, 602 (2014), 1410.0682; W. Chang, S. M. Albrecht, T. S. Jespersen, F. Kuemmeth, P. Krogstrup, J. Nygrd, and C. M. Marcus, Nat Nano 10, 232 (2015).

In view of the many possible embodiments to which the principles of the disclosed invention may be applied, it should be recognized that the illustrated embodiments are only preferred examples of the invention and should not be taken as limiting the scope of the invention.

What is claimed is:

1. A universal topological quantum computing device comprising:
   a plurality of semiconductor-superconductor heterostructures configured to have a twist defect in an Ising x Ising topological state.

2. The universal topological quantum computing device of claim 1, wherein at least two of the semiconductor-superconductor heterostructures form a two-state quantum system having an effective spin-½ degree of freedom.

3. The universal topological quantum computing device of claim 2, wherein the two-state quantum system comprises:
   a first superconducting island on which a first semiconducting nanowire is located; and
   a second superconducting island on which a second semiconducting nanowire is located, the first superconducting island being substantially perpendicular to the second superconducting island and being coupled to one another via a Josephson junction.

4. The universal topological quantum computing device of claim 2, wherein at least one of the semiconductor-superconductor heterostructures comprises:
   two semiconductor nanowire structures having four Majorana zero modes and a charging energy constraint.

5. The universal topological quantum computing device of claim 2, wherein at least one of the semiconductor-superconductor heterostructures comprises:
   two semiconductor nanowire structures using double-island quantum phase slips and having four Majorana zero modes.

6. The universal topological quantum computing device of claim 1, wherein the semiconductor-superconductor hetero structures are arranged to form a two-dimensional Kitaev honeycomb spin model.

7. The universal topological quantum computing device of claim 1, wherein the semiconductor-superconductor heterostructures are arranged into pairs, each pair comprising a first and a second semiconductor-superconductor heterostructure.

8. The universal topological quantum computing device of claim 7, wherein the pairs of semiconductor-superconductor heterostructures are arranged into a two-dimensional lattice comprising:
   a set of the pairs connected via a first nanowire to nearest neighboring pairs along a first dimension;
   a first subset of the set connected via one or more second nanowires to distant pairs along a second dimension, the one or more second nanowires forming overpasses that bypass one or more nearest neighboring pairs along the second dimension; and
   a second subset of the set connected via one or more third nanowires to nearest neighboring pairs along the second dimension.

9. The universal topological quantum computing device of claim 8, wherein the one or more third nanowires create the twist defect.

10. A $\pi/8$ phase gate comprising the universal topological quantum computing device of claim 1.

11. A universal topological quantum computer comprising:
    one or more semiconductor-superconductor hetero structures configured to have holes with gapped boundaries in an Ising×$\overline{\text{Ising}}$ topological state, where $\overline{\text{Ising}}$ is the time-reversed conjugate of the Ising state.

12. A universal topological quantum computing device comprising multiple two-spin unit cells, each two-spin unit cell comprising two pairs of a superconducting-semiconducting heterostructure, wherein a pair of the superconducting-semiconducting heterostructure comprises:
    a first superconducting island on which a first semiconducting nanowire is located; and
    a second superconducting island on which a second semiconducting nanowire is located, the first superconducting island being substantially perpendicular to the second superconducting island and being coupled to one another via a Josephson junction.

13. The universal topological quantum computing device of claim 12, wherein the two-spin unit cells are arranged into a two-dimensional lattice comprising:
    a set of the pairs connected via a first nanowire to nearest neighboring pairs along a first dimension;
    a first subset of the set connected via one or more second nanowires to distant pairs along a second dimension, the one or more second nanowires forming overpasses that bypass one or more nearest neighboring pairs along the second dimension; and
    a second subset of the set connected via one or more third nanowires to nearest neighboring pairs along the second dimension.

14. The universal topological quantum computing device of claim 13, wherein the one or more third nanowires create the twist defect.

15. A $\pi/8$ phase gate comprising the universal topological quantum computing device of claim 14.

* * * * *